United States Patent
Thuo et al.

(10) Patent No.: US 12,358,077 B2
(45) Date of Patent: Jul. 15, 2025

(54) MASK-FREE PHOTOLITHOGRAPHY USING METASTABLE UNDERCOOLED METAL PARTICLES

(71) Applicant: Iowa State University Research Foundation, Inc., Ames, IA (US)

(72) Inventors: Martin Thuo, Apex, NC (US); Peter C. Collins, Ames, IA (US); Andrew Martin, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 181 days.

(21) Appl. No.: 18/175,239

(22) Filed: Feb. 27, 2023

(65) Prior Publication Data
US 2023/0241717 A1    Aug. 3, 2023

Related U.S. Application Data

(62) Division of application No. 17/092,735, filed on Nov. 9, 2020, now Pat. No. 11,633,807.
(Continued)

(51) Int. Cl.
*B33Y 80/00*    (2015.01)
*B22F 3/00*    (2021.01)
(Continued)

(52) U.S. Cl.
CPC .............. *B23K 26/342* (2015.10); *B22F 3/00* (2013.01); *B22F 10/20* (2021.01); *B22F 10/28* (2021.01);
(Continued)

(58) Field of Classification Search
None
See application file for complete search history.

(56) References Cited

U.S. PATENT DOCUMENTS

| 10,266,925 B2 | 4/2019 | Thuo et al. |
| 10,293,325 B2 | 5/2019 | Thuo et al. |

(Continued)

FOREIGN PATENT DOCUMENTS

WO    WO-2015089309 A1    6/2015

OTHER PUBLICATIONS

"U.S. Appl. No. 17/092,735, Notice of Allowance mailed Dec. 22, 2022", 12 pgs.

(Continued)

*Primary Examiner* — Kim S. Horger
(74) *Attorney, Agent, or Firm* — Schwegman Lundberg & Woessner, P.A.

(57) ABSTRACT

Various embodiments relate to forming particles using undercooled metal particles in response to focused low power laser light. Particle growth can be initiated by utilizing the metastable and liquid nature of the particles, allowing for surface instability promoted by the laser light to induce liquid flow to translate to a neighboring particle. This event can cascade radially leading to accumulation of the liquid metal at the epicenter. The grown solidified particle size can be varied by using different power, exposure time, or working distance. Once the liquid has accumulated into a single region, it eventually solidifies either through homogeneous or heterogeneous nucleation to give a solid particle of larger size than the original. Such a method can be used to print patterns on a surface in four dimensions, where the fourth dimension (4D) is attained through gradient in size of the particles made. Additional systems and methods are disclosed.

19 Claims, 41 Drawing Sheets

Related U.S. Application Data

(60) Provisional application No. 62/932,774, filed on Nov. 8, 2019.

(51) Int. Cl.

| | | |
|---|---|---|
| *B22F 10/20* | (2021.01) | |
| *B22F 10/28* | (2021.01) | |
| *B22F 12/42* | (2021.01) | |
| *B23K 26/00* | (2014.01) | |
| *B23K 26/06* | (2014.01) | |
| *B23K 26/08* | (2014.01) | |
| *B23K 26/342* | (2014.01) | |
| *B23K 26/352* | (2014.01) | |
| *B33Y 10/00* | (2015.01) | |
| *B33Y 30/00* | (2015.01) | |
| *B33Y 50/02* | (2015.01) | |
| *B33Y 70/00* | (2020.01) | |

(52) U.S. Cl.
CPC .......... *B22F 12/42* (2021.01); *B23K 26/0006* (2013.01); *B23K 26/0648* (2013.01); *B23K 26/08* (2013.01); *B23K 26/355* (2018.08); *B33Y 10/00* (2014.12); *B33Y 30/00* (2014.12); *B33Y 50/02* (2014.12); *B33Y 70/00* (2014.12); *B33Y 80/00* (2014.12)

(56) References Cited

U.S. PATENT DOCUMENTS

| | | | |
|---|---|---|---|
| 11,059,098 | B2 | 7/2021 | Thuo et al. |
| 11,633,807 | B2 | 4/2023 | Thuo et al. |
| 2015/0135897 | A1* | 5/2015 | Sutcliffe ............ B23K 15/0086 206/524.1 |
| 2017/0014958 | A1 | 1/2017 | Thou et al. |
| 2018/0354037 | A1 | 12/2018 | Thuo et al. |
| 2021/0138588 | A1 | 5/2021 | Thuo et al. |
| 2022/0023940 | A1 | 1/2022 | Thuo et al. |
| 2022/0212250 | A1 | 7/2022 | Thuo et al. |
| 2023/0012401 | A1 | 1/2023 | Thuo et al. |
| 2023/0182236 | A1 | 6/2023 | Thuo et al. |

OTHER PUBLICATIONS

"U.S. Appl. No. 17/092,735, Response filed Sep. 15, 2022 to", 8 pgs.

"U.S. Appl. No. 17/092,735, Response filed Sep. 15, 2022 to Restriction Requirement mailed Sep. 6, 2022", 8 pgs.

"U.S. Appl. No. 17/092,735, Restriction Requirement mailed Sep. 6, 2022", 7 pgs.

Aqra, F., et al., "Surface tension of pure liquid bismuth and its temperature dependence: Theoretical calculations", Materials Letters, 65(4), (2011), 760-762.

Atay, T., et al., "Strongly Interacting Plasmon Nanoparticle Pairs: From Dipole-Dipole Interaction to Conductively Coupled Regime", Nano Letters, 4(9), (2004), 1627-1631.

Cahill, J. A., "The surface tension of liquid tin between its melting point and 2100° K.", Journal of Inorganic and Nuclear Chemistry, 26(1), (1964), 206-208.

Cahn, J. W., et al., "The Cahn-Hilliard equation with a concentration dependent mobility: motion by minus the Laplacian of the mean curvature", European Journal of Applied Mathematics, 7(3), (1996), 287-301.

Carpene, E., et al., "Chapter 3—Fundamentals of Laser-Material Interactions", In: Laser Processing of Materials: Fundamentals, Applications and Developments, P. Schaaf, Editor. Springer Berlin Heidelberg: Berlin, Heidelberg, (2010), 21-47.

Chang, Boyce S, et al., "Rapid prototyping of reconfigurable microfluidic channels in undercooled metal particle-elastomer composites", Industrial & Engineering Chemistry Research 58.10, (2019), 4137-4142.

Cinar, S., et al., "Mechanical Fracturing of Core-Shell Undercooled Metal Particles for Heat-Free Soldering", Scientific Reports, 6: 21864, (2016), 10 pgs.

Fanton, X., et al., "Spreading and Instabilities Induced by a Solutal Marangoni Effect", Langmuir, 14(9), (1998), 2554-2561.

Garnett, Erik C., et al., "Self-limited plasmonic welding of silver nanowire junctions", Nature Materials, 11(3), (Mar. 2012), 241-249.

Girard, F., et al., "On the Effect of Marangoni Flow on Evaporation Rates of Heated Water Drops", Langmuir, 24(17), (2008), 9207-9210.

Herlach, D., "Non-Equilibrium Solidification of Undercooled Metallic Melts", Metals, 4(2), (2014), 196-234.

Li, H., et al., "Surface Potential Dependence on the Hamaker Constant", The Journal of Physical Chemistry C, 113(11), (2009), 4419-4425.

Martin, Andrew, et al., "Heat-Free Fabrication of Metallic Interconnects for Flexible/Wearable Devices", Adv. Funct. Mater., 29(40), 1903687, (2019), 9 pgs.

Martin, Andrew, et al., "Polydispersity-Driven Printing of Conformal Solid Metal Traces on Non-Adhering Biological Surfaces", Advanced Materials Interfaces 7.22, 2001294, (2020), 7 pgs.

Pego, R. L., "Front migration in the nonlinear Cahn-Hilliard equation", Proceedings of the Royal Society of London A—Mathematical, Physical and Engineering Sciences, 422(1863), (1989), 261-278.

Shinn, M., et al., "Chapter 2—Basics of Lasers and Laser Optics", In: Laser Processing of Materials: Fundamentals, Applications and Developments, P. Schaaf, Editor, Springer Berlin Heidelberg: Berlin, Heidelberg, (2010), 5-20.

Tevis, I. D, et al., "Synthesis of Liquid Core-Shell Particles and Solid Patchy Multicomponent Particles by Shearing Liquids Into Complex Particles (SLICE)", Langmuir, 30, (2014), 14308-14313.

Varada, G. V., et al., "Two-photon resonance induced by the dipole-dipole interaction", Physical Review A, 45(9), (1992), 6721-6729.

Visser, J., et al., "On Hamaker constants: A comparison between Hamaker constants and Lifshitz-van der Waals constants", Advances in Colloid and Interface Science, 3(4), (1972), 331-363.

Wagle, Durgesh V., et al., "Cold welding: a phenomenon for spontaneous self-healing and shape genesis at the nanoscale", Materials Horizizon, 2, (2015), 157-167.

White, D. W. G., "The surface tensions of indium and cadmium", Metallurgical Transactions, 3(7), (1972), 1933-1936.

* cited by examiner

Mechanical Stress Induced Instability

Quantum Stress Induced Instability

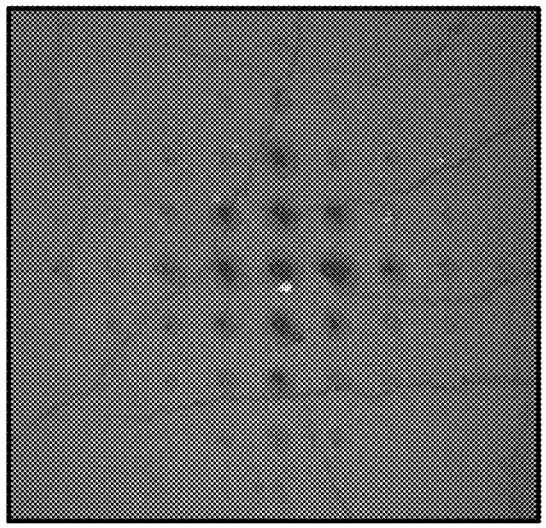 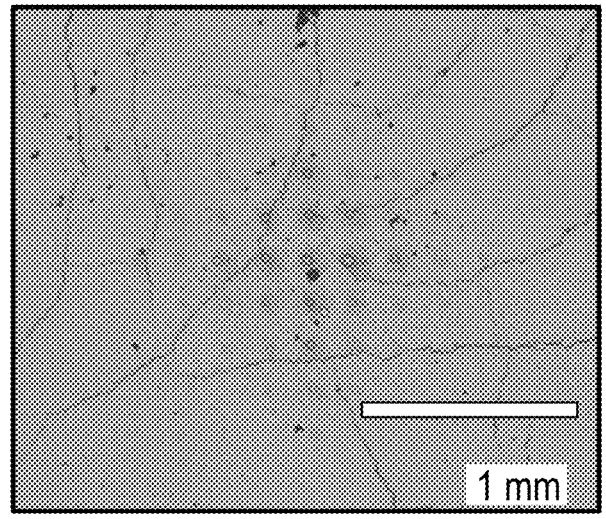
FIG. 12C　　　　　　　　　FIG. 12D
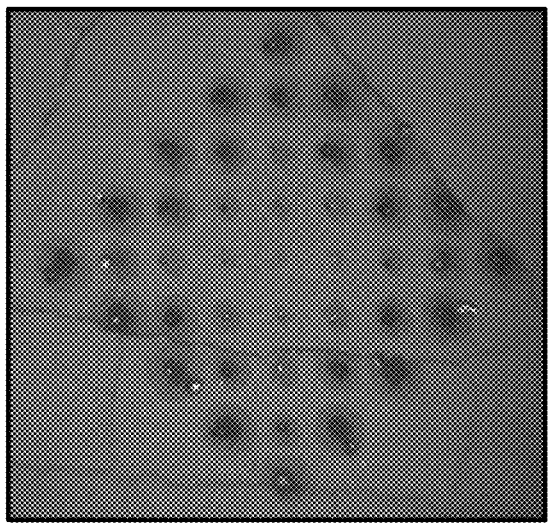 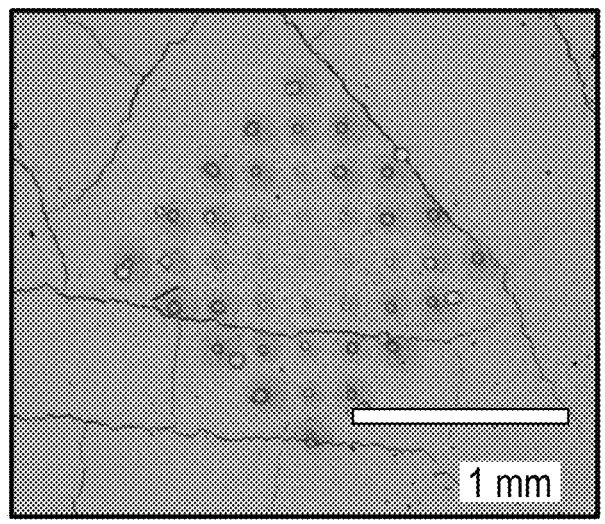
FIG. 12E　　　　　　　　　FIG. 12F

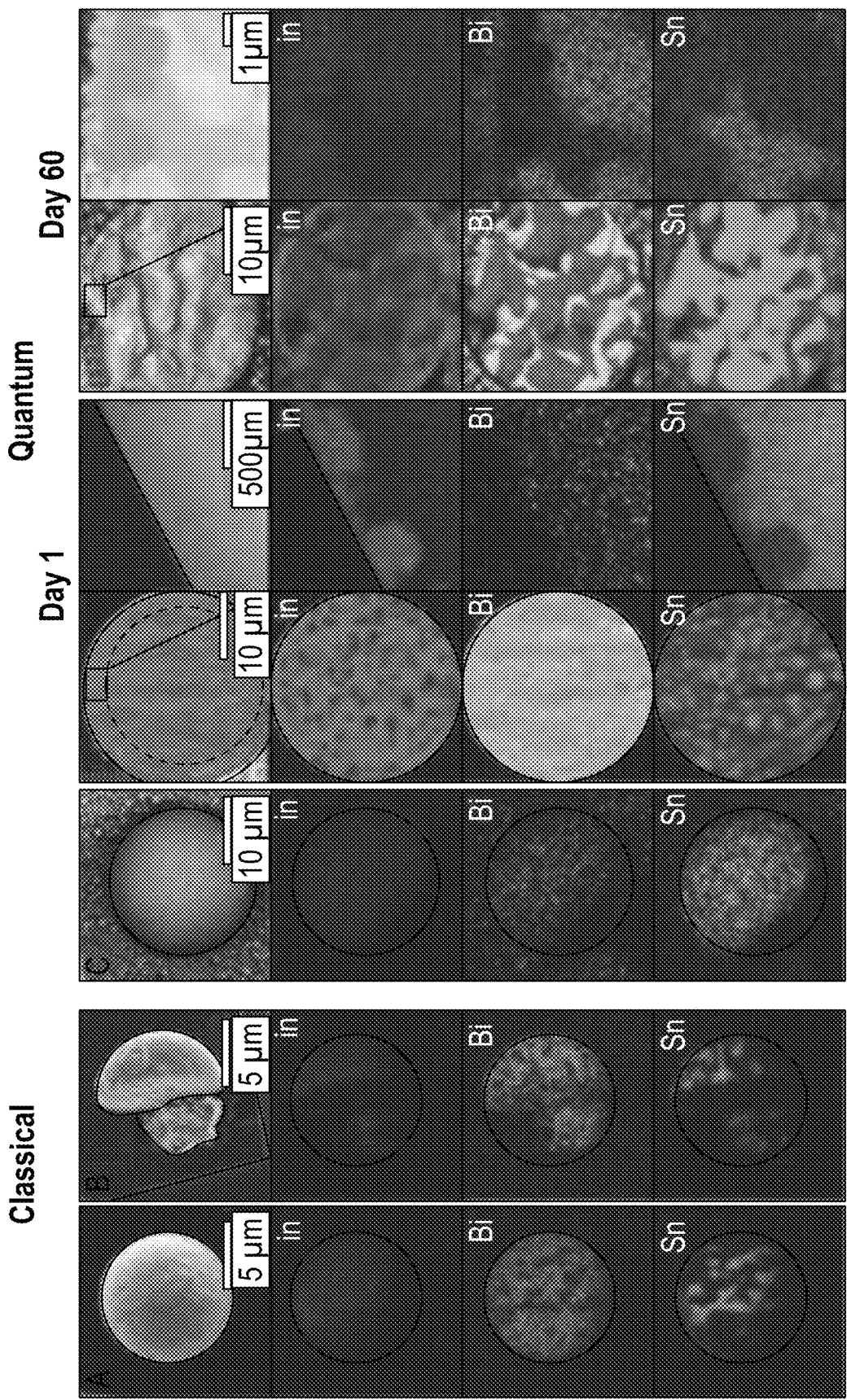

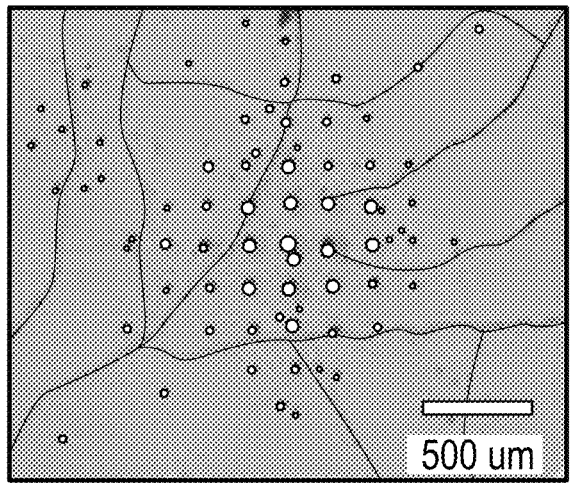
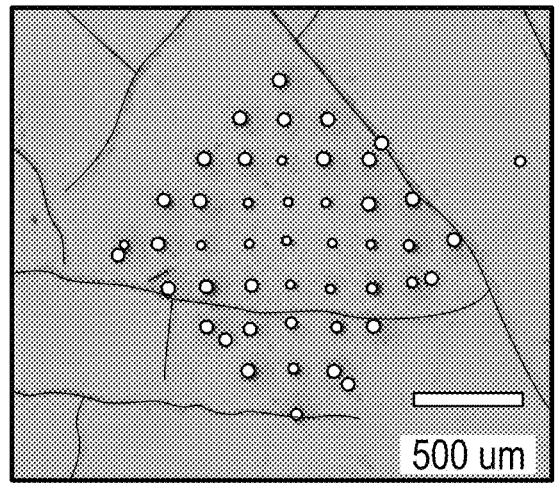
FIG. 15A  FIG. 15B
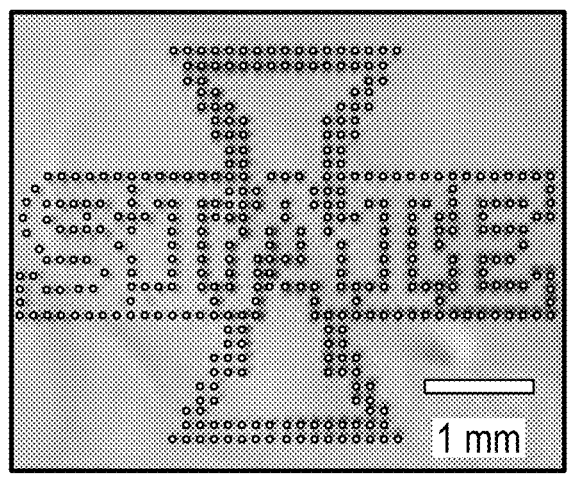
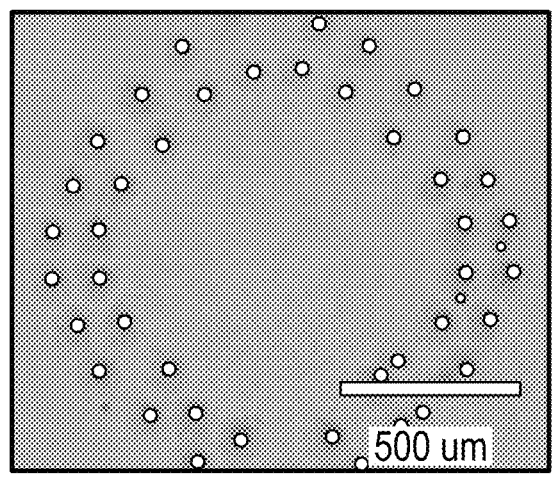
FIG. 15C  FIG. 15D
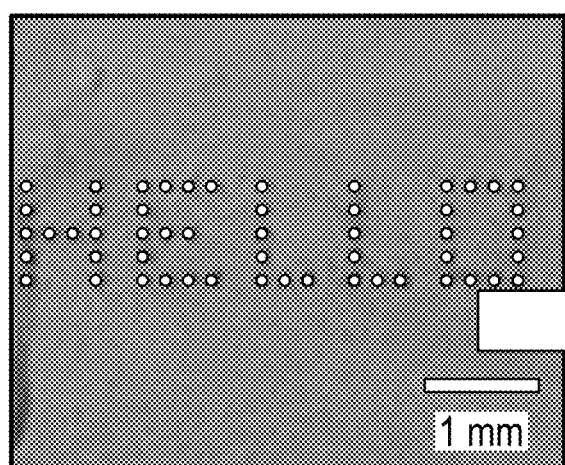
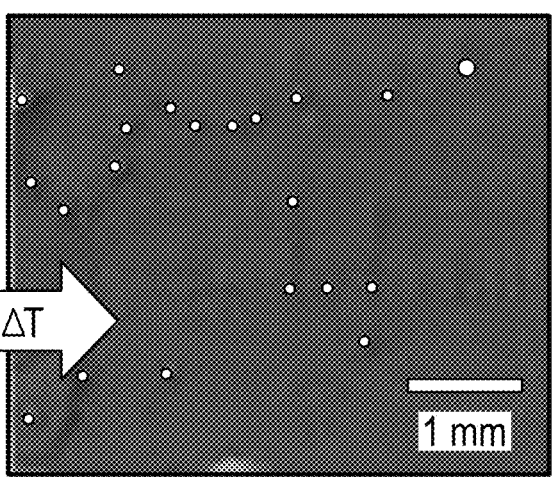
FIG. 15E  FIG. 15F

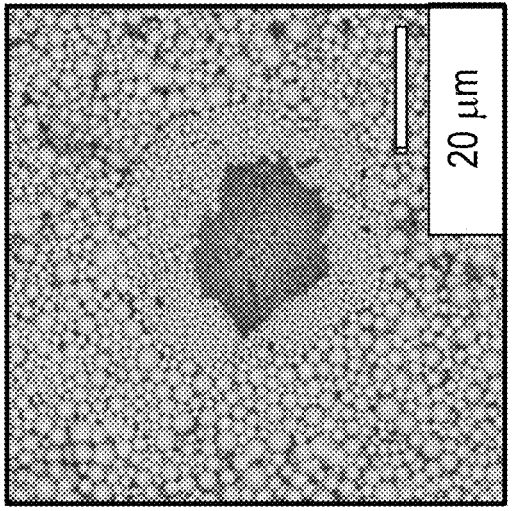
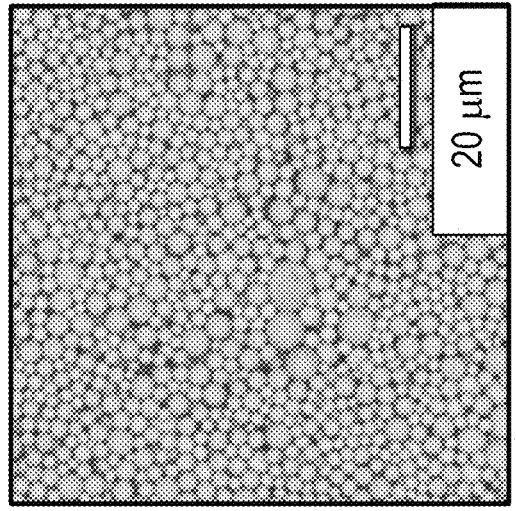
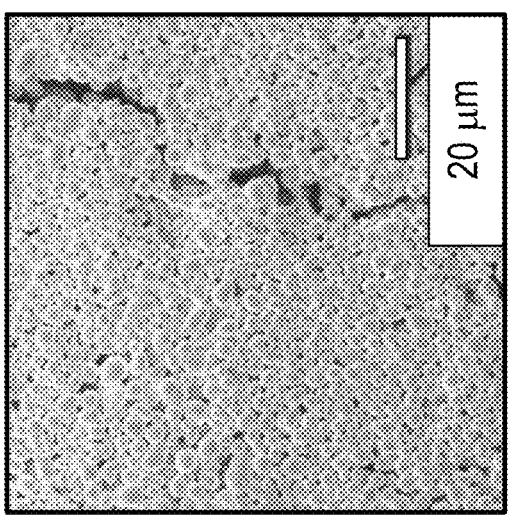
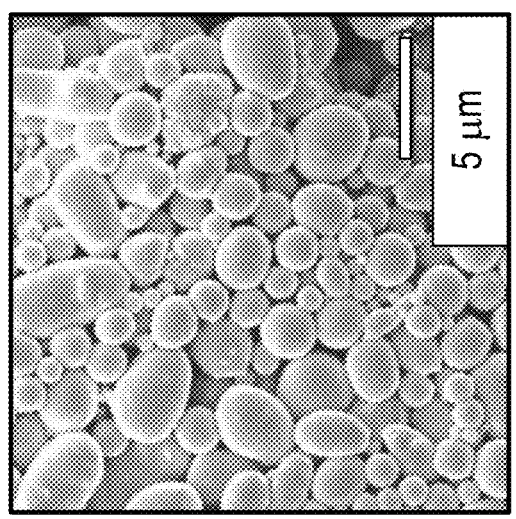
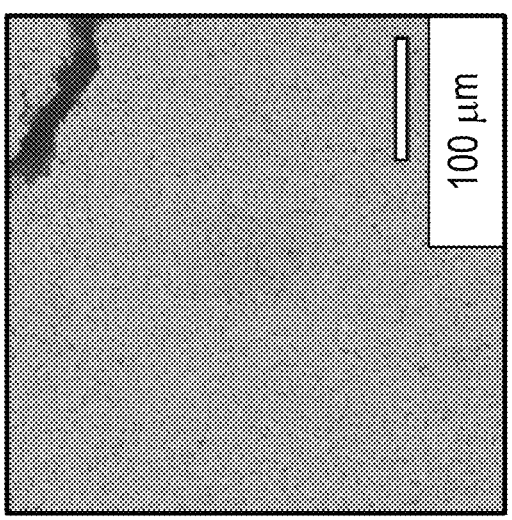
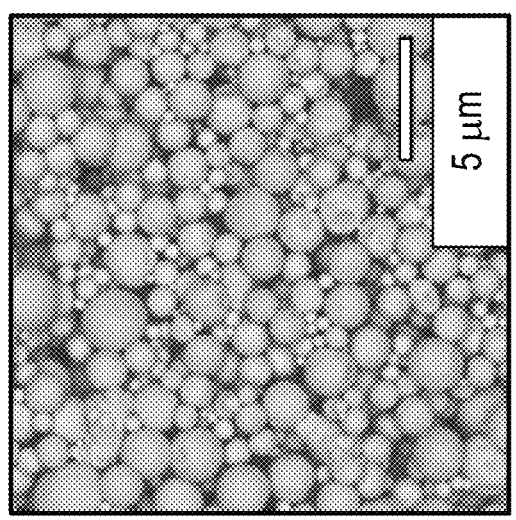
FIG. 23A  FIG. 23B  FIG. 23C

MASK-FREE PHOTOLITHOGRAPHY USING METASTABLE UNDERCOOLED METAL PARTICLES

PRIORITY APPLICATION

This application is a divisional of U.S. application Ser. No. 17/092,735, filed on 9 Nov. 2020, which claims priority under 35 U.S.C. 119(e) from U.S. Provisional Application Ser. No. 62/932,774 filed on 8 Nov. 2019, which applications are incorporated herein by reference in their entireties.

FIELD OF THE INVENTION

The invention relates generally to manufacturing, in particular, to technologies related to metal additive manufacturing.

BACKGROUND

Additive manufacturing (AM) relates to manufacturing technologies that construct three dimensional (3D) objects by adding material in a layer-upon-layer format. Different AM technologies include the use of a computer, 3D modeling software such as computer aided design (CAD), machine equipment, and material that can be layered. Typically, AM equipment reads in data from a CAD file and forms successive layers of liquid, powder, sheet material or other material, in a layer-upon-layer fashion to fabricate a 3D object. AM encompasses many technologies including such techniques as 3D printing, rapid prototyping (RP), direct digital manufacturing (DDM), layered manufacturing, and additive fabrication.

The metal AM process has created significant technological advances and has been receiving high development demands over the years. However, the current "traditional" additive manufacturing process in the metal industry always have a high energy requirement due to the common material used in the process.

BRIEF DESCRIPTION OF THE FIGURES

The drawings illustrate generally, by way of example, but not by way of limitation, various embodiments of the invention in which:

FIGS. 12A-12F illustrate examples of complex patterning of particles, in accordance with various embodiments.

FIGS. 14A-14G show elemental maps of particles at different states, in accordance with various embodiments.

FIGS. 15A-15F show complex patterning capabilities of four-dimensional photolithography showing multiple patterns, in accordance with various embodiments.

FIGS. 23A-23C show control of the four-dimensional lithography using capillary bridges or thermodynamic state of the metal, in accordance with various embodiments.

DETAILED DESCRIPTION

Figure 1A:
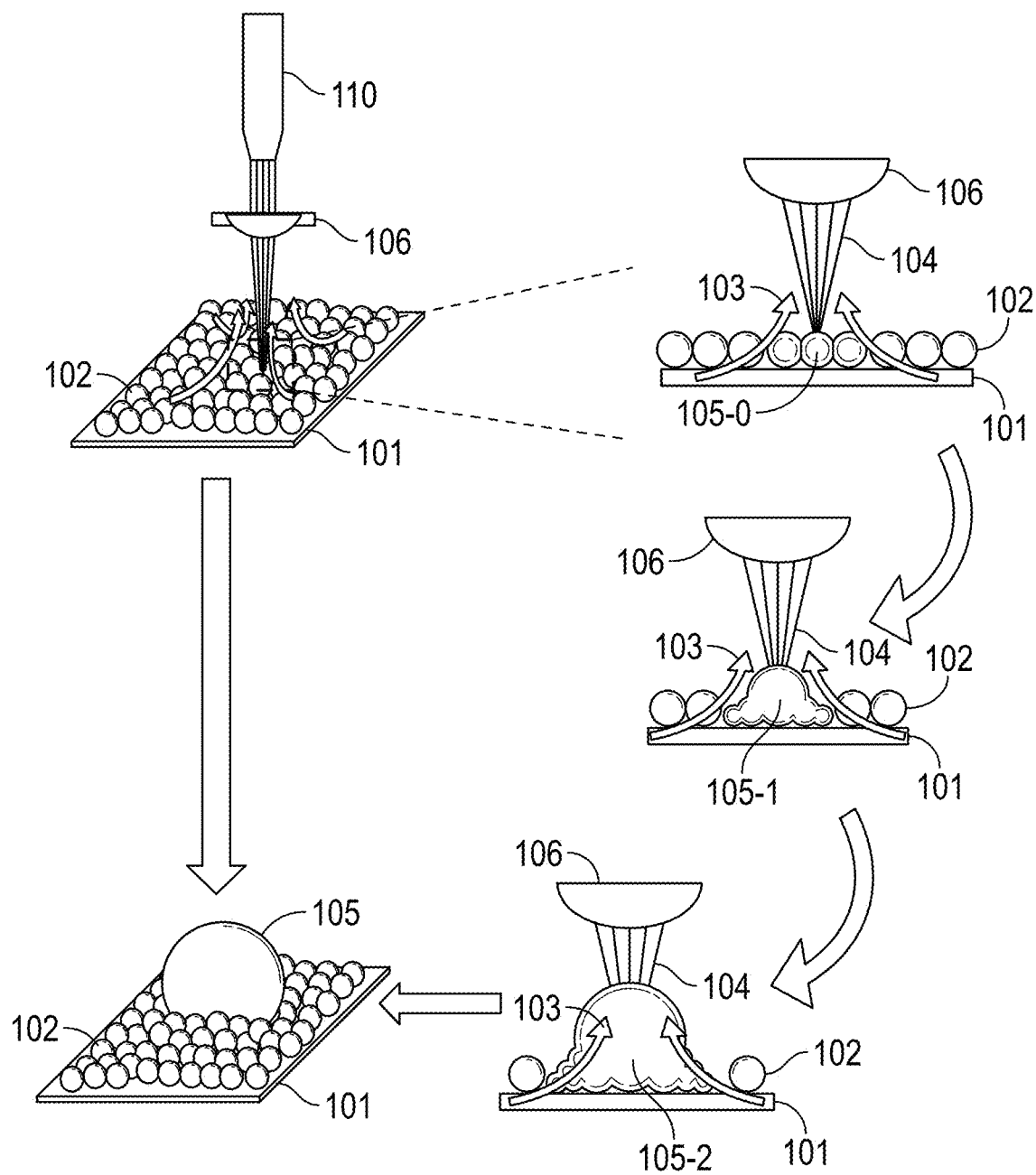
FIGS. 1A-1D are schematic representations of an example process of growing a particle from a metastable undercooled metal particle, in accordance with various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Mass transport of selective atomic species from one phase to another phase occurs at the liquid surface in metal-based AM processes. Metastable materials and highly polarizable elements as catalysts can potentially be used to overcome the high energy demands. Using suspended undercooled metal particles, a small amount of photon energy can be used to solidify and pattern metal particles on a surface based on the effect of surface tension instabilities. Understanding photon-material interaction allows one to measure and predict particle growth based on the photon energy supplied. Meta-stability in materials can be used to mitigate high energy demands in processing.

Patterns can be created using undercooled metal particles by utilizing growth in response to focused low power laser light. Particle growth is initiated by utilizing the metastable and liquid nature of the undercooled metal particles, allowing for surface instability promoted by light to induce Marangoni convection and liquid flow. Marangoni convection is the tendency for heat and mass to travel to areas of higher surface tension within a liquid, where surface tension is a property of a liquid that causes a surface portion of the liquid to be attracted to the bulk relative to its surrounding.

Associated changes in volume and local energy in the particle leads to point fracture of an oxide shell connecting two particles leading to the convective and Maragoni flow to translate to a neighboring particle. This event cascades radially leading to accumulation of the liquid metal at the epicenter. The grown solidified particle size can be varied by using different laser power, exposure time, or working distance. Once the liquid has accumulated into a single region, it eventually solidifies either through homogeneous or heterogeneous nucleation to give a solid particle of larger size than the original. This method can be used to print patterns on a surface in four dimensions, where the fourth dimension (4D) is attained through gradient in size of the particles made or in variation in either surface or bulk composition.

Different sizes of solidified particles can be varied with each layer of particles, creating another dimension in the photolithography process. In another aspect, varying the power density of the laser can also change the composition of the metal alloy. Although disclosed as a 4D lithography technique, the technique can be extended to attain low-laser power additive manufacturing of metallic materials that utilizes Maragoni instabilities/flow on particles of metastable materials.

Marangoni instabilities are driven by fluctuations in surface tension. In liquids, such fluctuations lead to flow (Marangoni flow—commonly seen in tears of wine). The surface tension of a liquid is directly proportional to the Hamaker constant, $A_H$:

$$\gamma = \frac{A_H}{24\pi D_0^2}. \tag{1}$$

$$\varepsilon_r = n^2 - \kappa^2 \tag{2}$$

Equation 1 shows a direct relation between surface tension ($\gamma$) and Hamaker constant ($A_H$) where $D_0$ is the distance between two molecules. The Hamaker constant, on the other hand, depends on a static and frequency dependent dielectric permittivity of the liquid as shown in equation 2. Equation 3 breaks apart the term $A_H$, showing its dependency on static permittivity (E) and frequency (v) dependent relative permittivity:

$$A_H = \tag{3}$$
$$\frac{3}{4}k_B T\left(\frac{\varepsilon_1 - \varepsilon_3}{\varepsilon_1 + \varepsilon_3}\right)\left(\frac{\varepsilon_2 - \varepsilon_3}{\varepsilon_2 + \varepsilon_3}\right) + \frac{3h}{4\pi}\int_{v_1}^{\infty}\left(\frac{(\varepsilon_1(iv) - \varepsilon_2(iv))}{\varepsilon_1(iv) + \varepsilon_2(iv)}\right)\left(\frac{(\varepsilon_2(iv) - \varepsilon_3(iv))}{\varepsilon_2(iv) + \varepsilon_3(iv)}\right)$$

where $k_B$ is the Boltzmann constant, T is temperature, h is Planck's constant, and i is the imaginary unit. The subscripts 1 and 2 refers to the interacting materials, while the subscript 3 refers to the medium, for example, $\varepsilon_1$ refers to the permittivity of one material, $\varepsilon_2$ refers to the permittivity of a second material, and $\varepsilon_3$ refers to the permittivity of a medium related to the two materials. Relative permittivity ($\varepsilon_r$) is directly correlated to the refractive index (n) and extinction coefficient ($\kappa$) of a material as described in equation 2.

It follows that exposing a surface, such as a liquid-solid interface as in various embodiments disclosed herein, to the appropriate amount of photons (hv) of the correct frequency and flux/density, local surface tension can be perturbed triggering some instabilities that then leads to Marangoni flow, homogeneous nucleation in case of metastable liquids, volumetric change, and concomitant shape changes. Based on this understanding, in various embodiments, low laser power can be used to induce Marangoni flows, localized fracture of the core-shell particles followed by coalescence of the liquid across multiple particles to create a larger central droplet that eventually solidifies. The interaction of photon energy from the low-power laser and the material interface induces surface tension instability that promotes particle joining and solidification through coalescence between nearby the exposed particle. As is known, undercooled liquid metal particles are protected from heterogeneous nucleation by a thin (<5 nm), optically transparent oxide.

A Lifshitz calculation of the Hamaker constant provides details on the Van der Waals dipole-dipole interaction that is propagated by the photon flux supplied by the focused laser beam onto material. From the Hamaker constant, the induced surface tension instability can be explained as a thermodynamic pump (or sink) that promotes flow of liquids from neighboring particles upon rupture. In addition, laser-material interaction is based on the refractive index and the dielectric permittivity of the material, which are two parameters that can, in turn, be used to estimate the Hamaker constant.

In various embodiments, a method is provided to induce coalescence through point ruptures of undercooled liquid metal particles using weak laser power. For example, such weak laser can be from a laser pointer at less than three watts (3 W) of power. Concomitant solidification allows one to create micrometer sized droplets akin to those that would be generated by an inkjet printer. Such methods can be used to create solid metal structures with variation in size over many dimensions. The state of the solid is also a unique feature of such methods. Unlike other AM systems, maintaining a closed thermodynamic system allows transition from a metastable undercooled metal to either a metastable amorphous solid (glass) or to trigger homogeneous nucleation and form a crystalline solid, which can be in the most stable crystal structure or a high energy polymorph.

FIGS. 1A-1D are schematic representations of an embodiment of an example process of growing a particle from a metastable undercooled metal particle. FIG. 1A shows a laser diode 110 emitting laser light directed, via a plano-convex lens 106, to a metastable undercooled metal particle 105-0 in liquid metal on a structure 101, such as a substrate. The laser diode 110 can be set up perpendicular to the surface of the structure 101, where the metastable undercooled metal particle 105-0 is deposited. The structure 101, in various embodiments, can be a silicon wafer. The plano-convex lens 106 can be positioned between the laser diode 110 and the sample containing the metastable undercooled metal particle 105-0 to focus the laser light. Other low power laser devices can be used and focusing devices other than a plano-convex lens can be used. The combination of low power device and lens can be selected to generate laser light focused or defocused on the metastable undercooled metal particle. Data shows asymmetry in the growth depending on aberration on the light. See, for example, FIG. 17B.

The working distance between the lens and the sample can be adjusted with an xyz stage. The metastable undercooled metal particle grows with continued exposure to the concentrated laser light 104. Metastable undercooled metal particles 102 are activated by the focused laser light. Liquid metal from the metastable undercooled metal particles 102 flows towards the light source, along direction of flow 103, creating a coalescence of particles which results in one large particle in the center of exposure by coalescing liquid from neighboring particles predominantly along the surface of the particle bed. As the laser irradiation is maintained, metastable undercooled metal particle 105-0 of the metastable undercooled metal particles 102 grows to particle 105-1 then to particle 105-2 to a final large particle 105 when the laser irradiation is terminated. In various embodiments, the surface of the particle bed can be altered by lowering the particle bed to create a non-spherical 3D construct. A key advantage here is an ability to use a single layer of particles but print mesoscale resolution (bigger than nanoscale but less than micron) builds. Such a feat cannot be achieved by traditional additive manufacturing and bottom up approaches. In a non-limiting example, the metastable undercooled metal particles can be metastable undercooled metal Field's particles. A Field's particle is a eutectic alloy of bismuth, indium, and tin that becomes liquid at approximately 62° C.

Figure 1B:
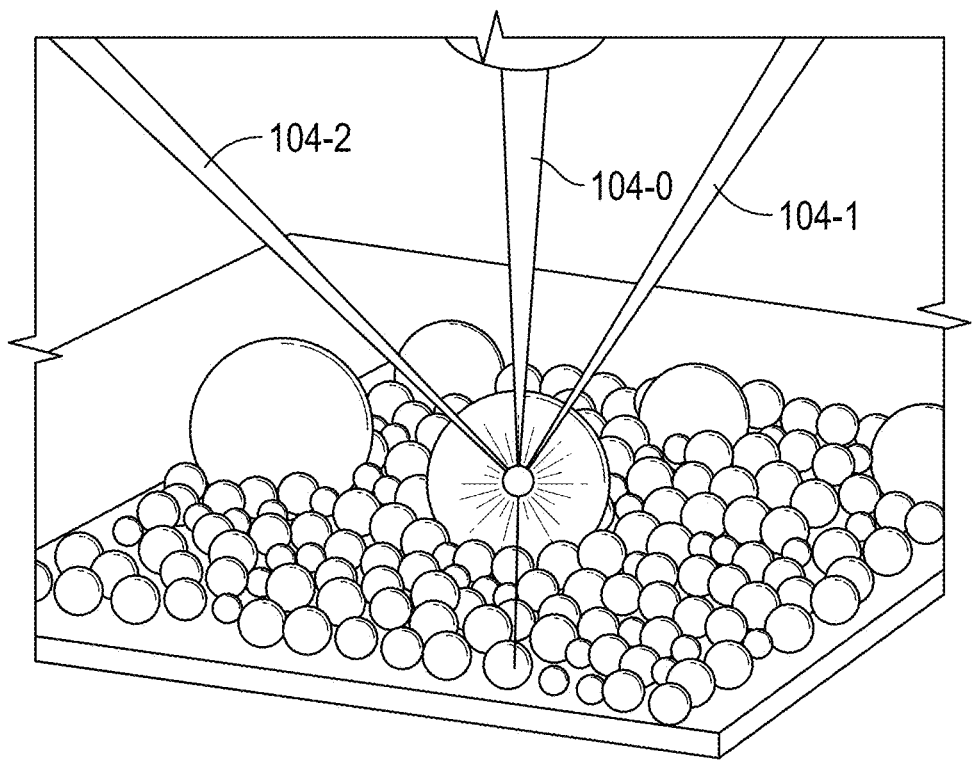
Figure 1C:
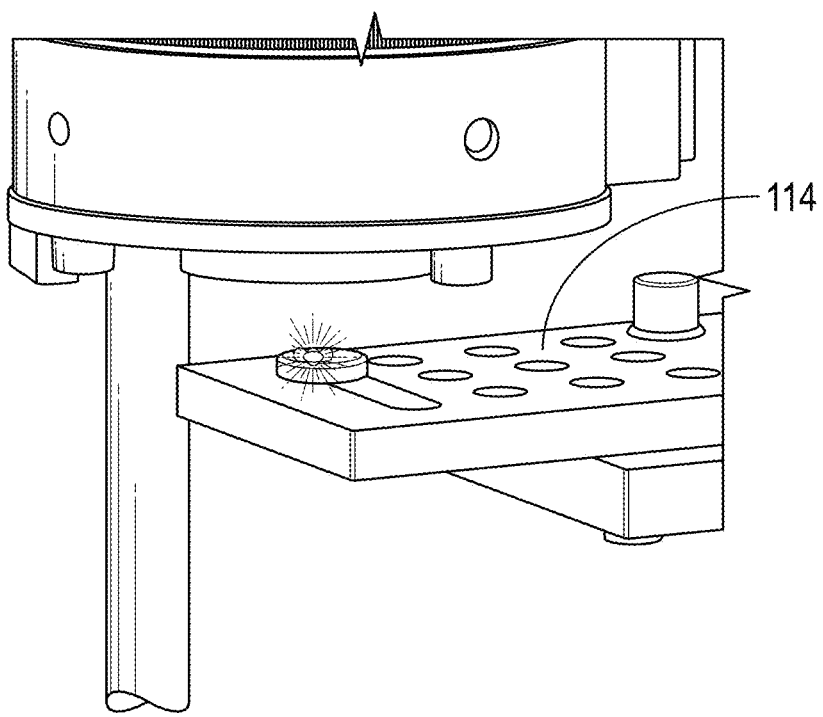

FIG. 1B shows a number of particles grown from metastable undercooled metal particles on the surface. Also, metastable undercooled metal particles can be illuminated with multiple laser lights 104-0, 104-1, and 104-2 to facilitate the growth from the metastable undercooled metal particles. FIG. 1C shows a movable stage 114 that can be used to align the laser light with the metastable undercooled metal particles.

Figure 1D:
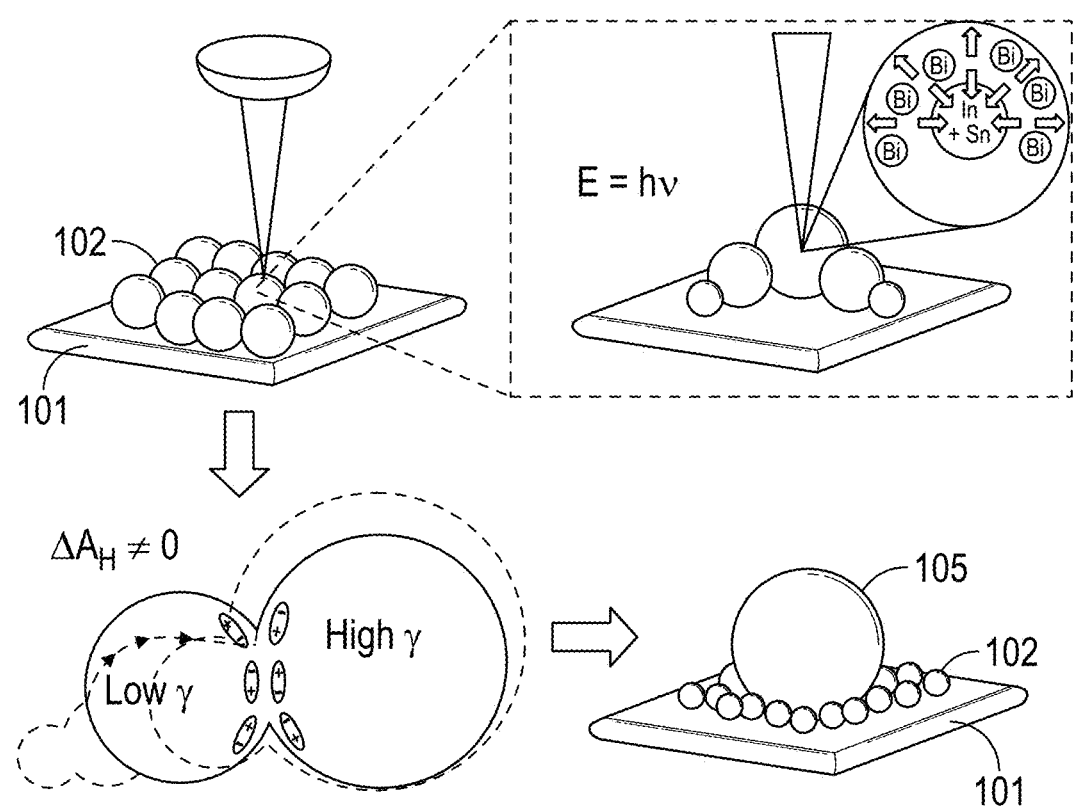

FIG. 1D shows another schematic representation of growing a particle from a metastable undercooled metal particle. An overview of metastable undercooled metal particles 102 on a substrate 101 exposed to focused laser beam is shown, where the laser beam activates one particle as a sink and triggers the coalescence of nearby particles, reflecting the energy equal to hv, where h is Planck's constant and ν is the laser frequency. Dipole-dipole interaction between particles, which pull nearby particles together, is shown with $A_H \neq 0$, and low γ coalescing into a high γ particle. A fully grown particle 105 among the metastable undercooled metal particles 102 on substrate 101 is shown as a result. FIG. 1D shows a growth process in which there is no change in Hamaker constant as the particles that flow to coalesce do so from a low surface tension of the particles to a high surface tension of the large particle.

Figure 2A:
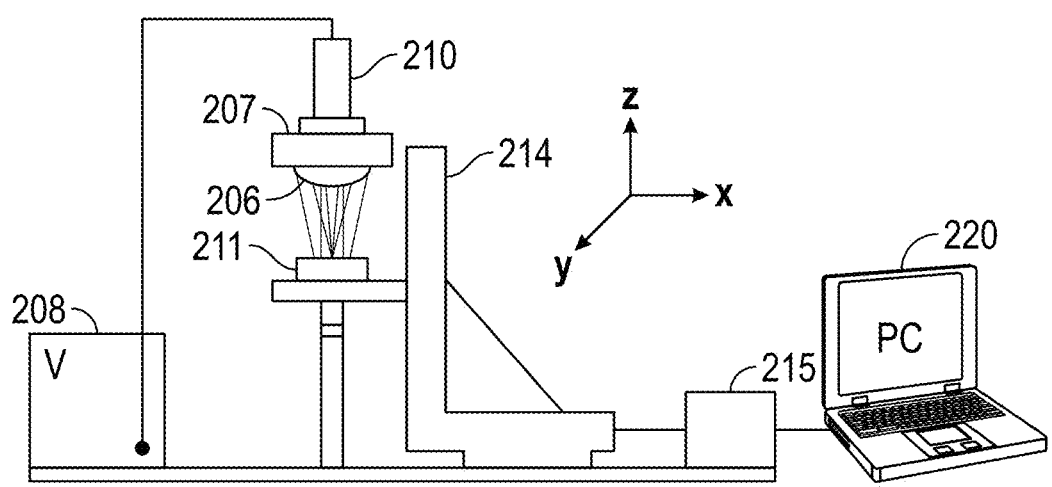
FIGS. 2A-2C illustrate a four-dimensional mask-free lithography setup, in accordance with various embodiments.
Figure 2B:
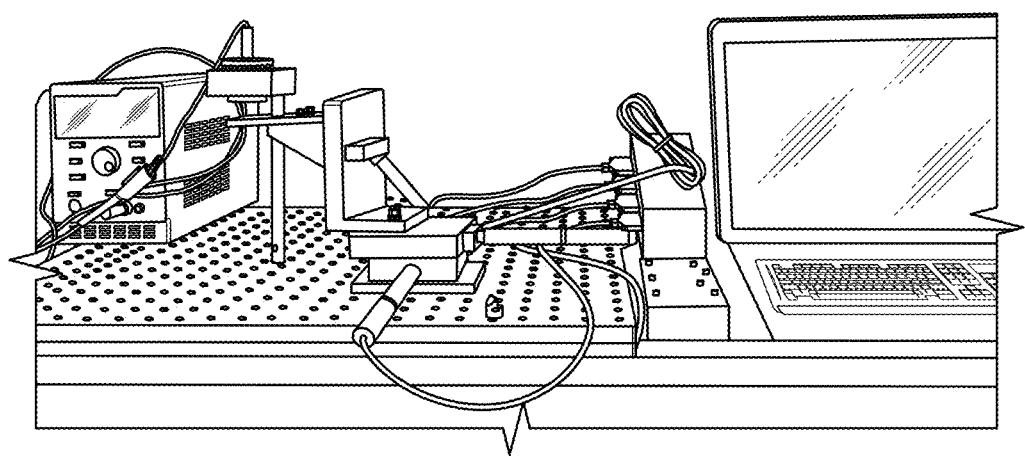
Figure 2C:
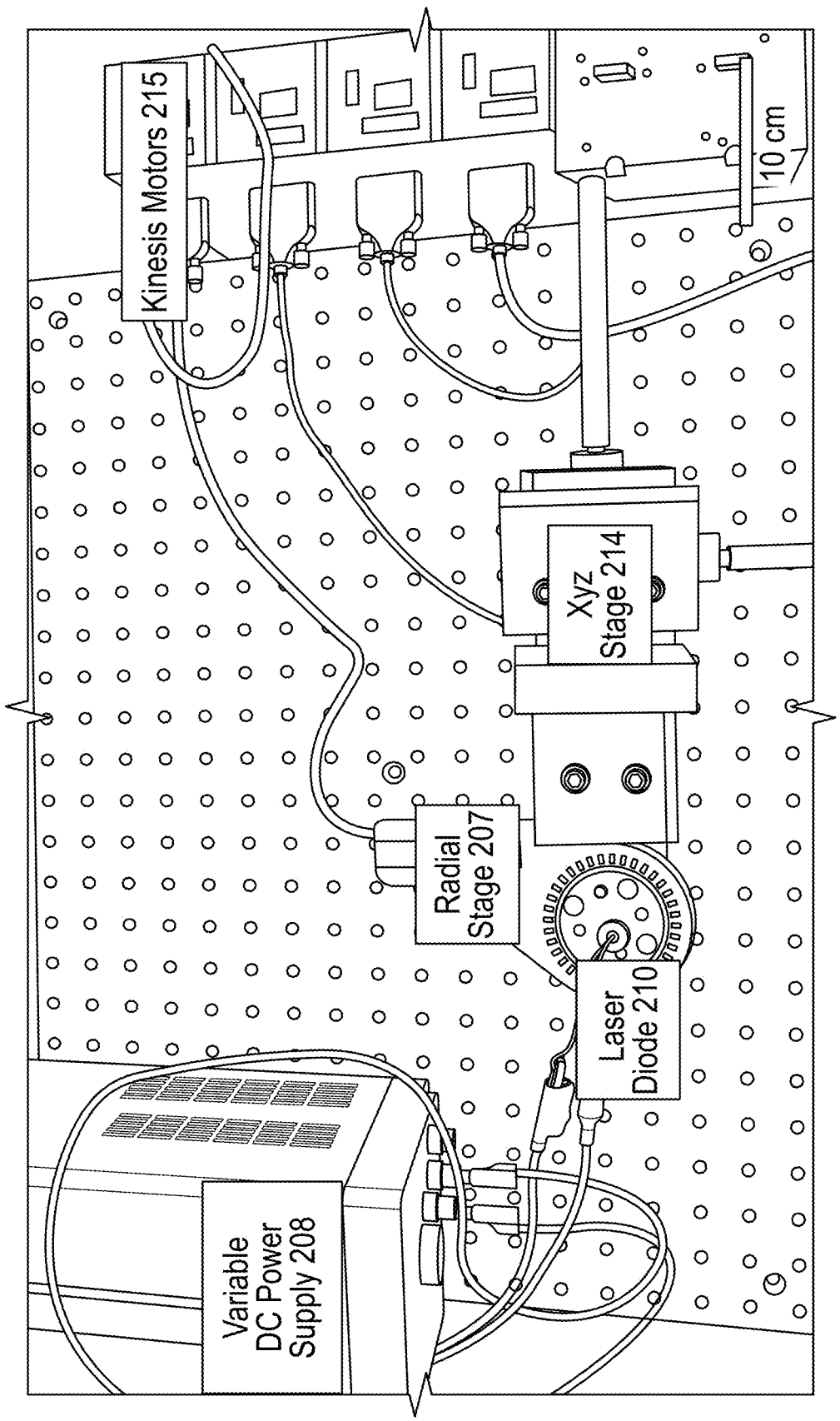

FIGS. 2A-2C illustrate a 4D mask-free lithography setup. FIG. 2A is schematic of the setup. As a non-limiting example, the components shown in FIG. 2A include a laser 210, which can be a 3.5 W diode laser, driven by a variable DC power supply 208, and a lens 206, which can be a plano-convex lens. The laser 210 and the lens 206 can be arranged with respect to a radial stage 207. FIG. 2A also shows a sample 211 on a xyz stage 214 that is driven by a Kinesis motor 215 that is controlled by a computer 220, which can be a personal computer (PC). Other motors can be used. In other embodiments, a laser diode, a plano-convex lens, or a laser source including a combination of laser diode and plano-convex lens can be arranged with respect to a movable stage to generate particles grown from metastable undercooled metal particles, where an example of multiple particles is represented in FIG. 1B. FIG. 2B is a frontal view of a laboratory setup. FIG. 2C is a Bird's eye view of the laboratory setup of FIG. 2B.

Figure 3A:
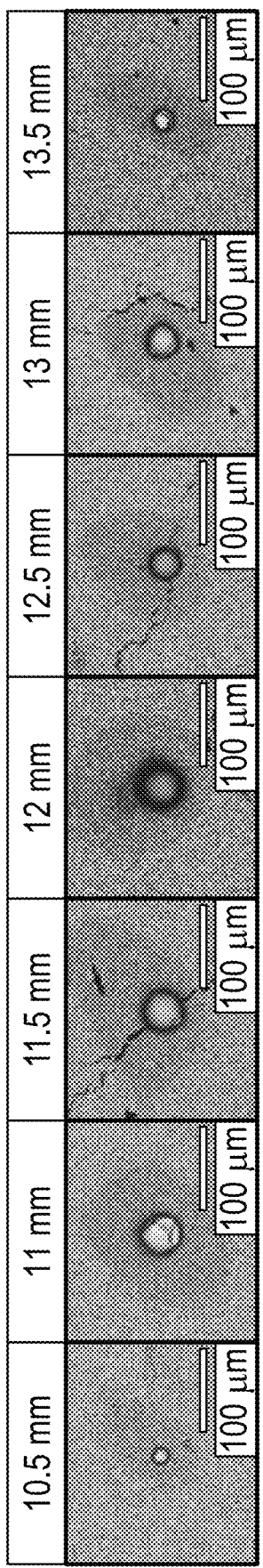
FIGS. 3A-3B illustrate the effect of working distance without aberration in growing a particle, in accordance with various embodiments.
Figure 3B:
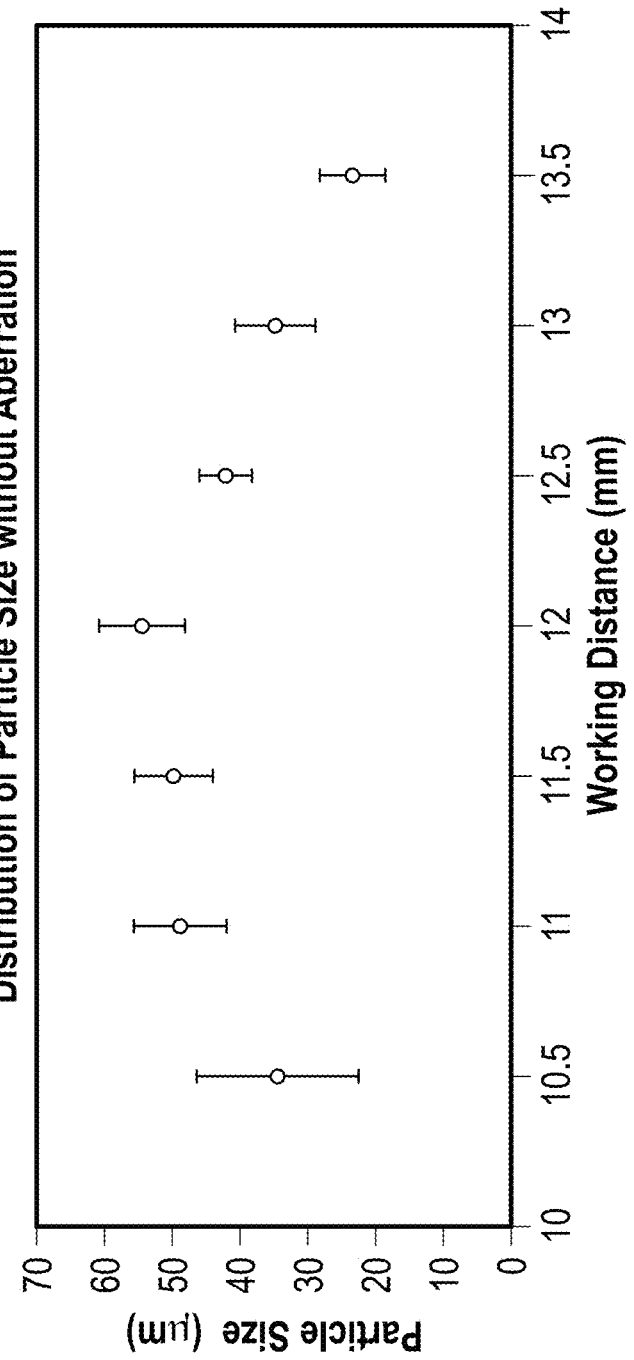

FIGS. 3A-3B illustrate the effect of working distance without aberration in growing a particle. FIG. 3A depicts images at different working distances. The working distances were 10.5 mm, 11 mm, 11.5 mm, 12 mm, 12.5 mm, 13 mm, and 13.5 mm. The focal point of the lens, used for the images of FIG. 3A, was 12 mm as given by the manufacturer. When the sample is placed below or above the focal point, the energy density will decrease because the area of effect of the laser beam will widen. The parameters used were a time equal to 30 seconds (t=30 s) and a power equal to two plus or minus 0.1 watts (P=2.0±0.1 W). FIG. 3B is a plot of particle size versus working distance for FIG. 3A.

Figure 4A:
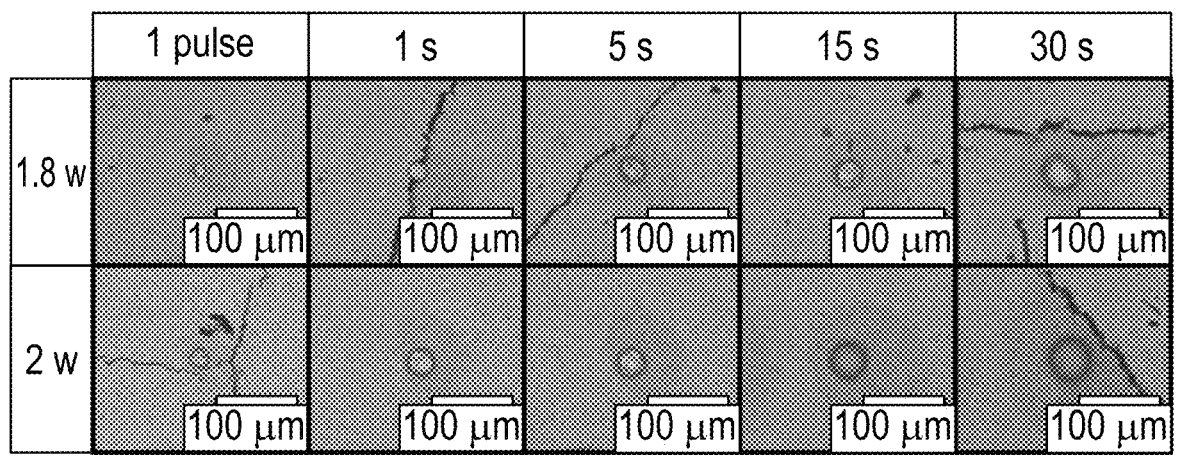
FIGS. 4A-4B illustrate the effect of time without aberration in growing a particle, in accordance with various embodiments.
Figure 4B:
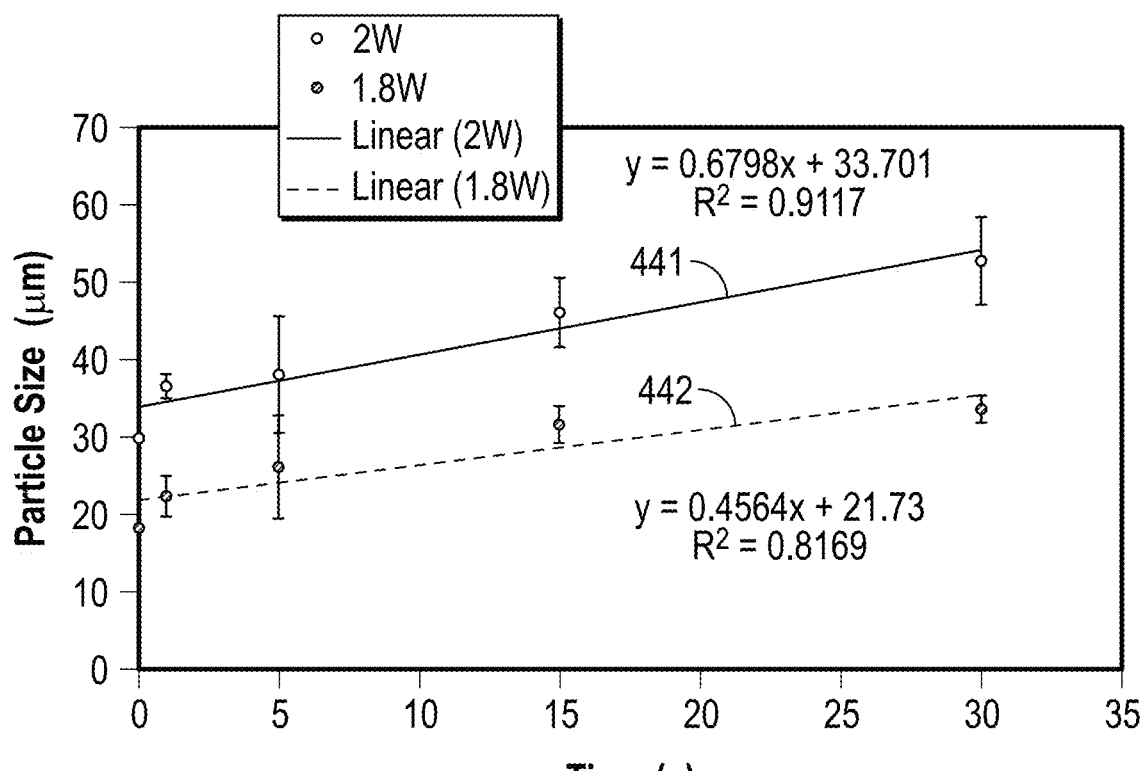

FIGS. 4A-4B illustrate the effect of time without aberration in growing a particle. FIG. 4A depicts images at different times. Effects for one pulse, a one second pulse, a five second pulse, a fifteen pulse, and a thirty second pulse for each of 1.8 W and 2 W laser power are shown. Particle grows and phase changes faster without lens aberration, due to the higher power density of the laser on the area. Particle can grow instantaneously at a pulse without lens aberration. FIG. 4B is a plot of particle size versus time for FIG. 4A. Curve 441 is for 2 W and curve 442 is for 1.8 W. As shown in FIG. 4B, the relationship between particle size and time can be linear at a fixed power.

Figure 5A:
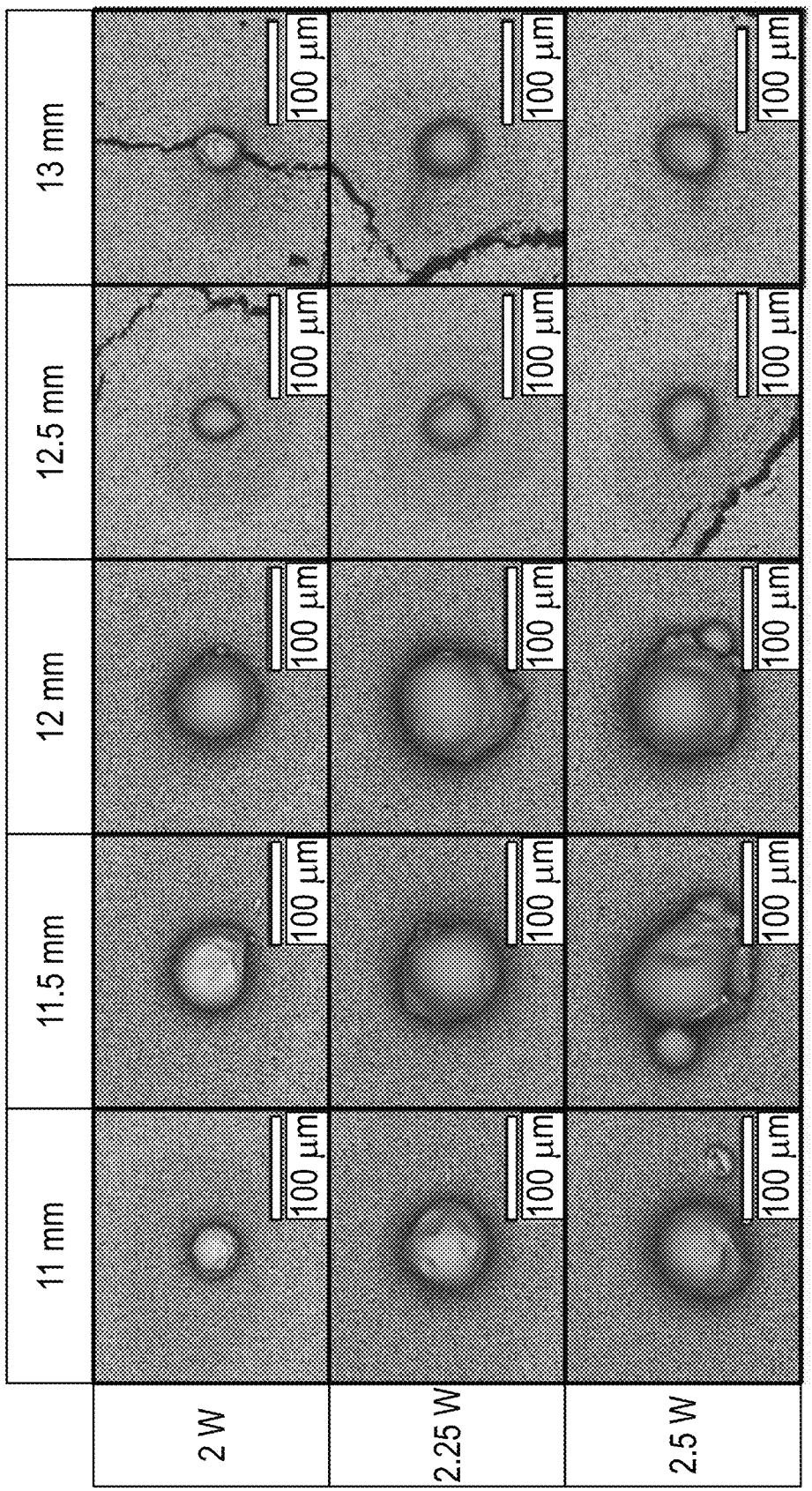
FIGS. 5A-5C illustrate the effect of working distance with aberration in growing a particle, in accordance with various embodiments.
Figure 5B:
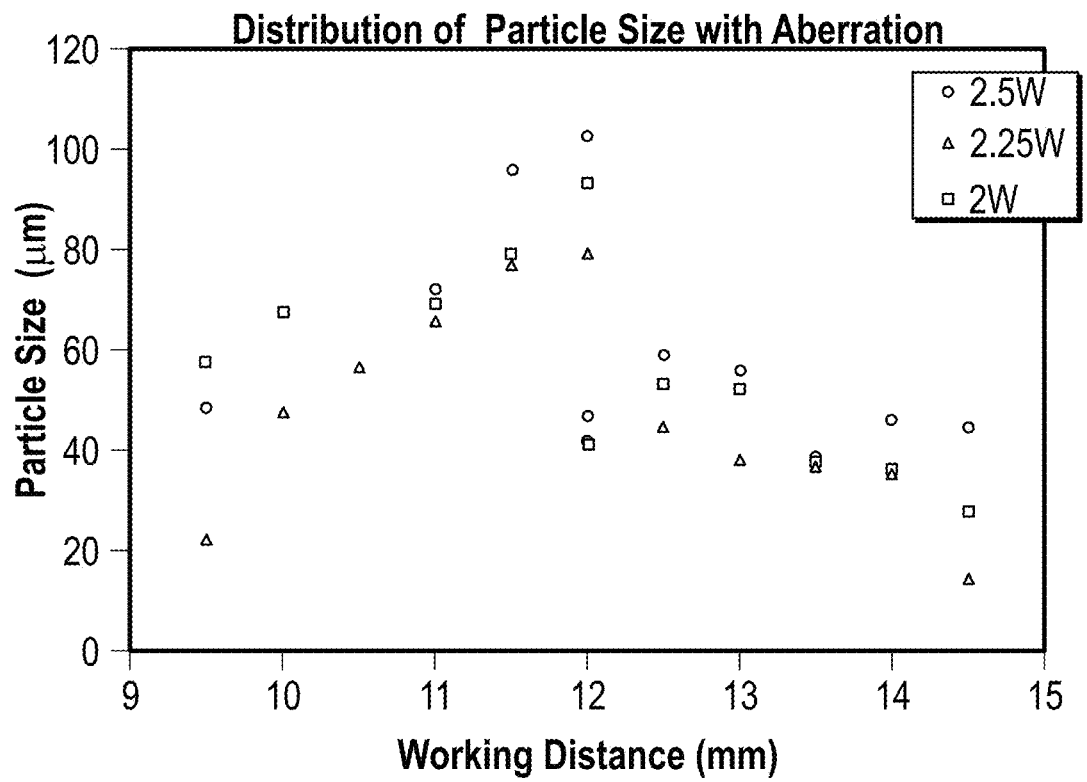
Figure 5C:
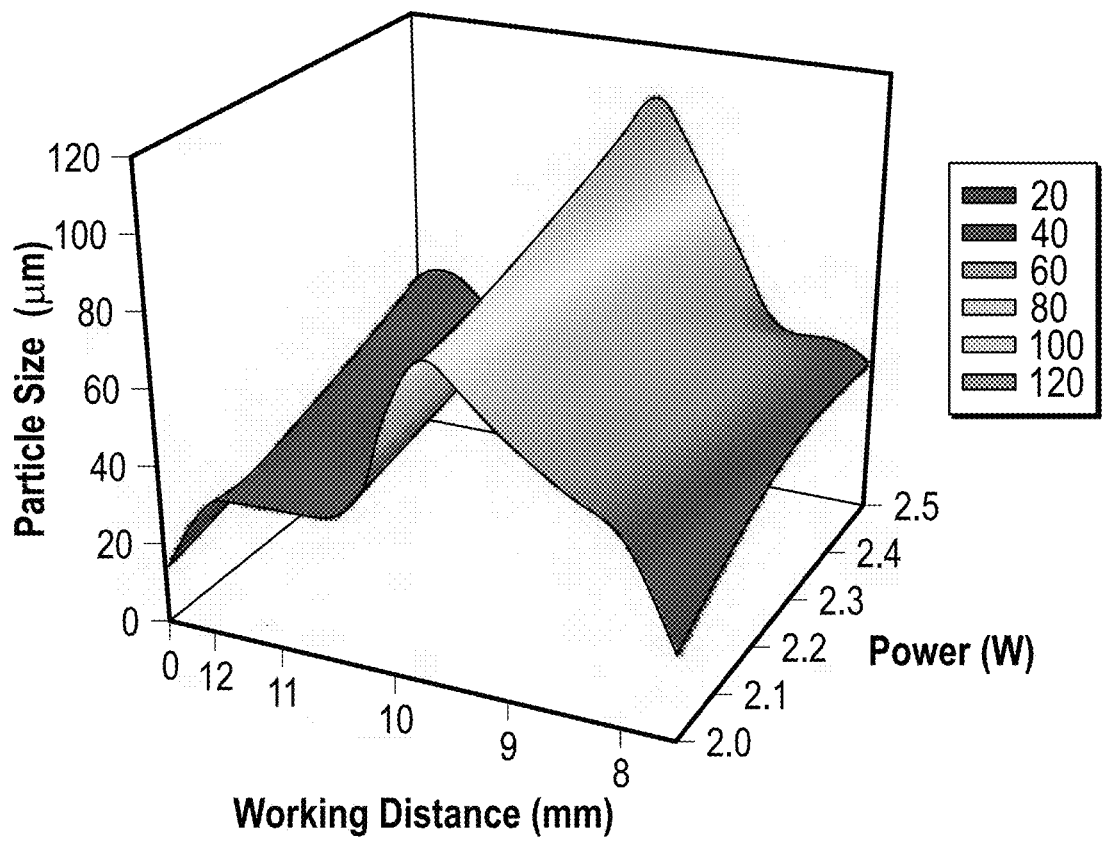

FIGS. 5A-5C illustrate the effect of working distance with aberration in growing a particle. FIG. 5A depicts images at different working distances. Effects for 11 mm, 11.5 mm, 12 mm, 12.5 mm, and 13 mm working distances for each of 2 W, 2.25 W, and 2.5 W laser power are shown. The working distance at 12 mm (WD=12 mm), which is distance to the focal plane, has the highest power density and thus produces a larger particle. Moving away from the focal plane will reduce power density. Variation of photon flux can also be achieved through aberration, which is displayed here. The parameters used were a time equal to 30 seconds (t=30 s) and a power equal to two plus or minus 0.1 watts (P=2.0±0.1 W). FIG. 5B shows a distribution of particle size with aberration, in which particle size is plotted versus working distance for each of 2 W, 2.25 W, and 2.5 W laser power. FIG. 5C is a three-dimensional (3D) plot of particle size, working distance, and power.

Figure 6A:
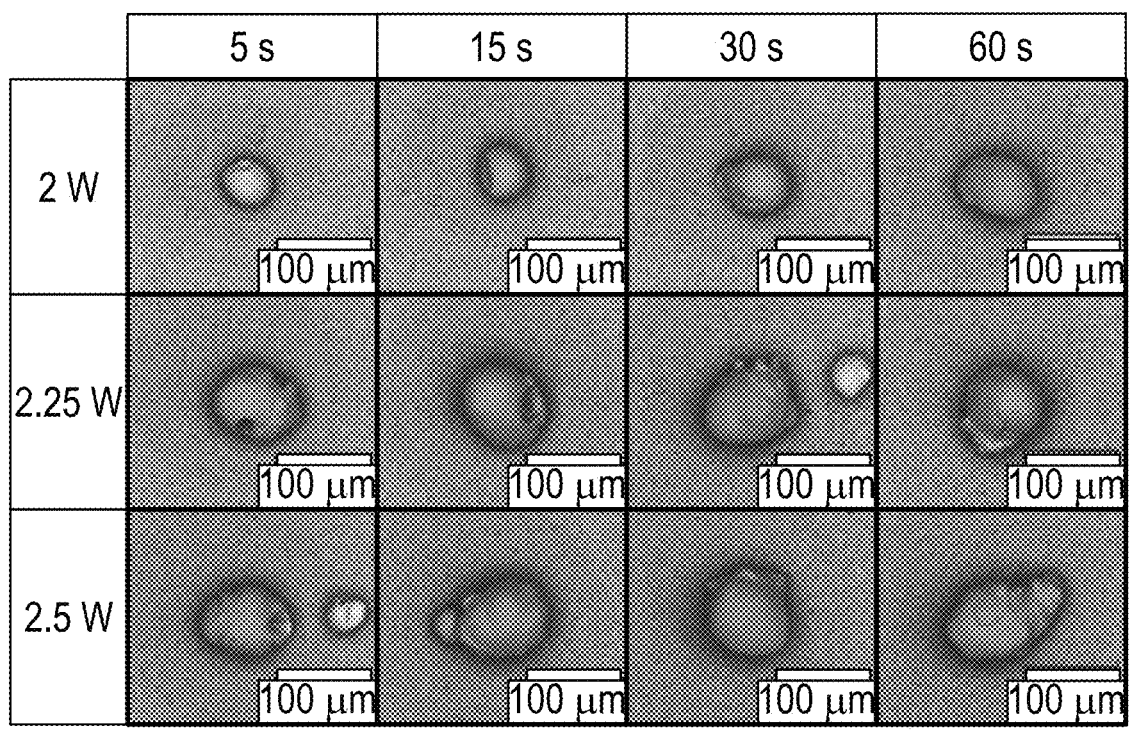
FIGS. 6A-6D illustrate the effect of time at the focal point in growing a particle, in accordance with various embodiments.
Figure 6B:
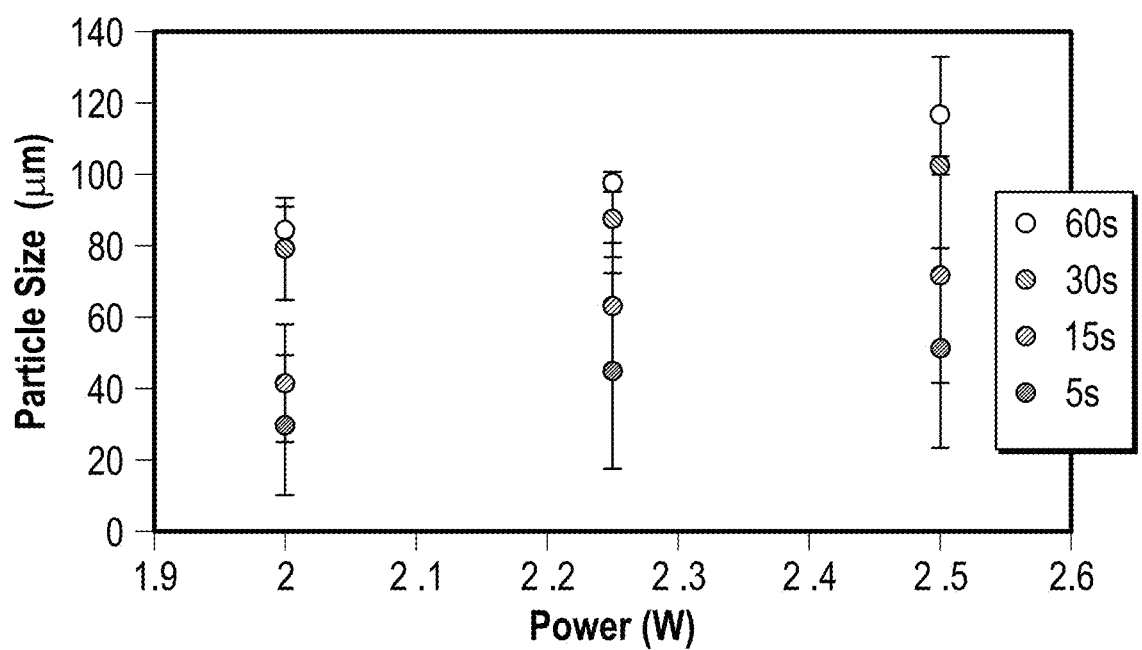
Figure 6C:
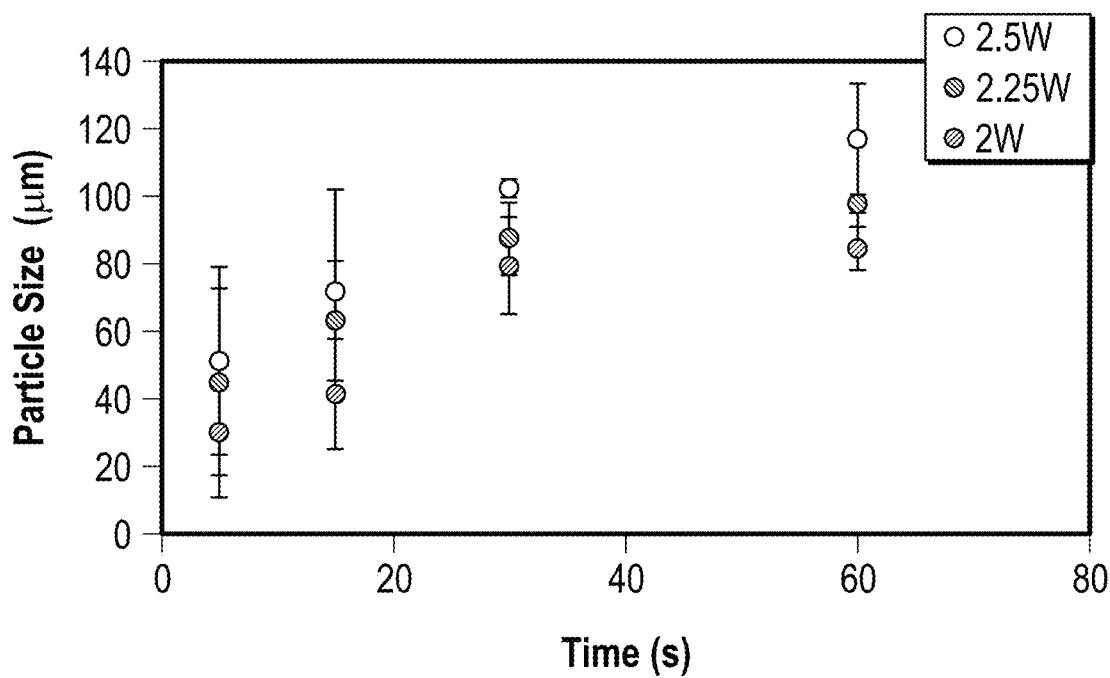
Figure 6D:
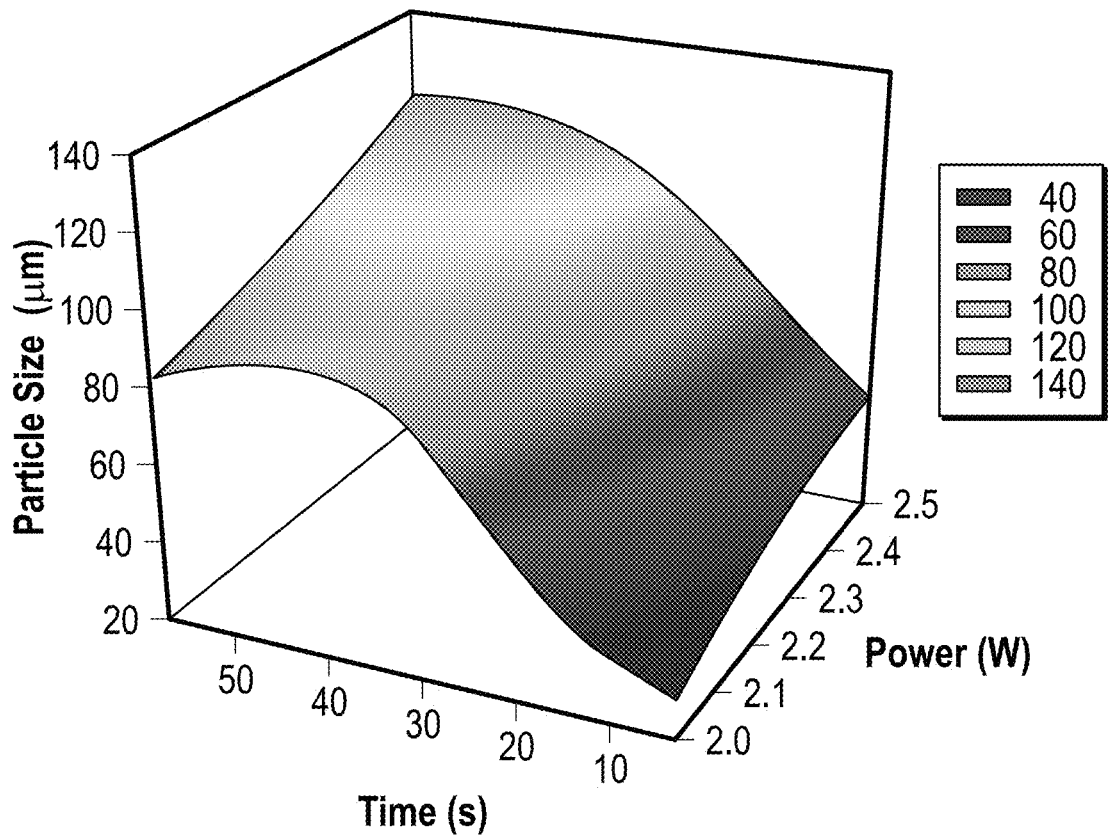

FIGS. 6A-6C illustrate the effect of time at the focal point in growing a particle. FIG. 6A depicts images at different times. Effects for five second irradiation, fifteen second irradiation, thirty second irradiation, and sixty second irradiation for each of 2 W, 2.25 W, and 2.5 W laser power are shown. FIG. 6B is a plot of particle size versus power at different times for each of sixty second irradiation, thirty second irradiation, fifteen second irradiation, and five second irradiation. FIG. 6C is a plot of particle size versus time at different powers for each of 2.5 W, 2.25 W, and 2 W laser power. Particle growth shows a linear/decay correlation with time up to 60 s. FIG. 6D is a 3D plot of particle size, time, and power.

Figure 7A:
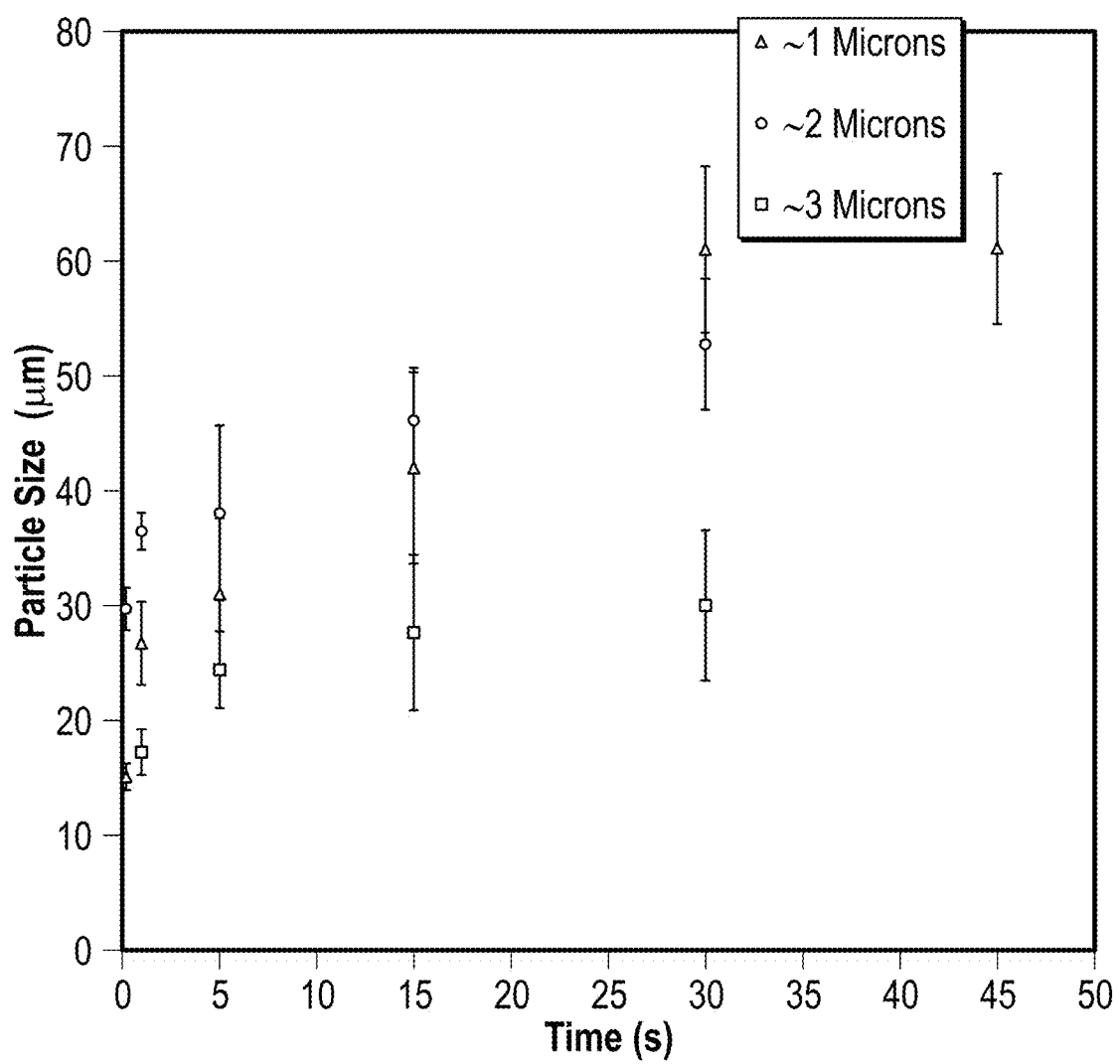
FIGS. 7A-7D illustrate the effect of initial particle size in growing a larger particle, in accordance with various embodiments.
Figure 7B:
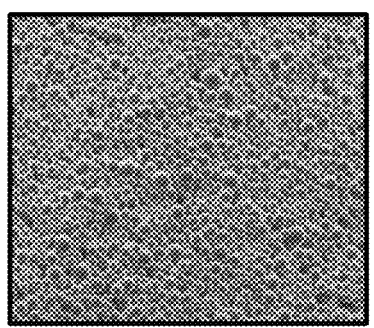
Figure 7C:
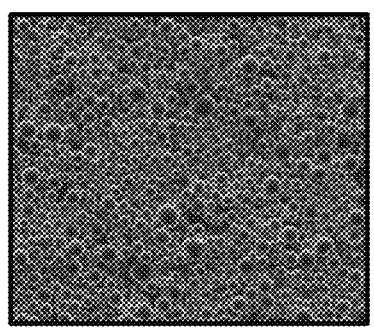
Figure 7D:
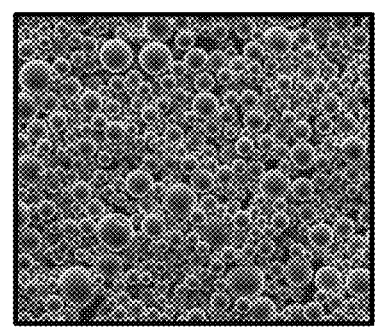

FIGS. 7A-7D illustrate the effect of initial particle size in growing a larger particle. FIG. 7A is a plot of particle size versus time for growth from three sizes of initial particles of appropriately 1 micron, appropriately 2 microns, and appropriately 4 microns. FIGS. 7B-7D illustrate that a batch of smaller particle sizes will result in larger final particle growth compared to larger particle batch.

Figure 8A:
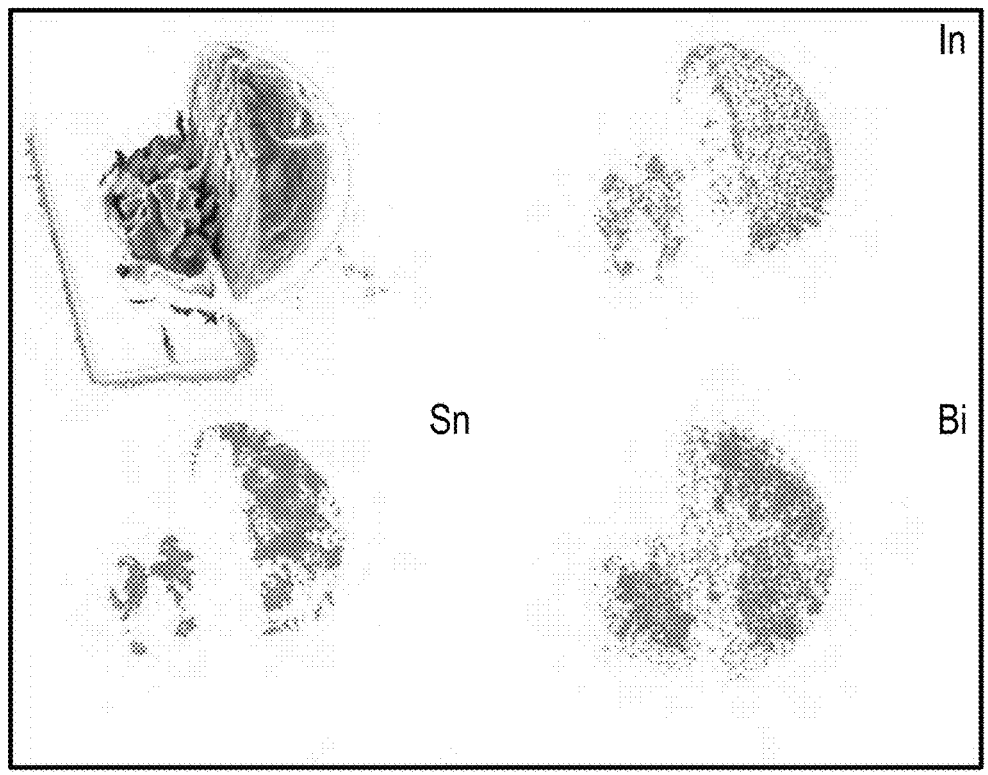
FIGS. 8A-8B are energy dispersive spectroscopy maps showing different phase segregation for In, Sn, and Bi, in accordance with various embodiments.
Figure 8B:
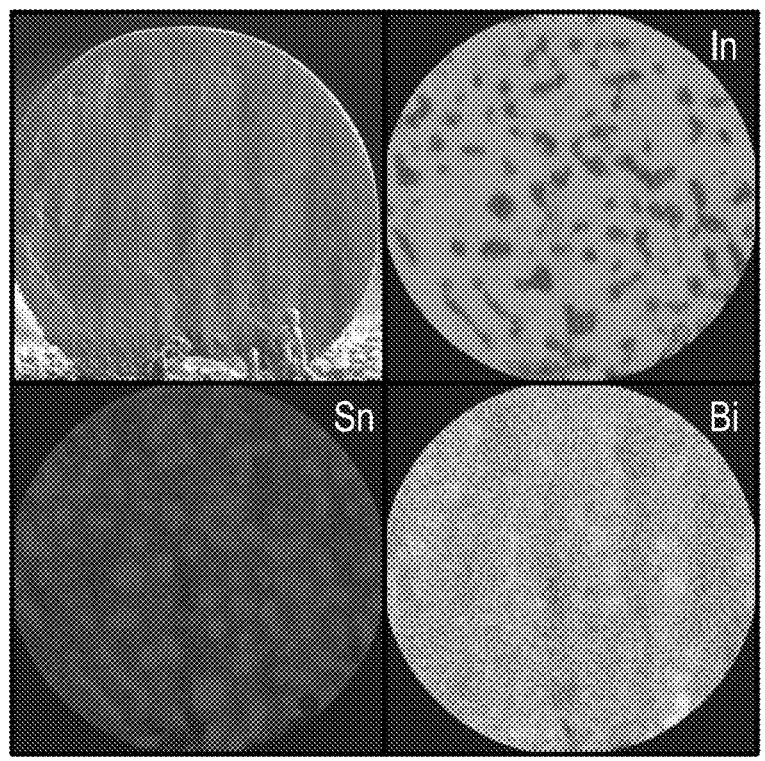

FIGS. 8A-8B are energy dispersive spectroscopy (EDS) maps showing different phase segregation for In, Sn, and Bi. FIG. 8A was generated with respect to mechanical stress induced instability. In the case of mechanical stress, Bi and Sn phases segregate, and In phase is found everywhere in the sample. This can be explained by the nature of the shear modulus (G) of each respective element. The shear modulus of bismuth, $G_{Bi}$, is 11.9 GPa, the shear modulus of indium, $G_{In}$, is 3 GPa, and the shear modulus of tin, $G_{Sn}$, is 15.6 GPa. The element In, having the smallest modulus, will be the element that is most likely to deform under mechanical stress, which is why they are spread all across the sample. FIG. 8B was generated with respect to quantum stress induced instability. In the case of quantum state, the redox potential of the elements is considered. Redox potential is a measure of how easily a metal (or other ion) will give up electrons or retain electrons and can be expressed in terms of voltage. The redox potential of Bi is −0.317; the redox potential of In is 0.338; and the redox potential of Sn is 0.14. Here, one can see that bismuth has the lowest value, which means it is the easiest to oxidize. From the EDS map, one can see that Bi is found everywhere on the sample, while In and Sn phases segregate. Here, one can directly connect the similarity between mechanical stress and quantum stress through the two parameters.

Figure 9A:
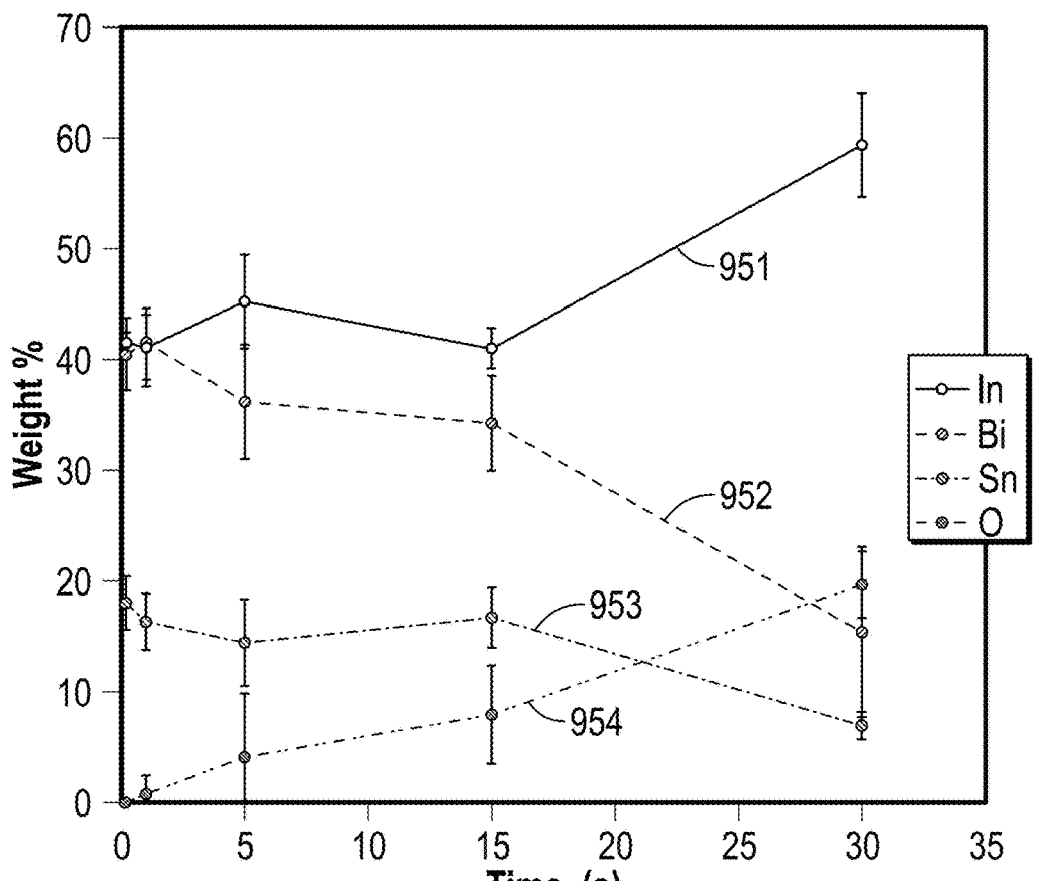
FIGS. 9A-9B illustrate change of concentration over time, in accordance with various embodiments.
Figure 9B:
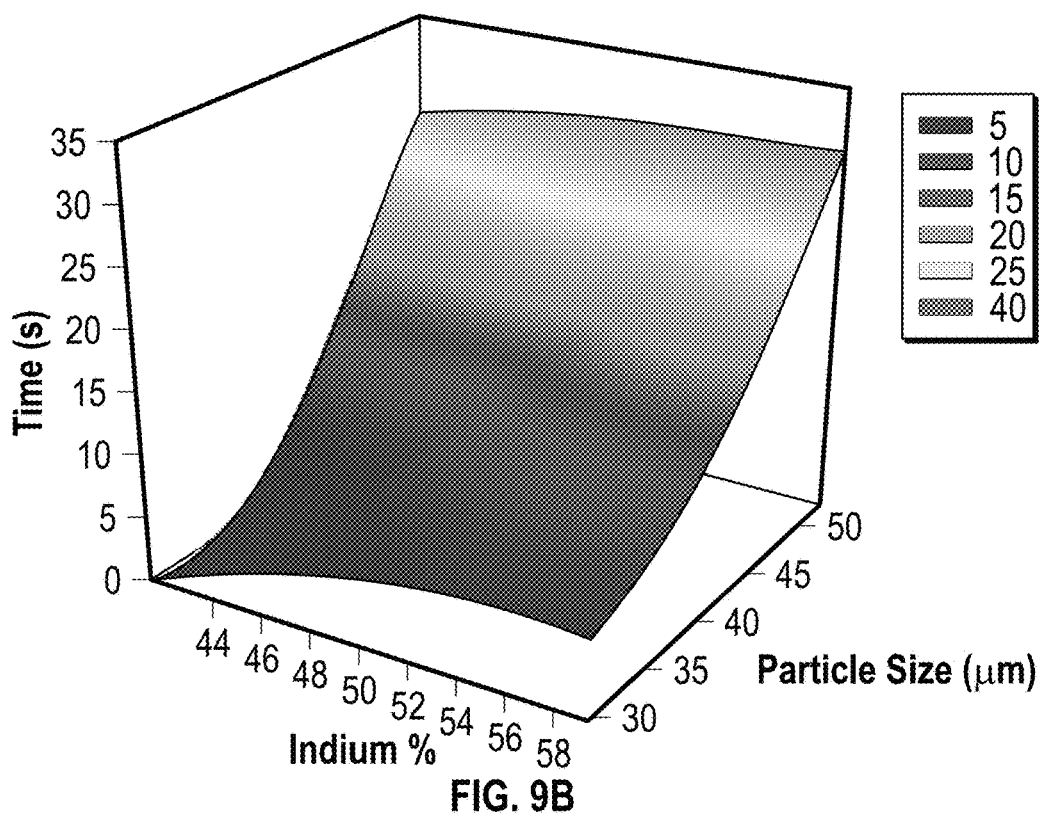

FIGS. 9A-9B illustrate the change of concentration over time. FIG. 9A is a plot of weight by percentage versus time for the elements In, Bi, Sn, and O. Plot 951 is for indium; plot 952 is for bismuth; plot 953 is for tin; and plot 954 is for oxygen. FIG. 9B is a 3D plot of time, percentage of In, and particle size. Indium increases as Bi and Sn decreases (inversely proportional), and oxygen increases with indium increase (proportional).

Figure 10A:
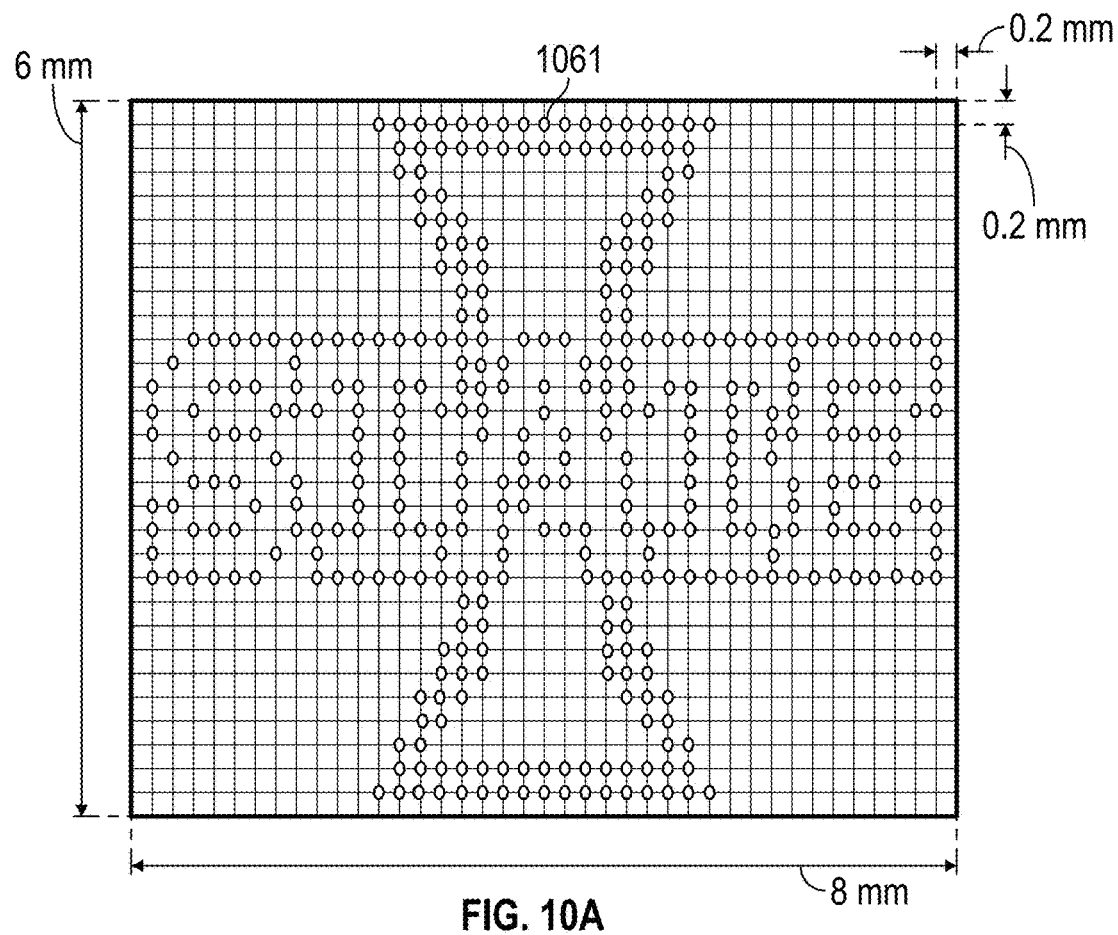
FIGS. 10A-10B illustrate an example of complex patterning of particles, in accordance with various embodiments.
Figure 10B:
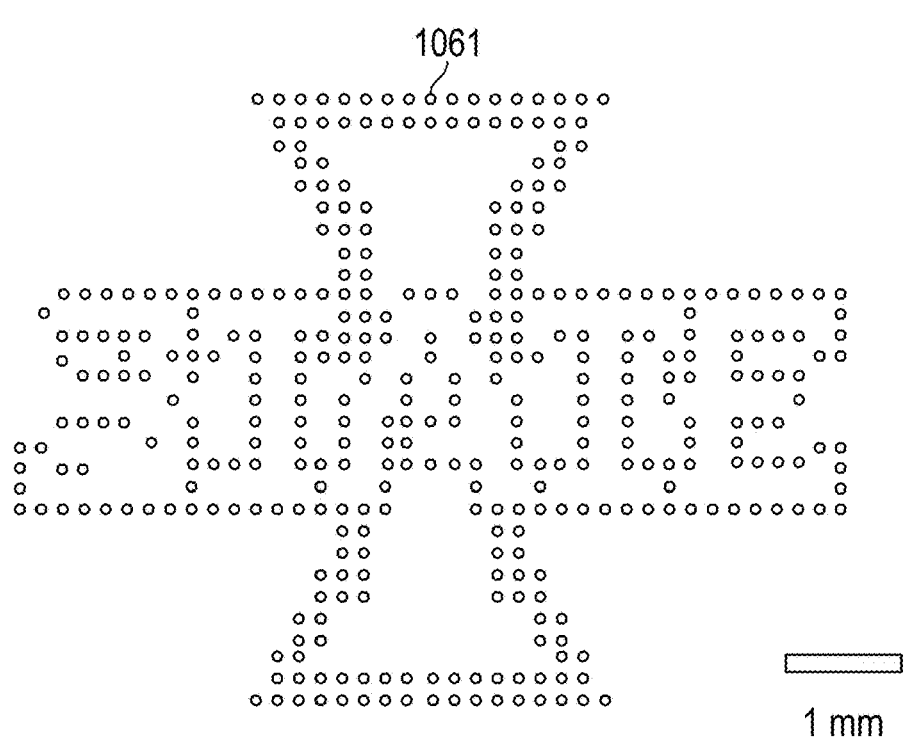
Figure 11A:
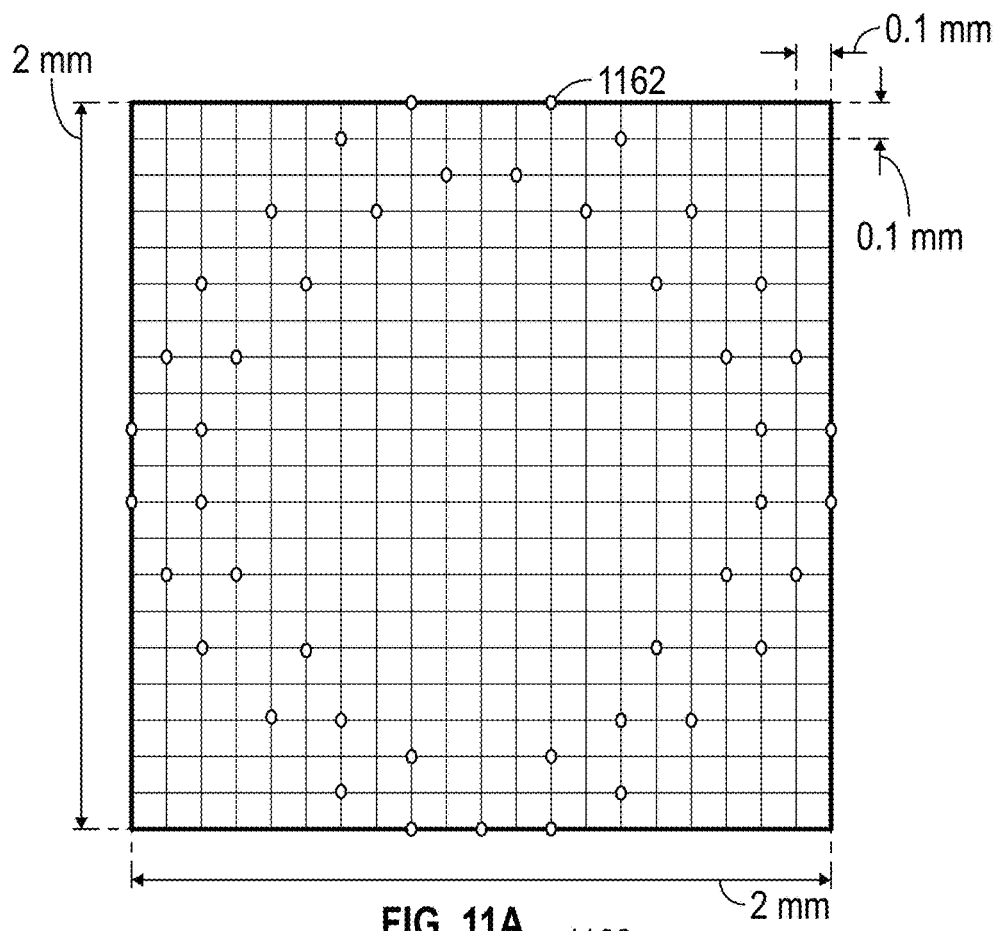
FIGS. 11A-11B illustrate an example of complex patterning of particles, in accordance with various embodiments.
Figure 11B:
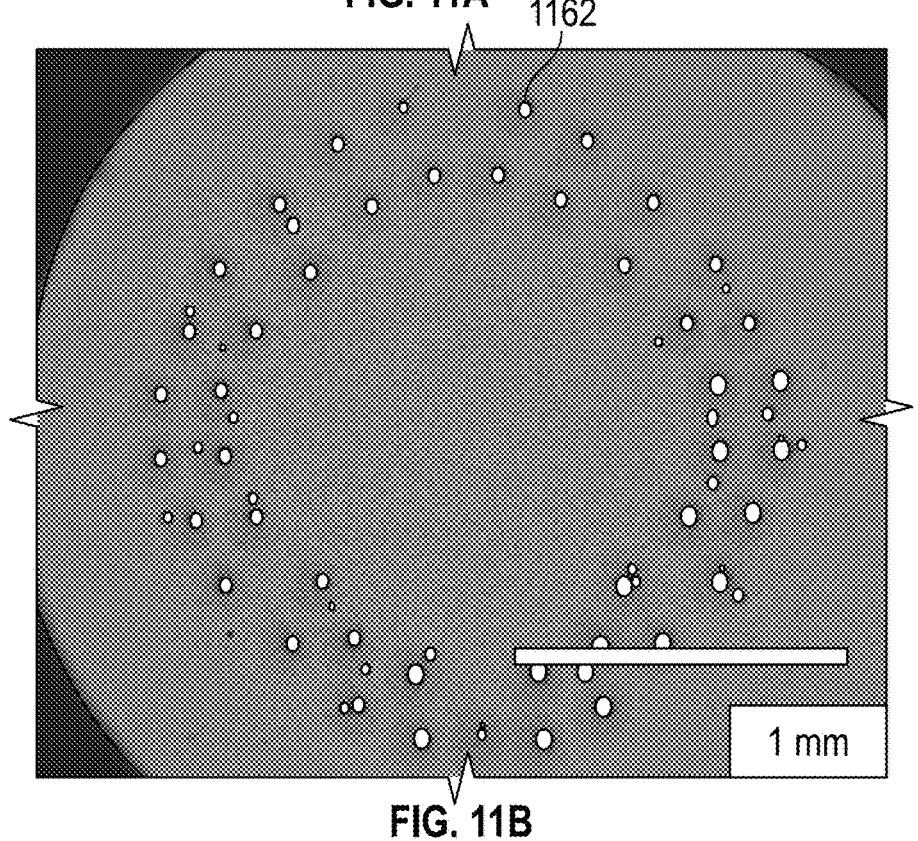

FIGS. 10A-10B illustrate an example of complex patterning of particles grown as disclosed herein. The difference in sharpness with respect to the grown particles indicates a gradient in elevation of the particles. Particles 1061 are shown in FIGS. 10A-10B. FIGS. 11A-11B illustrate an example of complex patterning of particles grown as disclosed herein. Here, the pattern has a circular shape with particles 1162.

Figure 12A:
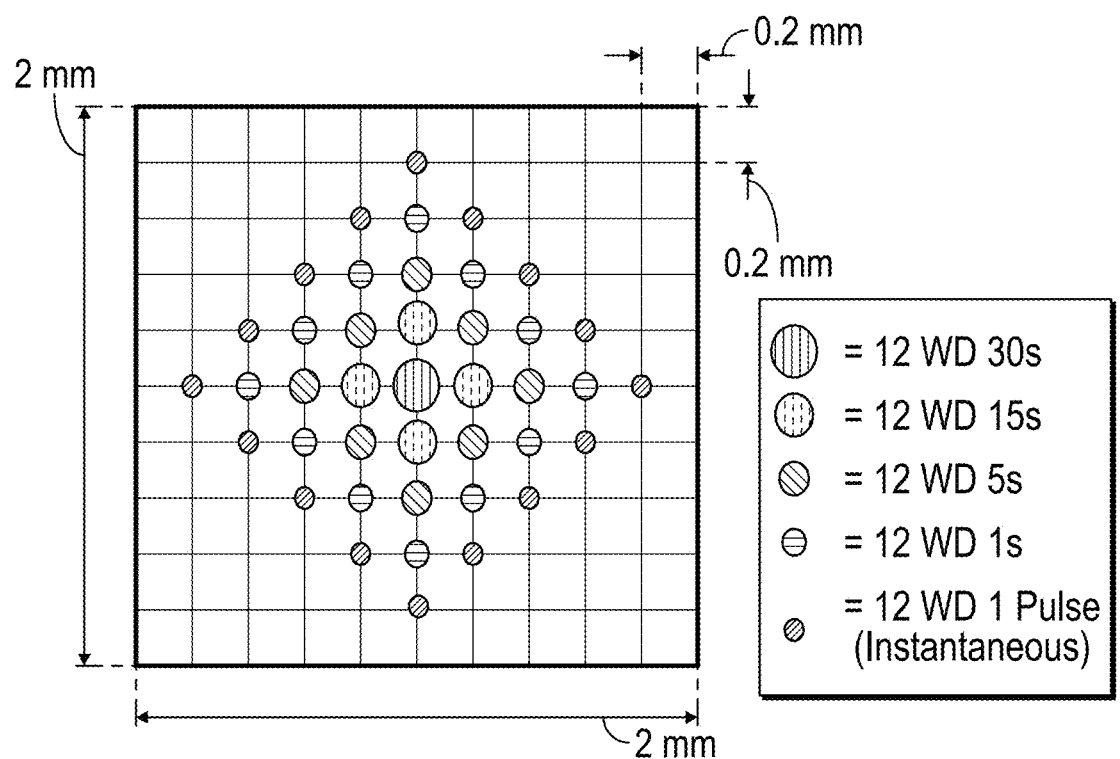
Figure 12B:
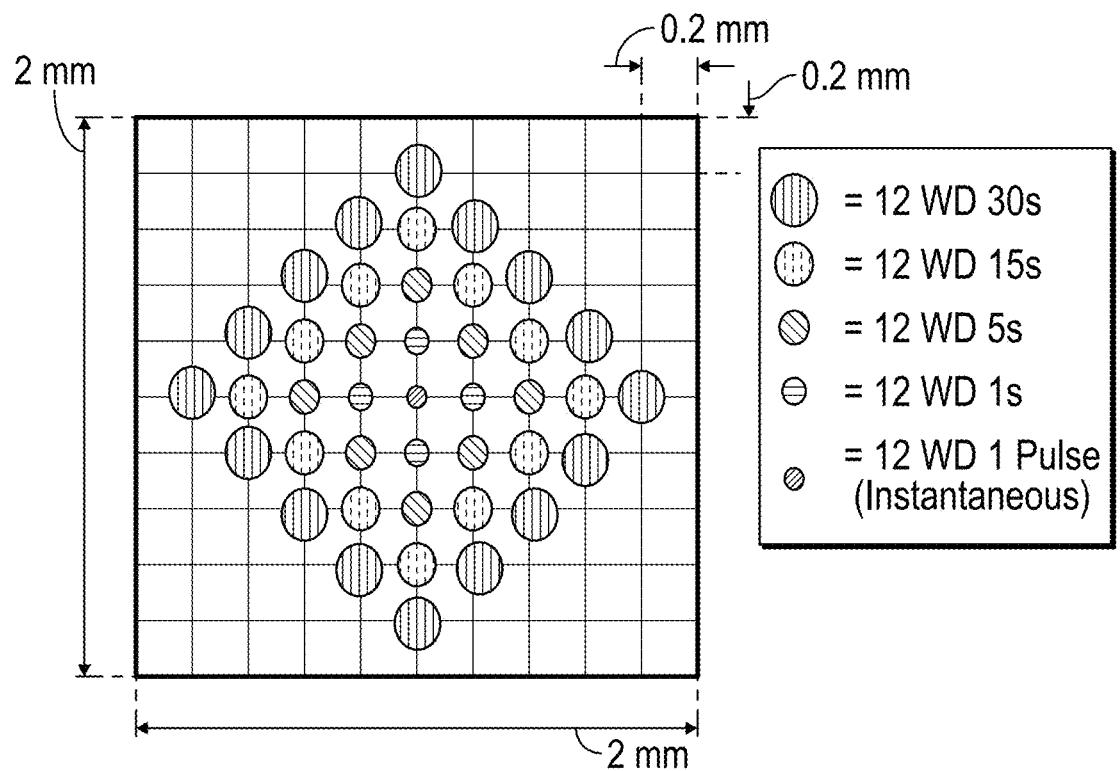

FIGS. 12A-12F illustrate an example of complex patterning of particles, grown as disclosed herein, in which the complex patterning is generated with controlled size. FIGS. 12A and 12B show sizes corresponding to a 12 mm working distance for thirty seconds, a 12 mm working distance for fifteen seconds, a 12 mm working distance for five seconds, a 12 mm working distance for one second, and a 12 mm working distance for one pulse, which is an instantaneous irradiation. In FIGS. 12C-12F, the differences in darkness of the particles in the pattern indicate different sizes of the particles.

In example experiments, a ternary alloy (Field's Metal with Bi:In:Sn=32.5:51.0:16.5 wt %) was used. In this metastable alloy, bismuth acts as a catalyst to the whole process due to it being the most polarizable and has the most oxidation state. The fact that bismuth has the most accessible electron configuration allows the whole alloy to be activated by a relatively small amount of photon energy that is supplied by the low-power laser. It is known that these metastable particles will solidify once fractured. In the example experiments, the shell was fractured by supplying just enough photon energy to the particles. Understanding the laser and metastable material interaction allows one to be able to minimize the energy requirement and furthermore scale down the additive manufacturing size to a simple desktop setup and a small laser pointer. The setup used can be seen in FIGS. 2A-2C.

This method can be used to create solid metal structures with variation in size over many dimensions. A couple of factors, for example working distance and time, can in turn be varied to adjust the particle size and/or the composition of the particle fabricated through this process.

Some important aspects to be considered when working with optics are the focal length and lens aberration. Here, in example experiments, both focal length and working distance were varied. FIG. 3A and FIG. 5A show a distribution of particle size as a function of working distance with a focal length of 12 mm. The grown particle size reaches a maximum at the focal length due to the laser beam being focused and therefore achieves the highest power density. A symmetry can be seen when the lens is sitting perfectly perpendicular to the laser beam as shown in FIG. 3B and this is expected due to the nature of light and optics. However, the effect of aberration that is usually considered a defect can also be utilized to get a rather interesting result.

As can be seen in FIG. 5B, the particle size distribution between the focal length is no longer symmetrical. The similar trend between the three different power levels shows that this is indeed caused by the laser beam not being completely focused on one spot. This aberration effect can be utilized by the particle to able to reach larger particle size (approximately 90 μm) without exploding due to oversaturation of bismuth. A problem of a high-power density laser beam on the particle is that the exposed particle's rate of phase change is faster than the growth, this will cause the bismuth content of the growing particle to move to the surface faster and the build-up will cause the particle to explode before growing to a large size. The maximum particle size achieved without lens aberration is only approximately 50 μm, which is about half of the maximum particle size grown by utilizing the effect of lens aberration. The high-power density laser beam can be utilized to fabricate grown particles using lower power output and much shorter exposure time. Furthermore, a 3D predictive model can be created from the grown particle size distribution data so that one is able to predict and fabricate various grown particle sizes based on the trend that was created.

In contrast from the effect of working distance, exposure time shows a more linear effect towards the grown particle size. FIG. 4A-4B show the grown particle size distribution between the ones with and without lens aberration. Without lens aberration, a particle can be exposed for up to 30 seconds before it starts to get oversaturated, while particles can be exposed to up to 60 seconds with lens aberration. The same results as working distance was achieved where lens aberration can give a larger particle size distribution due to the rate of phase change versus growth. However, with the high-power density achieved by focusing the laser without lens aberration, grown particles can be fabricated within approximately 0.2 seconds (1 pulse), which effect cannot be achieved when the laser is not completely focused. This is to be expected as there is a certain activation energy level that has to be achieved to induce the Marangoni flow and grow these particles. If the photon energy is not focused, it may require extra time for it to be able to start coalescing and growing. As with the working distance, a 3D predictive model was also able to be fabricated for the effect of time.

Based on the various parameters that affects particle size, such as time and working distance, unique patterns can be fabricated on the undercooled metal particle bed. FIGS. 10B, 11B, and 12C-12F show unique patterns that can be created by using the 4D mask-free photolithography method. As observed, the pattern's resolution can achieve a minimum distance of 0.2 mm between laser spots. Higher resolution can be achieved by using a more focused lens to achieve an even smaller laser area of effect. Variable size in the patterns can be achieved by either changing the working distance or the laser exposure time on the particles. The complex patterning capabilities of this method does not only vary the particle size but also the composition of the grown particles. The larger, darker particles that typically absorbed more photon energy due to the high-power density or exposure time will typically have a high indium content compared to the less exposed particles. This is due to the migration of bismuth that was explained previously, this composition variable can be utilized to get patterns with composition gradients.

Several key factors determine the feasibility of this method, one of them is the presence of a highly polarizable element in the system that acts as a catalyst. In the example experiments herein, Field's metal was used, and the ternary alloy contains bismuth, an element with eight oxidation states. The existence of bismuth in the system, especially as an enriched layer near the surface, allows plasmonic effect to happen and particles to react with each other at each respective contact point, allowing the coalescence to happen. Bismuth also has the lowest surface tension amongst the three elements and that explains why bismuth concentration goes down from the bulk as grown particles absorb more of photon energy. The bismuth content separates from the bulk and is attracted to the surface due to the nature of a low surface tension element as explained by the Cahn-Hilliard equation or Helfrich-type (Cahn-Hilliard equation with flow) model. Bismuth continues to build up on the surface of the grown particle until it finally oversaturates and explodes. The rate of phase separation of bismuth plays an important role in determining how large or how fast a particle can grow. Slow phase separation process allows particle to grow larger without bismuth being too oversaturated on the surface and risking the particle to explode. On the other hand, if bismuth's phase separation is faster than the growth rate, particles will explode much faster before growing to a large size. The rate of phase separation of bismuth is mostly controlled by the energy density of the laser and how much photon energy is supplied to the particle. High energy density laser will polarize bismuth at a fast rate and "cook" the particles faster as seen in the results without lens aberration. With lens aberration, the laser power density is not as high, and particles grow to a larger size before bismuth oversaturates on the surface. Other binary and ternary liquid metal alloys such as eutectic gallium-indium (EGaIn) and GaInSn were also tested under the same parameters but neither showed any particle growth or coalescence. This shows the essence of the metastable material state.

Photon energy-material interaction is also dependent on the dielectric constant and refractive index (n) of the material. Here, in the example experiments, the material is an amorphous liquid particle with a high refractive index, which gives the ability to absorb the photon energy and trigger the coalescence process. But what will happen if the material is an amorphous solid? Further experiments were performed to investigate the role of the material state and it was discovered that amorphous Field's metal solid particles (bulk metallic glass) actually absorb even more photon energy from laser with the same energy level. The particle grows large and explodes almost immediately as it gets exposed to the concentrated laser beam. This shows that the process is not just dominated by surface tension but rather depends on thermodynamic meta-stability.

Based on understanding the effect of photon-material interaction, meta-stability of materials can be utilized as a gateway to a low energy fabrication method. Process that is typically bulky and requires a lot of energy such as metal additive manufacturing can be scaled down to the size of a simple laser pointer.

Consider quantum-based metastable-metastable phase transition. Thermodynamic metastability can be introduced in material, such that this material is in high energy state, liquid form. Photon energy can be used to induce translational movement inside the system by utilizing polarizable element and low energy laser (enough to overcome the energy barrier and move to another metastable state and/or different electronic state). Liquid allows for flow, plastic deformation, and Marangoni type instability, which leads to expansion.

Figure 13A:
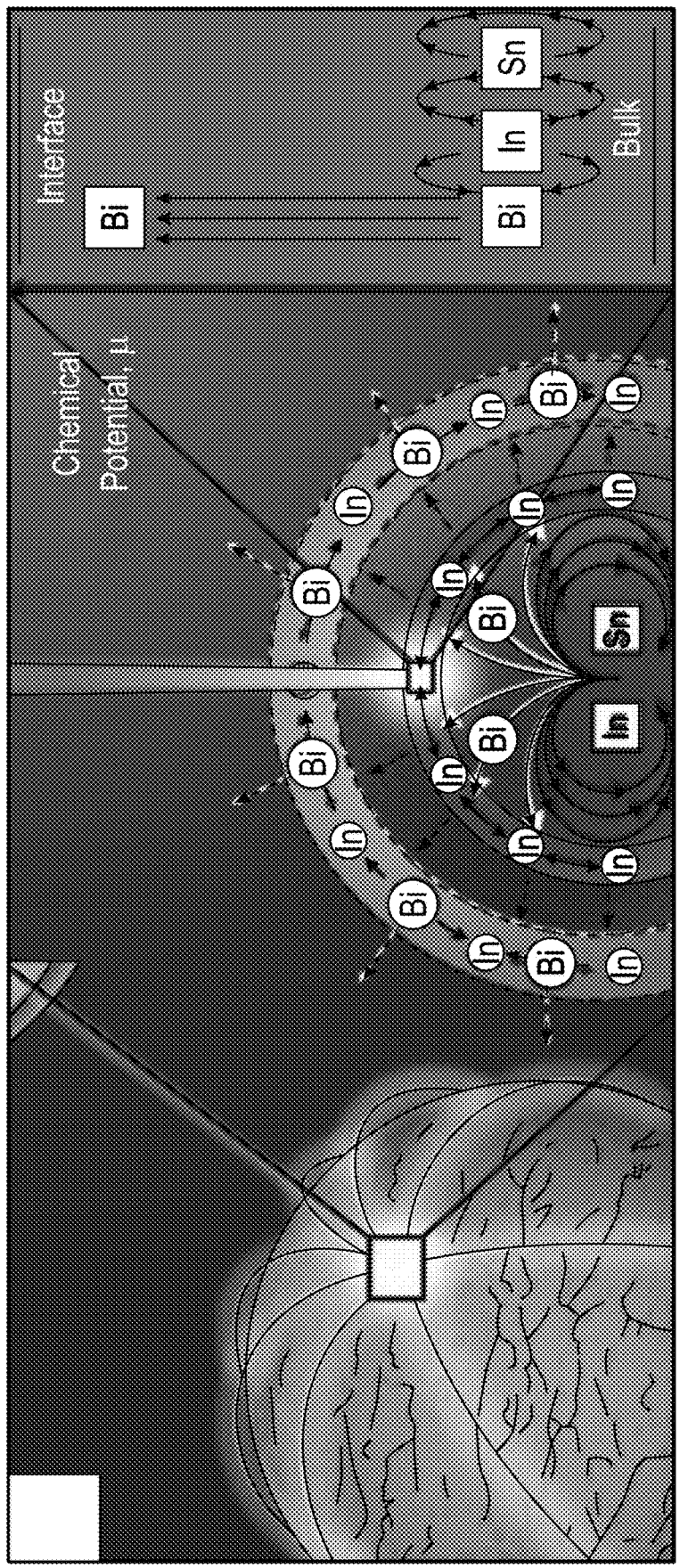
FIGS. 13A-13K illustrate a proposed mechanism of metastable to metastable phase transition through photon beam supply, in accordance with various embodiments.
Figure 13B:
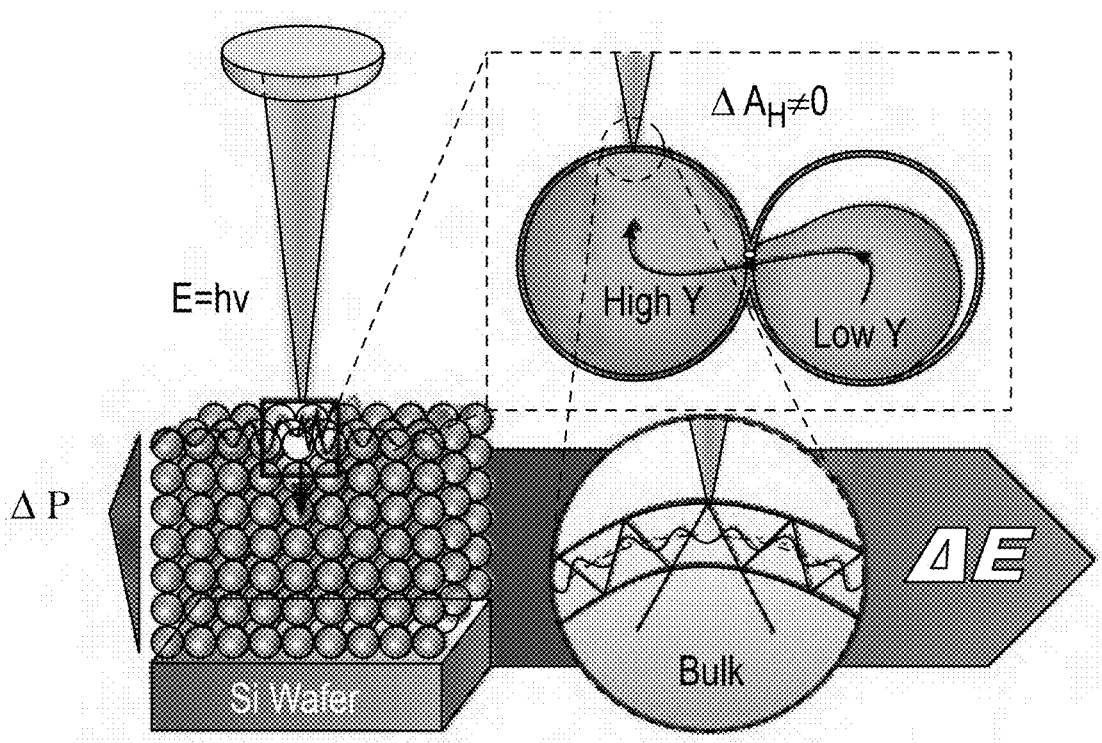
Figure 13C:
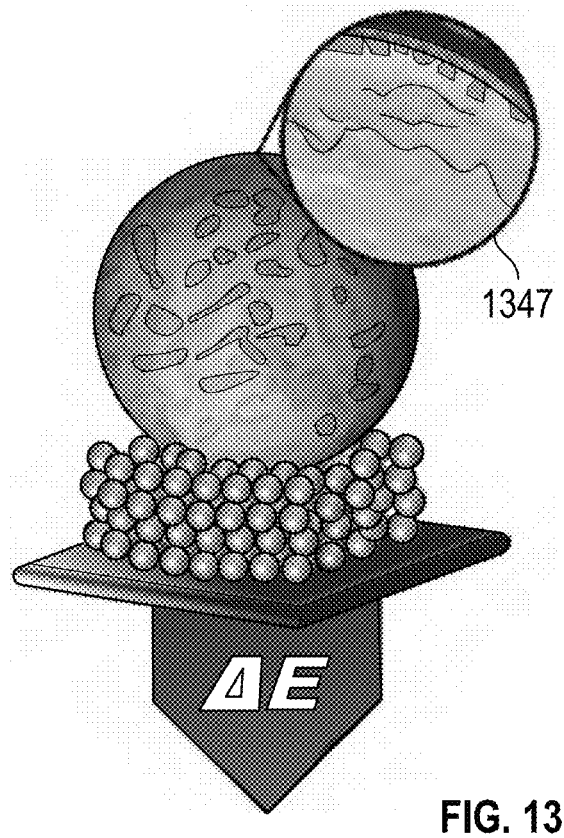
Figure 13D:
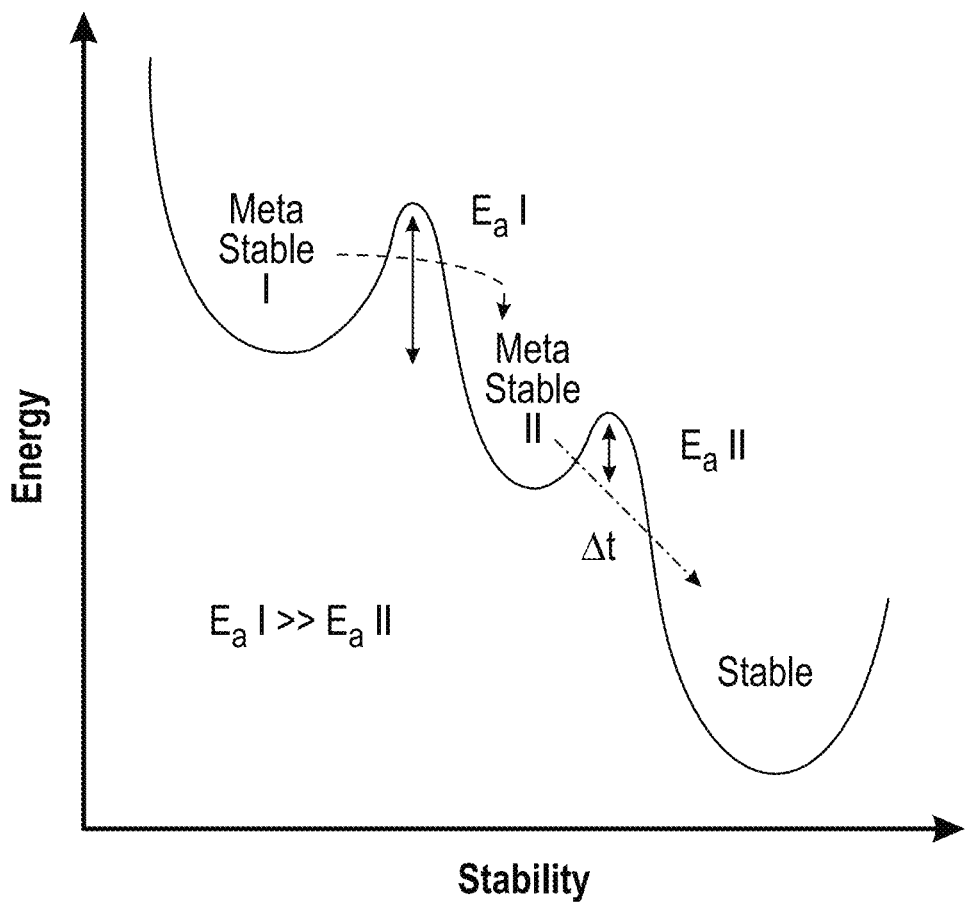
Figure 13E:
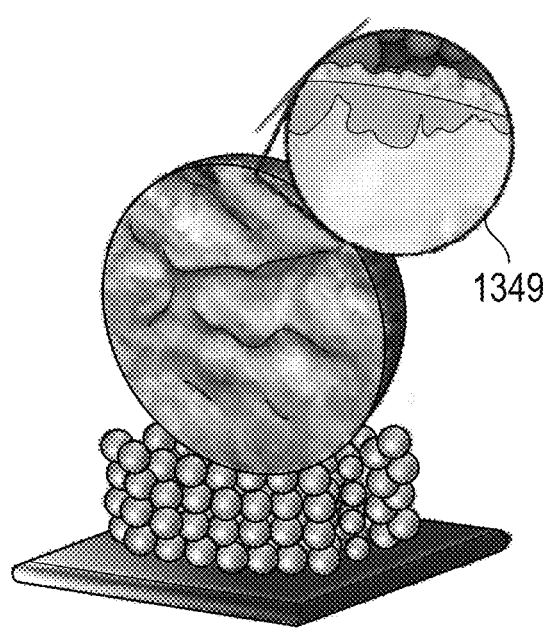
Figure 13F:
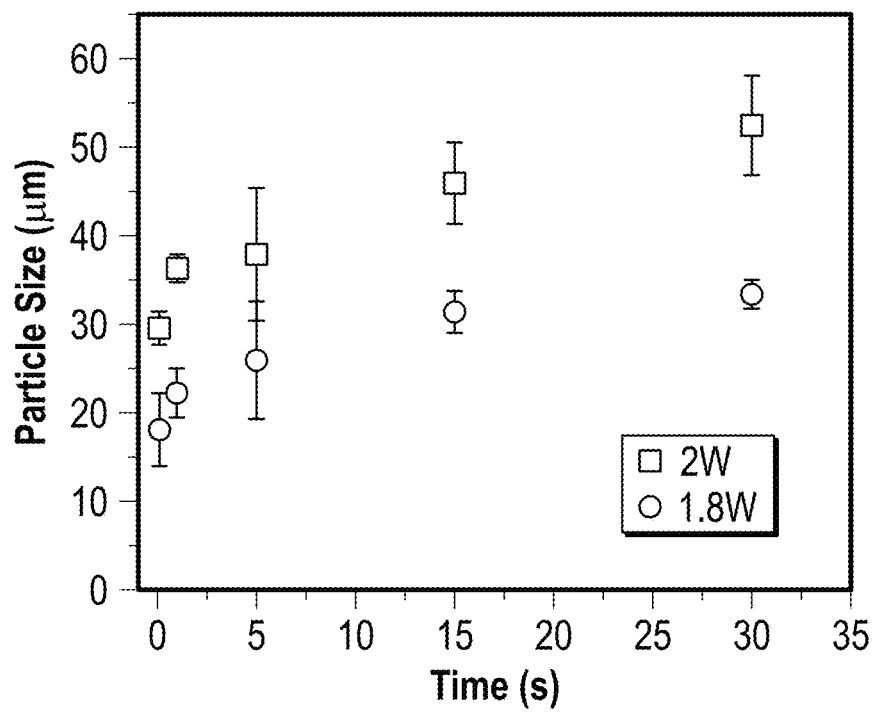
Figure 13G:
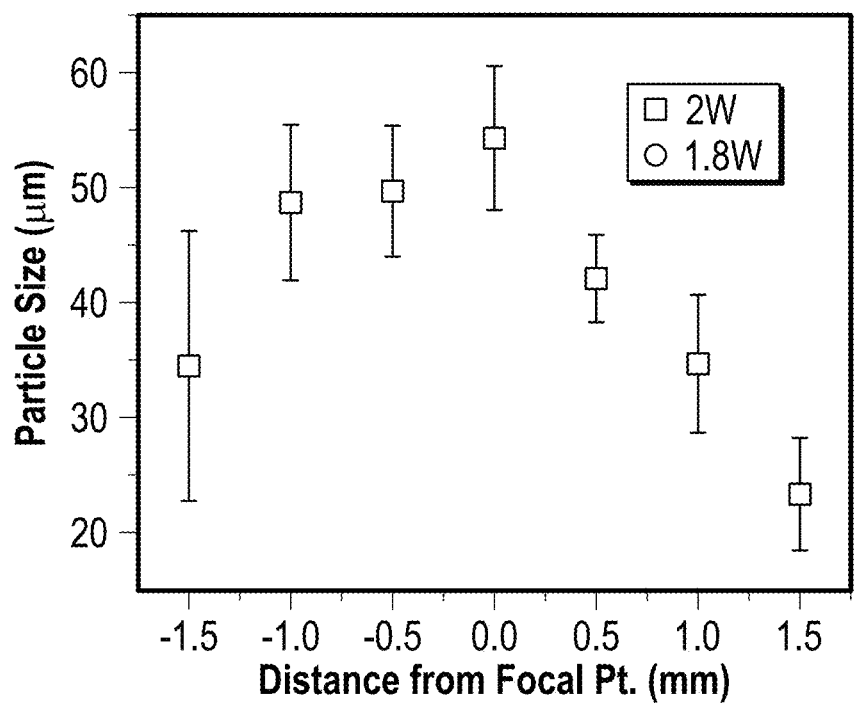
Figure 13H:
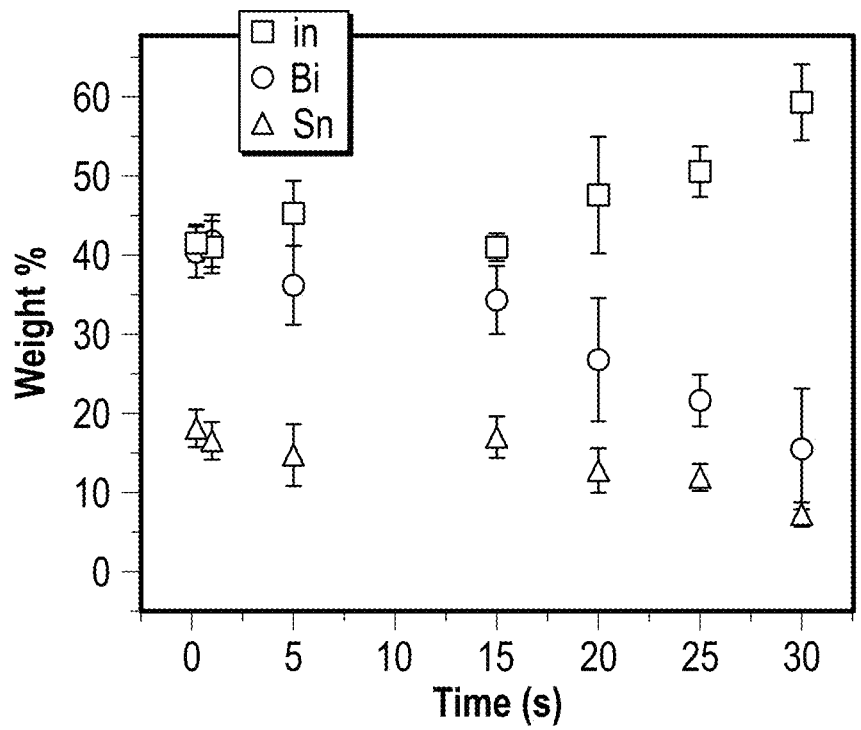
Figure 13I:
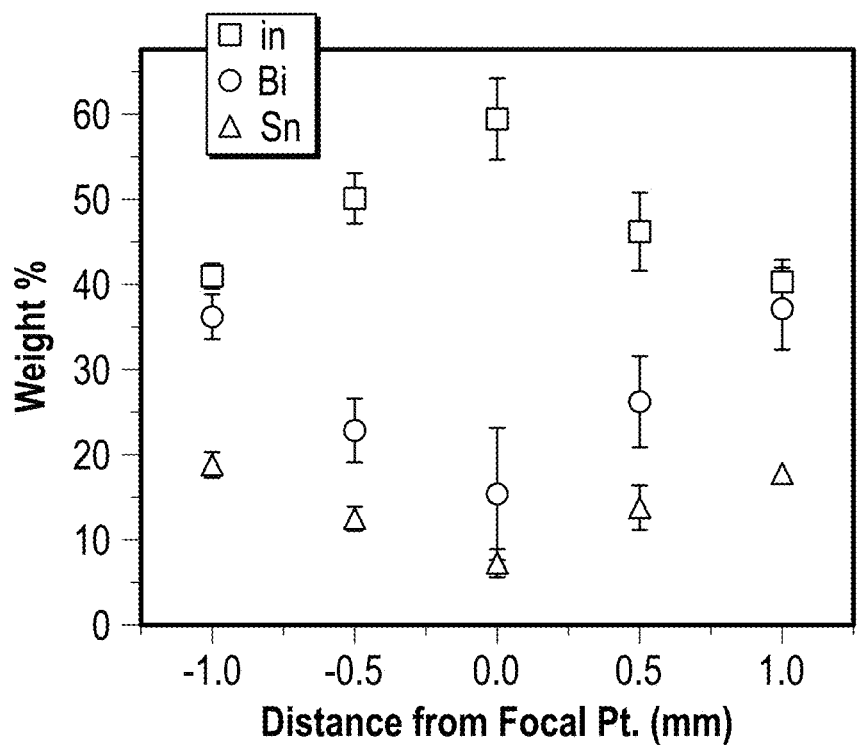
Figure 13J:
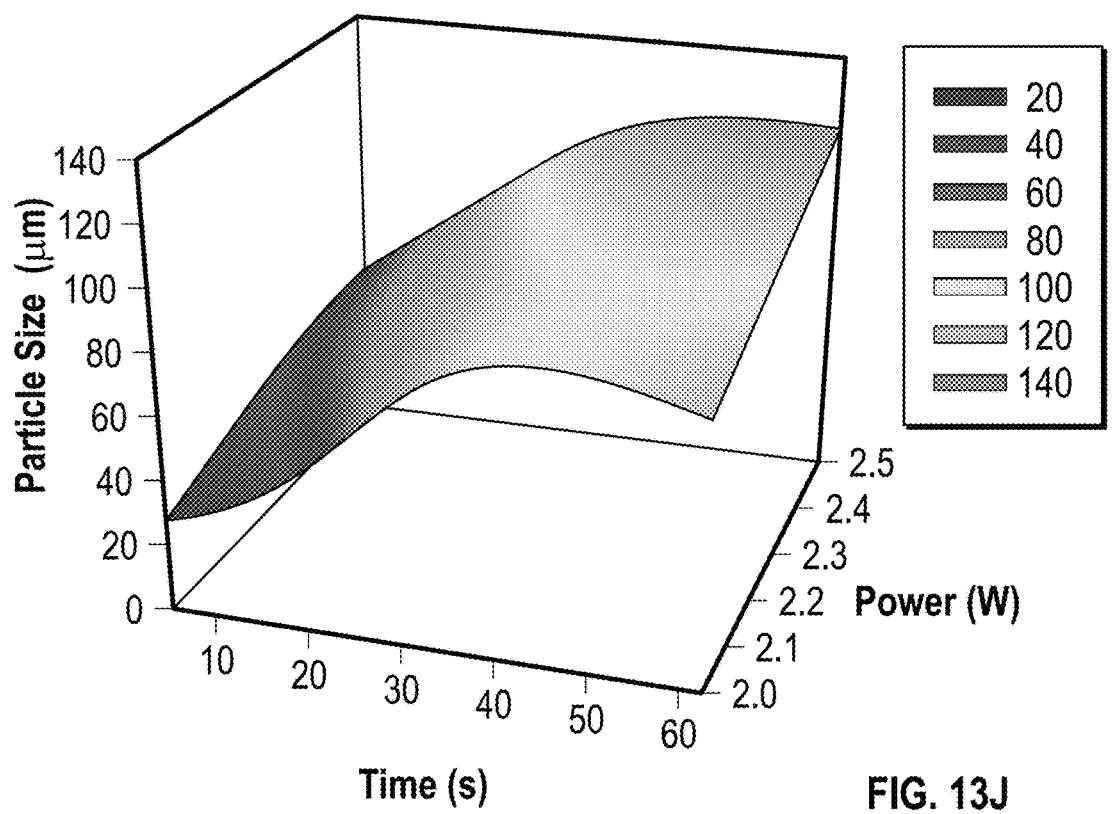
Figure 13K:
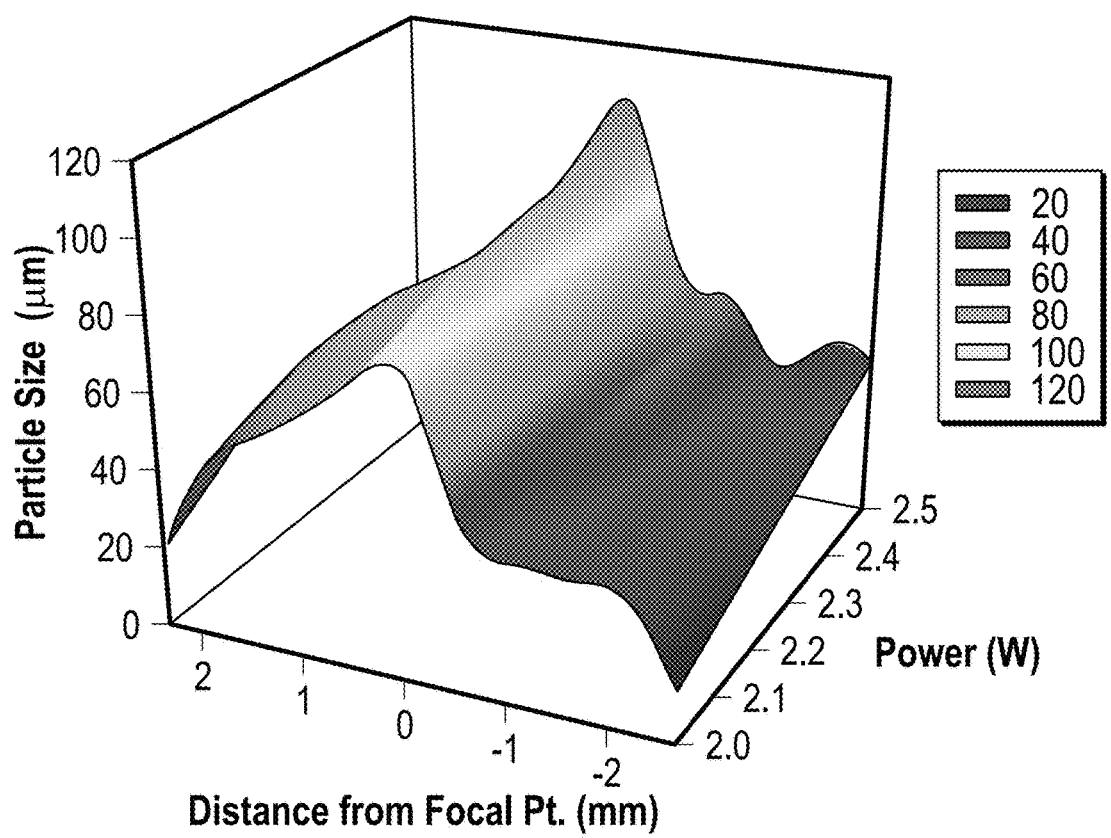

FIGS. 13A-13K illustrate a proposed mechanism of metastable to metastable phase transition through photon beam supply. FIG. 13A is a schematic of intraparticle reaction. FIG. 13B is a schematic of interparticle reaction. FIG. 13C is a schematic of a grown metastable particle with region 1347 being a surface region. FIG. 13D is a plot of an energy landscape of proposed metastable particle. FIG. 13E is a schematic of classical relaxation of a grown metastable particle with region 1349 being a surface region. FIG. 13F is a plot of particle size versus time at two different laser powers. FIG. 13G is a plot of particle size as a function of distance from a focal point. FIG. 13H is a plot of particle composition as a function of time. FIG. 13I is a plot of particle composition as a function of distance from a focal point. FIG. 13J is a 3D plot of particle size with respect to time and power. FIG. 13K is a 3D plot of particle size with respect to distance from a focal point and power.

Consider a mechanism at operation with respect to FIG. 13A, for example, with respect to a Field's particle that is a eutectic alloy of bismuth, indium, and tin. Photon energy (E=hv) supplied to the material excites the atoms within the system, creating a migration. Most polarizable element in the system, Bi will be the first one to respond to this excess energy. The pressure of these atoms moving towards the surface (Bi also has the lowest surface tension, so during flow will be the ones that move towards the surface) creates a surface area expansion. Expansion of material (change in pressure and volume) will create interstitial gaps on the surface oxide, which is predominantly formed by indium oxide, where indium has the lowest $E°$. Interstitial gaps are filled by bismuth atom that are constantly moving towards the surface as long as the energy is supplied to the system. As indium oxidizes more over time, enough room will be created for indium clusters to be created and finally nucleates and crystallizes. The force and expansion caused from indium oxide crystallization will then push the interstitial bismuth atoms out of the system.

Consider a second mechanism at operation. Where do the particles get the liquid material supply to create a particle 30-50× its size? See FIGS. 13B and 13C. Consider the effect of surface plasmon and how the electro-magnetic wave propagates through the surface until it finally meets a neighboring particle to which the point, where it touches, will create large plasmonic concentration. This large energy concentration will create stress just enough to break the shell and break through the interface for liquid to flow. The flow of liquid follows a Marangoni instability event where it will flow from a lower surface tension region (smaller particles) onto the particle that is currently being bombarded by photons, a main particle.

Consider relaxation with respect to FIGS. 13D and 13E. A particle that is formed is currently in a high-tension state as the expansivity of the oxide and the bulk is mismatched. This material is solidified and wants to relax; however, the oxide shell is stiff and is not allowing it to do so. The metastable state can be seen to relax after a couple months of being subject to focused ion beam (FIB) processing, referred to as FIBed, in which a focused ion beam breaks the closed nature of the oxide shell and allows for the material to relax in air. As it relaxes, the material follows creep behavior that is classical mechanics in nature.

Consider resulting grown particles. First, consider change in working distance. Change in working distance changes the energy density (laser focal point vs not in focal point). Energy per unit area is reduced if it is not focused (power and time is held constant). See FIG. 13G. The change can be seen in size and also the change in composition (almost symmetrical change in both around the focal point). See FIGS. 13G and 13I. Changing power and exposure time will also change the grown particle size and composition (bridge). FIG. 13K is a 3D plot that can show the projection of particle growth given different powers.

Second, consider change in time and power. Time and power can change the grown particles. Given more time, the particle will absorb more energy to move towards the other metastable state, increased power will also increase the energy given towards the particle. Energy is a unit of the multiplicative product of power and time, a direct proportionality. Growth trend shows that initial growth rate is higher than prolonged growth. See FIG. 13F. After 15 seconds, the growth plateau and change in composition starts to happen more drastically. Oxygen increases overtime (particle is oxidizing, indium), whilst at the same time bismuth is depleting (according to hypothesis). FIG. 13J is a 3D plot that shows a projection of how particle growth changes given different times and powers.

FIGS. 14A-14G show elemental maps of particles at different states. FIG. 14A shows a solid Field's metal particle. FIG. 14B shows a FIB-cut solid particle. FIG. 14C shows a laser-grown metastable particle. FIG. 14D shows a FIB-cut grown particle. FIG. 14 E shows a transmission electron microscopy (TEM) foil from the outer edge of the grown particle of FIG. 14D. FIG. 14F is an aged FIB-cut particle of 60 days. FIG. 14G is an outer edge of aged particle of FIG. 14F. Consider metastable relaxation with respect to the relaxation of a FIBed particle. Regular particles show phase separation between bismuth and tin (classical, falls under Cahn-Larche relation). See FIGS. 14A and 14B. Indium, having the lowest shear modulus (G), will be the element that first translates under shear stress. With respect to an energy landscape, these solid particles are already in the lower energy state and will not move anymore. Laser grown particle shows different behavior where the phase separation is between indium and tin. This behavior is dependent on the polarizability (a). Bismuth, having the smallest polarizability, will be the first one to migrate under supply of photon energy. See FIGS. 14C and 14D.

However, upon exposure to air, this particle does not stay in the same state. The particle is not completely a stable, ground-state solid and can still relax. Behavior can be seen where bismuth and tin phase separates overtime, according to classical mechanics. This follows classical mechanics because as material crystallizes, there is stress incorporated with it and they follow the same Cahn rule. See FIG. 14E.

Consider applications. FIGS. 15A-15F show complex patterning capabilities of 4D photolithography showing multiple patterns. FIGS. 15A-15B show a diamond shape with size gradient. FIG. 15C is a logo of Iowa State University. FIG. 15D is a model of a double c-ring made for cloaking. FIG. 15E is the text "Hello." FIG. 15F is a heat decrypted sample. Growth of particles and 3D motorized stage can be used to create 4D patterns, where sizes and compositions can be varied. See FIGS. 15A-15D. Distance between particles can be made as close as 200 microns. Laser beam area of effect can be about 100×100 microns. Complex patterns can be created in a dot matrix style template. See FIGS. 10A, 11A, 12A, and 12B. Written patterns can be decrypted by heating the sample. Heating the sample causes accelerated oxidation. See FIGS. 15E and 15F.

The following are examples of methods used with respect to generating example results discussed herein.

Undercooled particle synthesis: Field's metal (Bismuth, indium, tin alloy at eutectic composition (Bipin's=32.5:51.0:16.5 wt %), glacial acetic acid, diethylene glycol (reagent grade) and ethanol (200 proof) were purchased from Roto metals (Roto144F), Fisher Chemicals, VWR and Decon Labs, respectively. An approximate 30 g of Field's metal were placed in diethylene glycol solution (approximately 200 g) at 120° C. in a glass beaker of the soup maker (Cuisinart SBC-1000FR). After thermal equilibrium was reached in 5-7 min, glacial acetic acid was poured into the heated solution (1% or about 2 g), and then the solution was stirred for 5 min at about 16,800 rpm on a tilt (approximately 5-10°). After the shearing process was completed, solution was cooled down by stirring and pouring in ethanol. Excess acetic acid-diethylene glycol solution was filtered and washed out with ethanol by using VWR Buchner funnel coarse filter and then further filtered using ethyl acetate and VWR Buchner funnel fine filter. Particles were extracted from the fine filter and stored in ethyl acetate solution after cleaning.

4D Photolithography: Pieces of silicon wafer were prepared as the substrate of Field's metal particles (10 mm×10 mm×1 mm approx.). Suspended undercooled particles were then deposited onto the substrate by using a glass pipette until the whole surface was covered. Particles were then dried in air for about 30 seconds. The substrate was placed on a standard SEM stub mount (Ted Pella Inc.) to be held in place on the laser stage. Three-dimensional stage was manufactured by Thorlabs Inc. and controlled by using Kinesis software provided by Thorlabs. After mounting the sample, the working distance was adjusted by changing the z-axis of the stage to match the focal length of the lens, which was 12 mm. A small 3.5 W laser diode provided by DTR's laser shop was used and mounted on the stage. A plano-convex lens from Edmunds optics with effective focal length of 12.00 mm was mounted on the setup under the laser diode for focusing. The laser diode was connected onto a variable DC adaptor where the voltage and current were controlled and measured. The desired power was then set up on the adaptor and the power was output to the laser. Patterning was performed by moving the x-y axis of the stage according to the desired design.

Scanning Electron Microscopy (SEM) and Energy Dispersive Spectroscopy: FEI Inspect F50 with EDS attachment was used for micro graphical analysis of the grown particles. Prepared SEM samples were placed onto the sample mount and loaded into the SEM chamber. The SEM was operated on high vacuum and high voltage of 10 kV for imaging and 25 kV for spectroscopy. A loaded sample was then focused at a working distance of 10 mm by adjusting the objective lens strength or changing the working distance. Brightness and contrast were adjusted as needed and micrographs were taken after slowing down the scanning speed for better quality. For spectroscopy, the spot size and accelerating voltage was increased to get more signal. An area of interest was focused, and spectra and x-ray map were obtained by utilizing the AztecOne software for EDS. Both Everhart-Thorley secondary and backscatter electron detector was used to take micrographs. Elemental composition was determined using EDS with a silicon drift detector at an increased accelerating voltage of 25 kV for increased count rate. EDS map analysis was conducted with 512×512 pixels resolution, 3 frames, 500 μs dwell time setting using the AztecOne software on the same instrument.

Focused Ion Beam (FIB) Machining and Preparation: The sample was prepared using a FEI Helios NanoLab G3, on a 38-degree back-tilt holder with the sample attached to the back-tilted portion of the stub. Initial machining was carried out at 30 kV on the ion column, with a 5 kV finishing step. The machining was performed at zero-tilt, so that the machined surface was 52-degrees with respect to the electron column axis. The sample was then rotated to face the EDS take-off tube and was tilted 52-degrees so that an EDS map could be taken with minimal interference and without exposing the sample to atmosphere. Spectra were taken at 25 kV to ensure sufficient signal for the species of interest.

Consider laser-material interaction.

$$E = h\nu \quad (4)$$

$$\lambda = \frac{h}{mv} \quad (5)$$

Laser creates concentration of photon energy in the near UV spectral range that is too small to interact with surrounding gas. This results in laser beam hitting a sample without experiencing any gas absorption. Upon hitting a sample, one of the main interactions that will happen is excitation of electron from ground state to the excited state by photon absorption. For a laser light to induce any effect on a material, it has to be absorbed. Equation 4 describes how photon energy can be quantized based on its frequency (v) and Planck's constant (h). The laser used in this experiment was a blue laser with wavelength λ=450 nm, which results in E=2.7 eV. The oxide layer of the undercooled metal particles all have band gaps beyond 2.7 eV, which results in all of them being transparent to the laser light, where the laser goes through the oxide and interacts with the liquid metal inside directly. Electrons, as is known from DeBroglie's postulation, can have a duality behavior, where it has a wave-nature (DeBroglie's equation is displayed in equation 5). Since a photon also behaves like a wave, it can create a constructive interference with electrons, which will in turn excite these electrons to a higher energy level (higher orbital).

$$\frac{N_{i,FD}}{g_i} = \frac{1}{e^{(\alpha' + \beta' \varepsilon_0)} + 1} \quad (6)$$

$$\frac{N_{i,BE}}{g_i} = \frac{1}{e^{(\alpha' + \beta' \varepsilon_0)} - 1} \quad (7)$$

In statistical mechanics, electrons behave like a fermion and follows the Fermi-Dirac (FD) statistics (equation 6). FD statistic coincides with the Pauli exclusion principle rule, where no more than two fermions can occupy the same quantum state because they have half integer spin (+½ and −½). Photons on the other hand, behave like bosons and follow the Bose-Einstein (BE) statistics (equation 7), where there is no limit of quantity that can occupy a single energy state.

Understanding these fundamental interactions allows one to hypothesize that supplying photon energy to an alloy that includes an element in the Lanthanide group, i.e. Bismuth (has a large valency of electrons and many oxidation states) and other, more stable elements will let one selectively trigger the most excitable element in the system. This electron excitation will in turn induce convection towards the interface where the photon is most concentrated. This creates a movement inside of the system, specifically Bismuth towards the surface of the particle.

Consider Marangoni Instability $$\gamma = \frac{A_H}{24\pi D_0^2} \quad (8)$$

$$A_H = \frac{3}{4} k_B T \left( \frac{\varepsilon_1 - \varepsilon_3}{\varepsilon_1 + \varepsilon_3} \right) \left( \frac{\varepsilon_2 - \varepsilon_3}{\varepsilon_2 + \varepsilon_3} \right) + \frac{3h}{4\pi} \int_{v_1}^{\infty} \left( \frac{(\varepsilon_1(iv) - \varepsilon_2(iv))}{\varepsilon_1(iv) + \varepsilon_2(iv)} \right) \left( \frac{(\varepsilon_2(iv) - \varepsilon_3(iv))}{\varepsilon_2(iv) + \varepsilon_3(iv)} \right) \quad (9)$$

$$\varepsilon_\gamma = n^2 - \kappa^2 \quad (10)$$

Equation 8 shows a direct relation between surface tension (γ) and Hamaker constant ($A_H$) where $D_0$ is the distance between two molecules. Equation 9 breaks apart the term $A_H$, showing its dependency on static permittivity (ε) and frequency (v) dependent relative permittivity. $k_B$ stands for Boltzmann's constant, T for temperature, h for Planck's constant, and i for imaginary. The subscripts 1 and 2 mark that the constant is for the interacting materials while the subscript 3 is for the medium. Relative permittivity ($\varepsilon_r$) is directly correlated to the refractive index (n) and extinction coefficient (κ) of a material as described in equation 10.

From equation 8, one can see that the Hamaker parameter is directly proportional to surface tension of a surface, and thus a large fluctuation in this value creates a large surface tension gradient, which will in turn instigate the Marangoni instability effect. When Marangoni instability is initiated, liquid will flow towards region with higher surface tension, which objectively is towards the laser interaction region. This phenomenon is explained by equation 9, which shows that the Hamaker constant is highly dependent on electromagnetic resonance (hv), and thus explains how supplying photon energy from laser onto a metastable liquid interface will induce Marangoni type instability. This allows estimation of Van-der-Waals interaction between macroscopic particles. The Hamaker constant, in Lifshitz theory looks at materials as a single continuum with averaged properties $$\gamma^s = \gamma \frac{d\varepsilon_p}{d\varepsilon_{tot}} + \Upsilon \frac{d\varepsilon_e}{d\varepsilon_{tot}}, \quad (8)$$

where $\gamma^s$ corresponds to the surface energy that is based on the plastic and elastic deformation.

Consider distinction between classical and quantum.

$$\frac{dc}{dt} = D\nabla^2 (c^3 - c - \gamma \nabla^2 c) = D\nabla^2 \mu \quad (9)$$

In classical mechanics, the behavior of this undercooled metal particles under mechanical shear stress can be explained by the Cahn-Hilliard equation. The evidence can be seen in figures that show how bismuth and tin phase separate in the core, whilst indium responds more to the mechanical shear stress and distributes everywhere across the system. The factor that affects material response to shear stress is its shear modulus, where indium has the lowest value amongst all three elements. The low shear modulus of indium readily responds to supplied shear stress to the system, showing an oil/lubricant like behavior across the system.

In contrast, in quantum mechanics, the behavior of undercooled metal particles under supplied photon energy is based on the redox potential of this material, in which bismuth has the lowest value. A similar effect happens to the material when photon energy is supplied to the system, bismuth which have the lowest redox potential will readily respond to the photon and induce the most electron excitation in the system, whilst indium and tin stay and phase separate in the system.

Figure 16A:
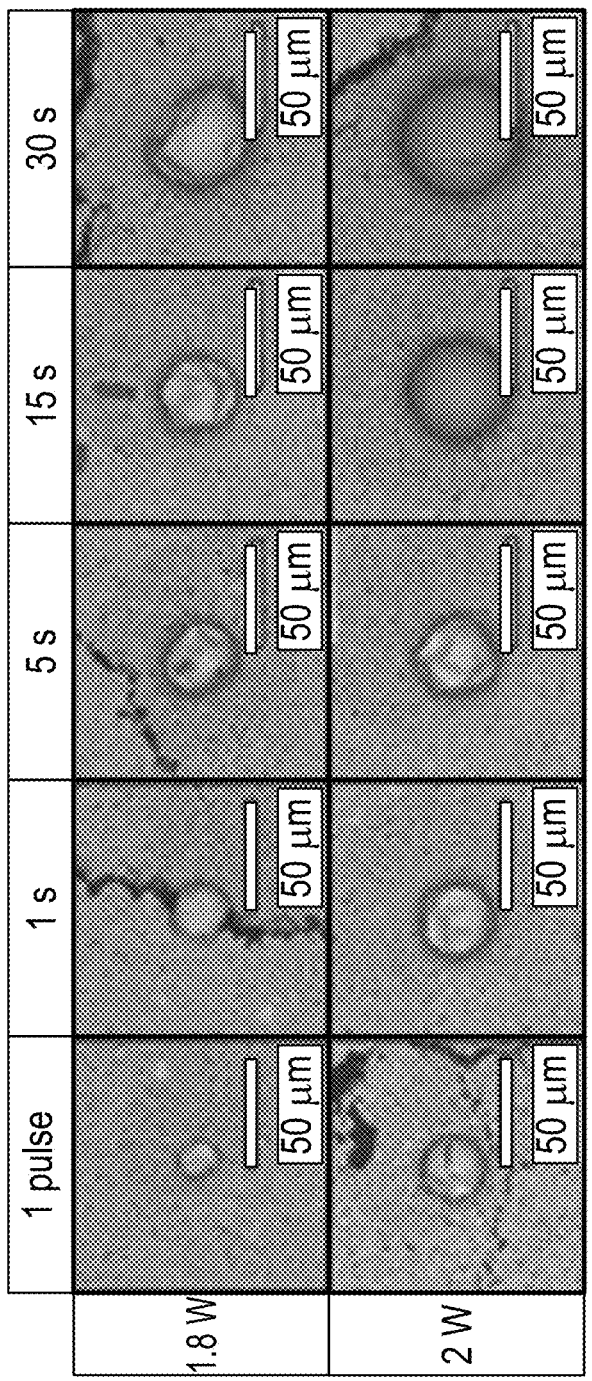
FIGS. 16A-16B show particle growth without lens aberration, in accordance with various embodiments.
Figure 16B:
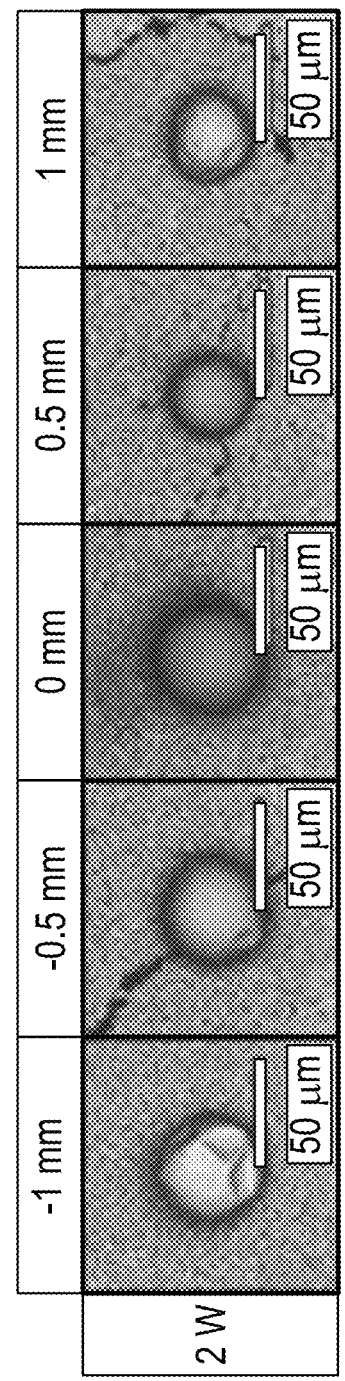

FIGS. 16A-16B show particle growth without lens aberration. FIG. 16A shows the effect of time and power for a single pulse, irradiation of one second, irradiation of five seconds, irradiation of fifteen seconds, and irradiation of thirty seconds for both 1.8 W and 2 W of power. FIG. 16B shows the effect of different working distances of −1 mm, −0.5 mm, 0 mm, 0.5 mm, and 1 mm for 2 W of power.

Figure 17A:
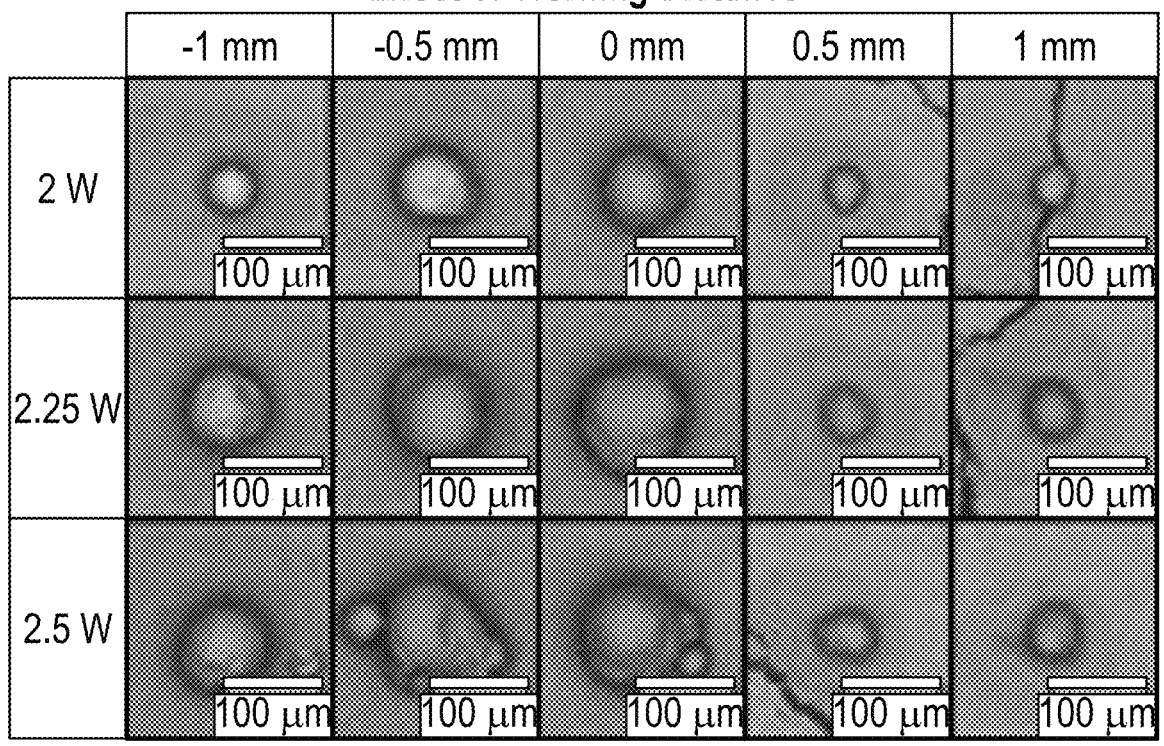
FIGS. 17A-17D show particle growth with lens aberration, in accordance with various embodiments.
Figure 17B:
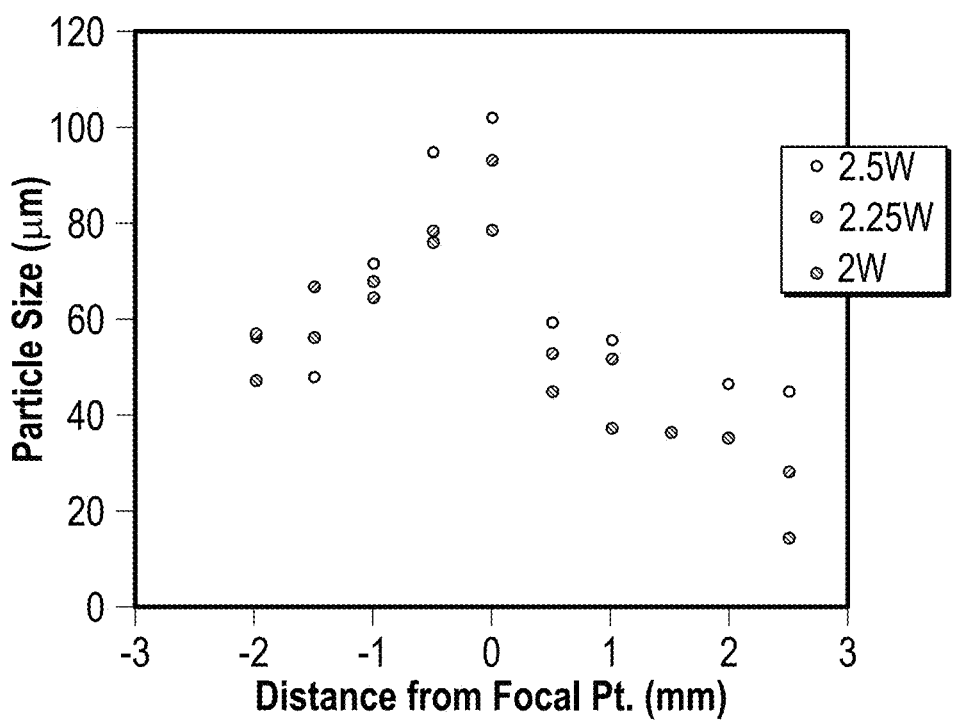
Figure 17C:
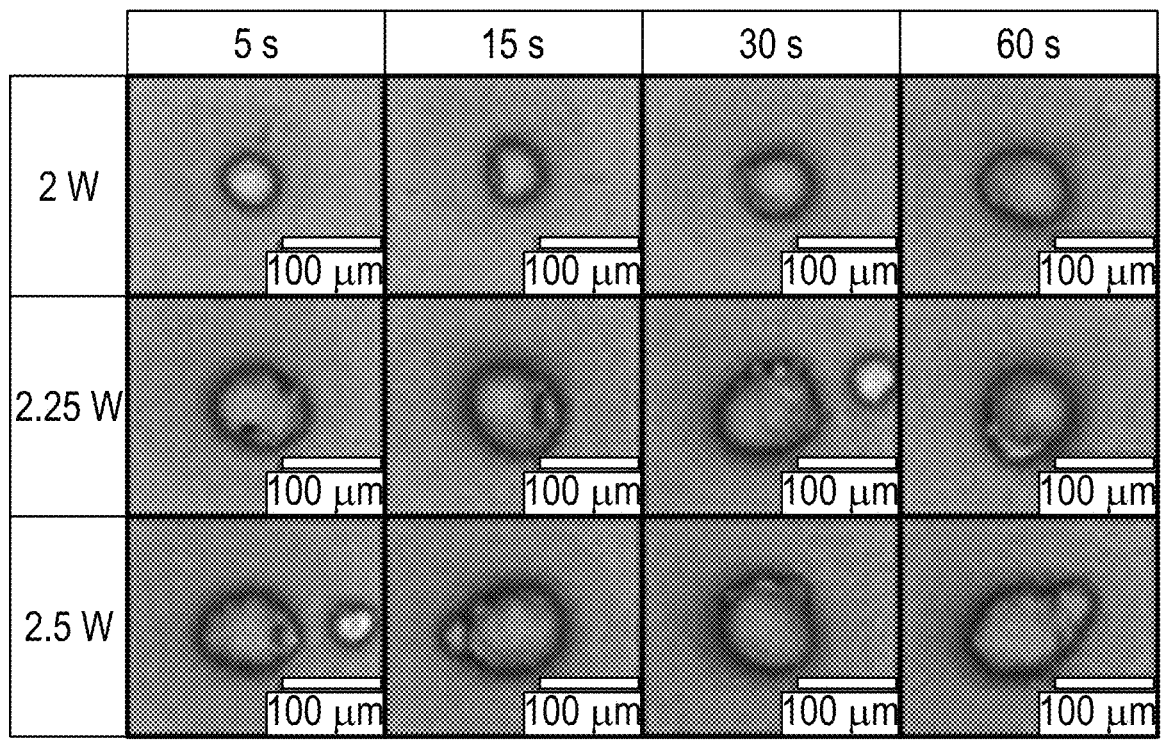
Figure 17D:
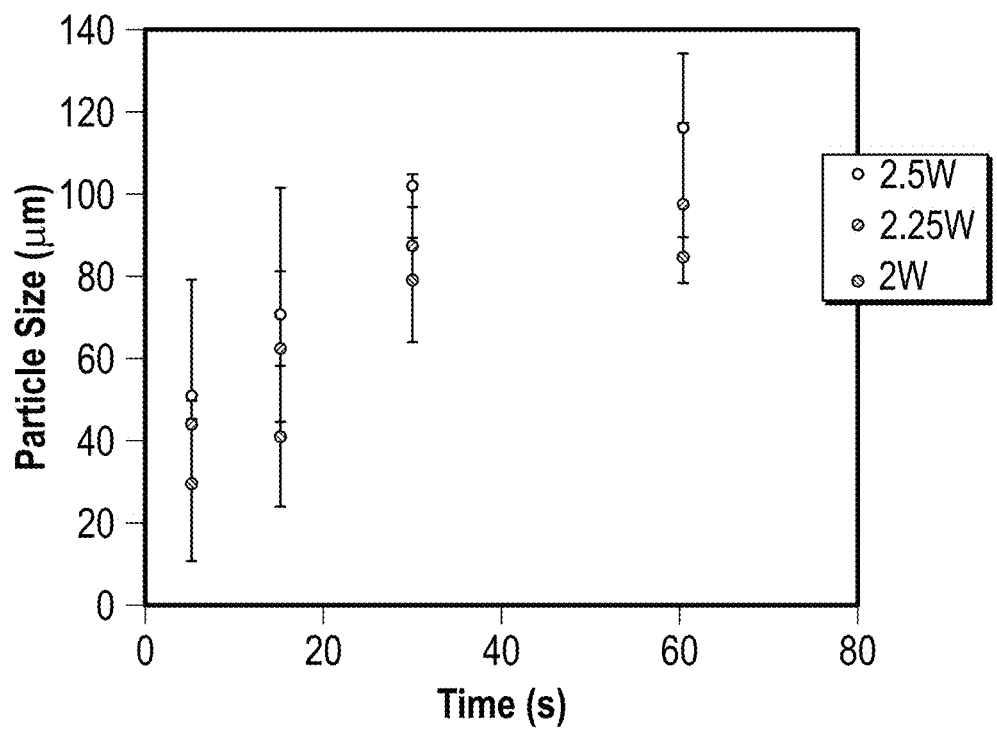

FIGS. 17A-17D show particle growth with lens aberration. FIG. 17A shows the effect of different working distances. The working distances shown are working distances of −1 mm, −0.5 mm, 0 mm, 0.5 mm, and 1 mm for each of laser powers of 2 W, 2.25 W, and 2.5 W. FIG. 17B shows particle size as a function of distance from a focal point. FIG. 17C shows the effect of time and power for irradiation of five seconds, irradiation of fifteen seconds, irradiation of thirty seconds, and irradiation of sixty seconds for each of laser powers of 2 W, 2.25 W, and 2.5 W. FIG. 17D shows particle size as a function of time.

Figure 18A:
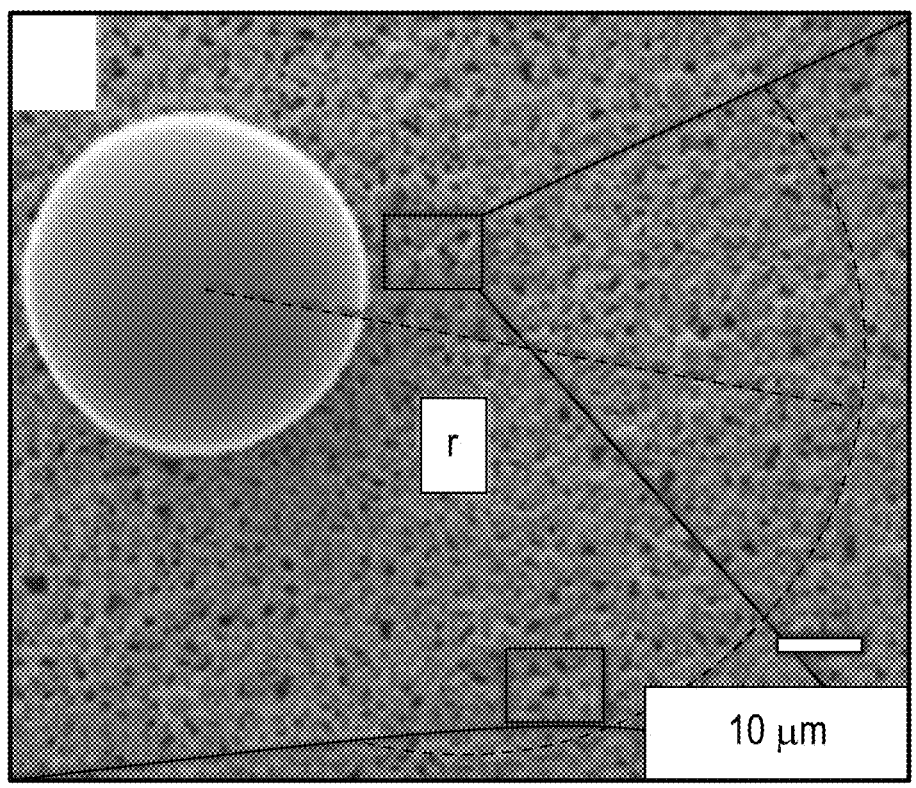
FIGS. 18A-18D illustrate aspects of point contacts between particles flowing towards a grown particle, in accordance with various embodiments.
Figure 18B:
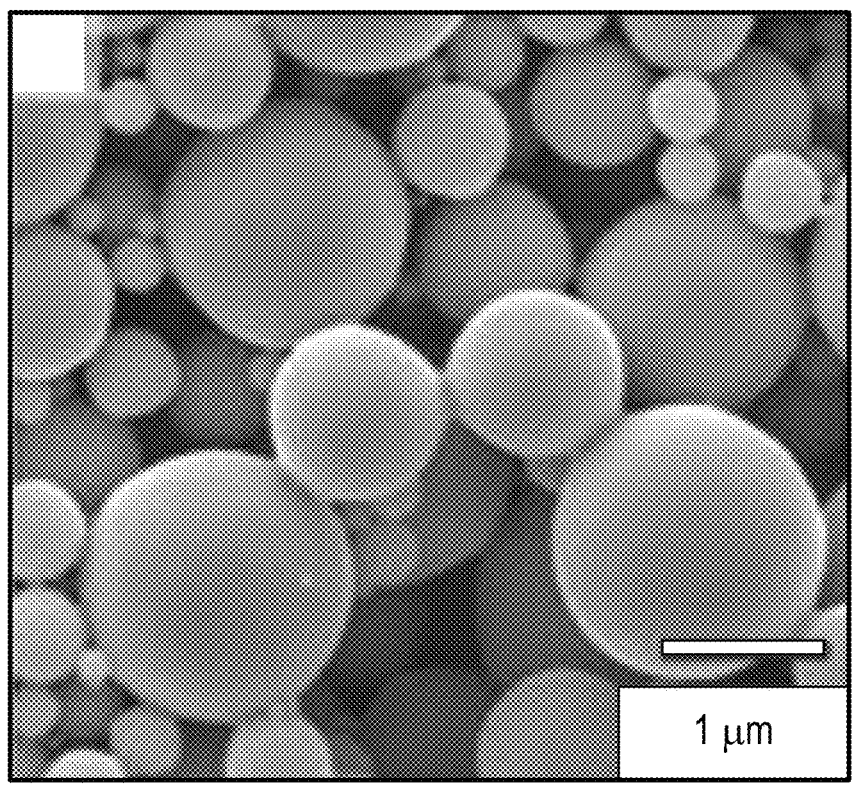
Figure 18C:
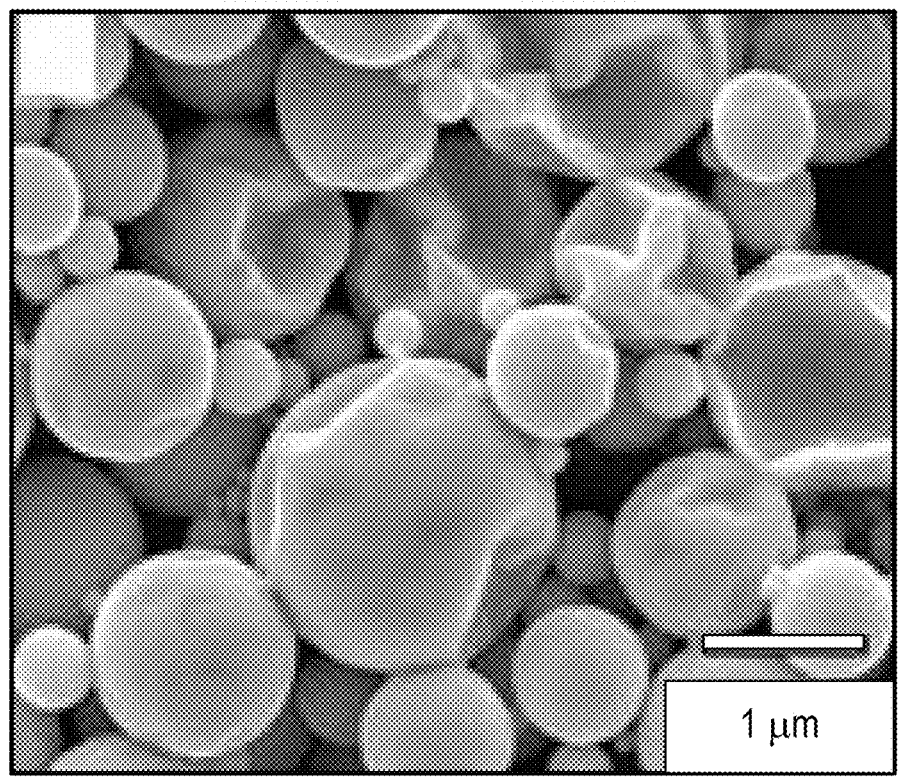
Figure 18D:
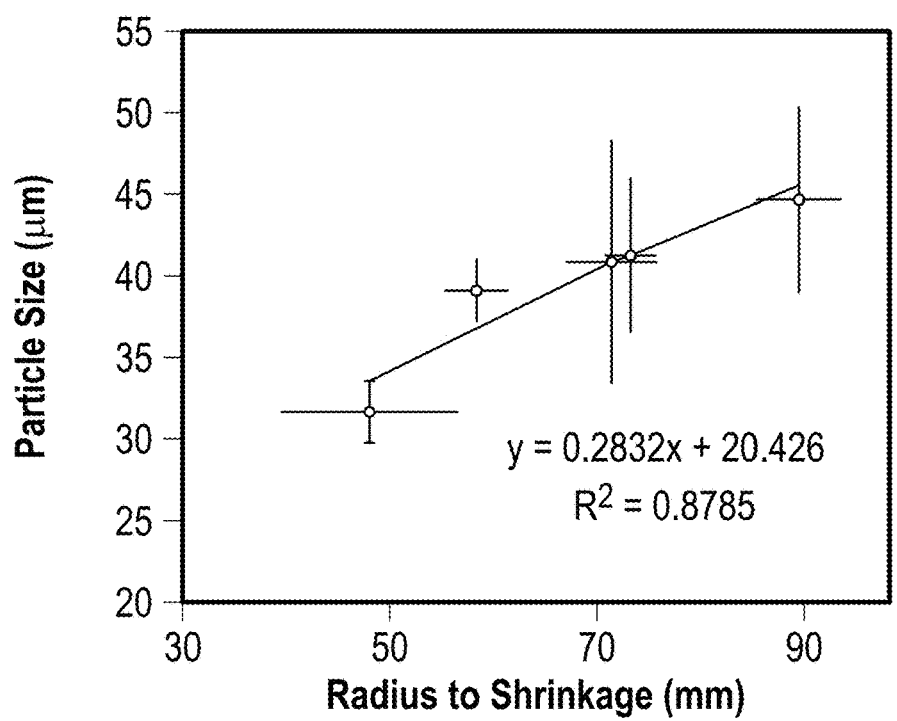

FIGS. 18A-18B illustrate aspects of point contacts between particles flowing towards a grown particle. FIG. 18A is a micrograph showing radial area of effect from laser exposure. FIG. 18B is a micrograph showing joining between particles. FIG. 18C is a micrograph showing shrinkage of particles at the edge of the radius of FIG. 18A. Figure D is a plot showing a particle size to shrinkage radius relationship.

Figure 19A:
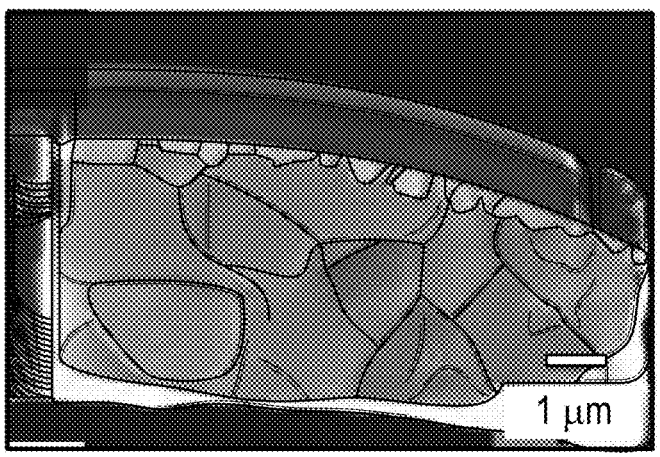
FIGS. 19A-19D illustrate morphology changes as samples is thinned for transmission electron microscopy, in accordance with various embodiments.
Figure 19B:
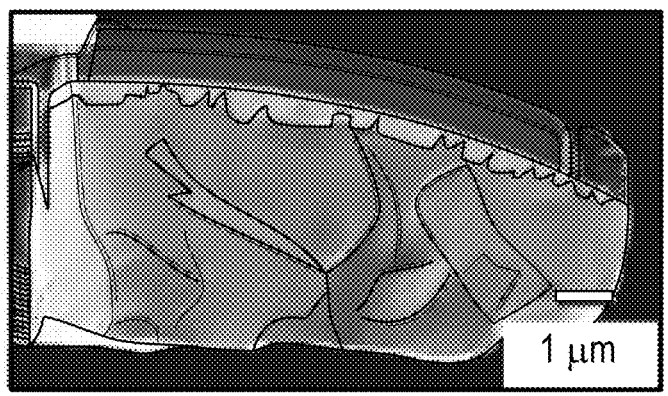
Figure 19C:
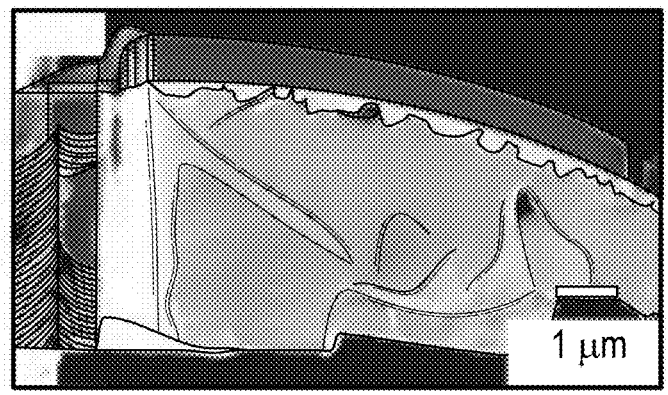
Figure 19D:
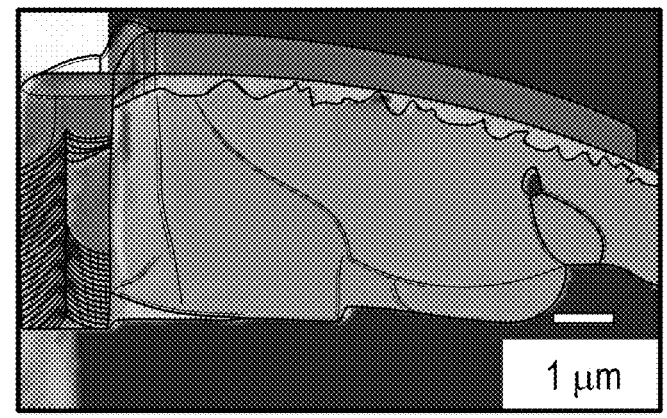

FIGS. 19A-19D show morphology changes as a sample is thinned for TEM. FIG. 19A shows a 1 µm film thickness. FIG. 19B shows a 500 nm film thickness. FIG. 19C shows a 100 nm film thickness. FIG. 19D shows a 50 nm film thickness.

Figure 20A:
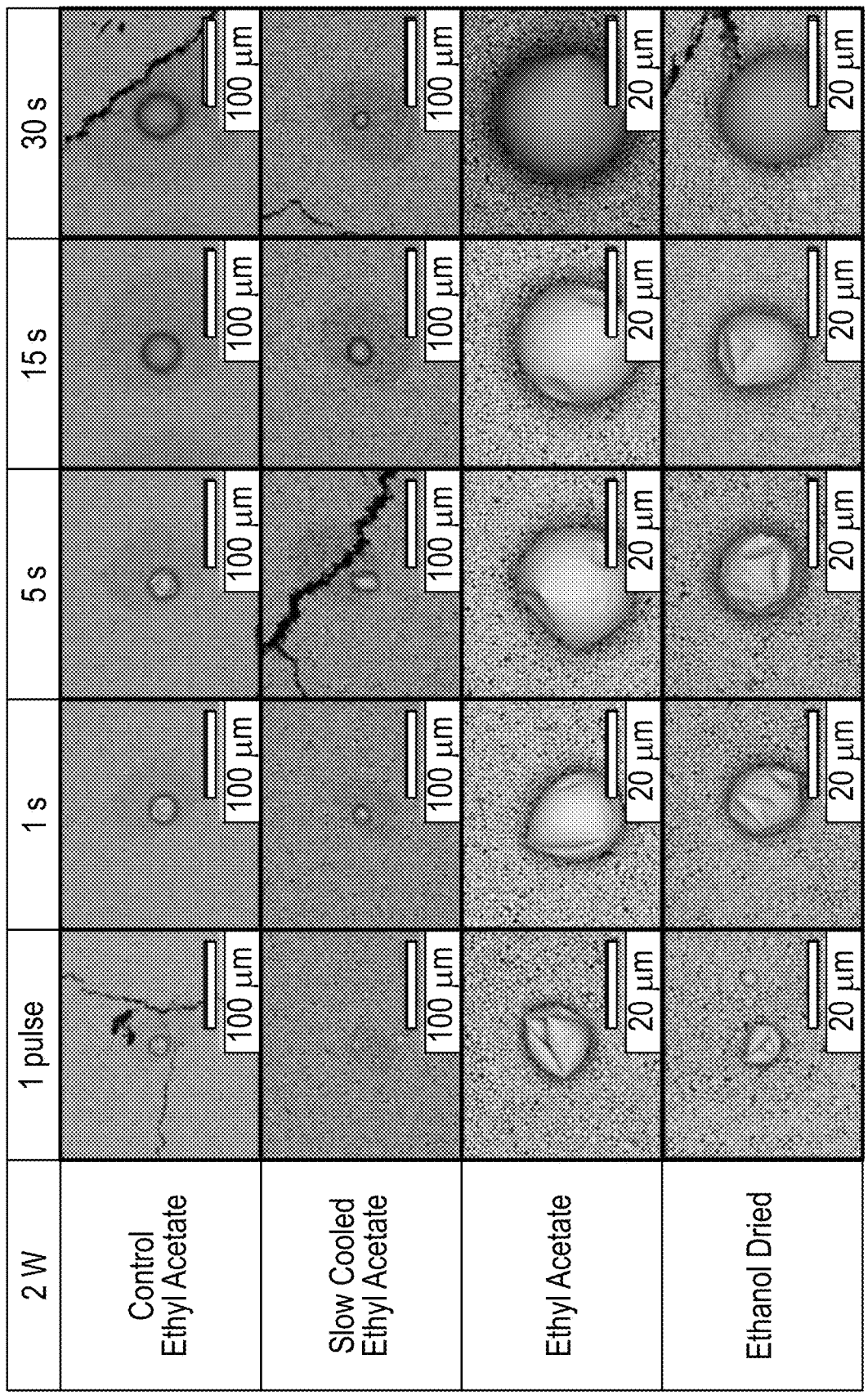
FIGS. 20A-20C illustrate particle growth rate for size control, in accordance with various embodiments.
Figure 20B:
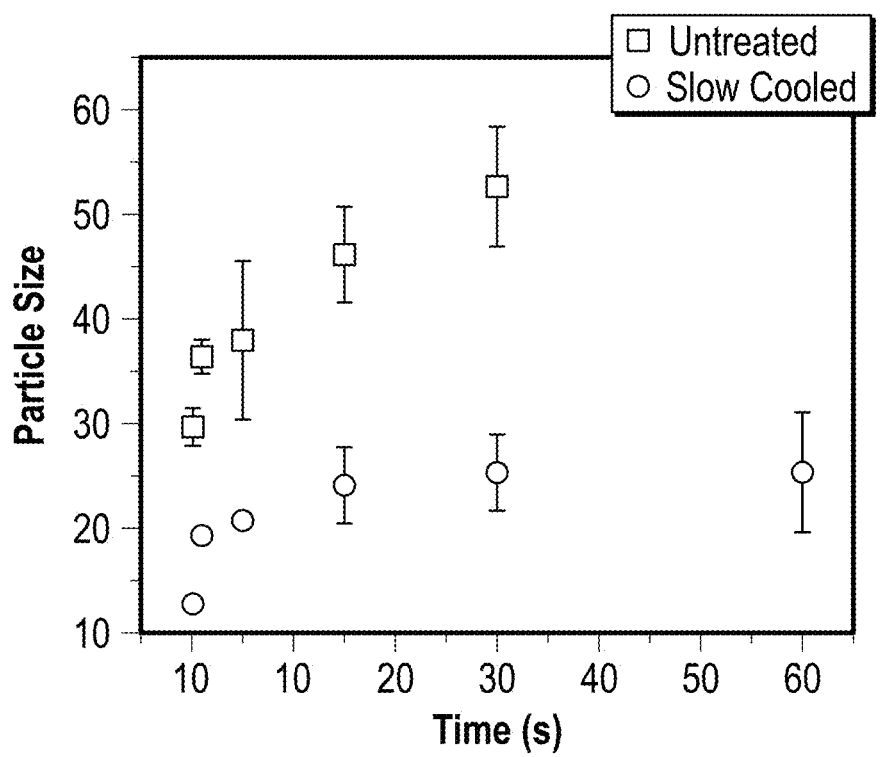
Figure 20C:
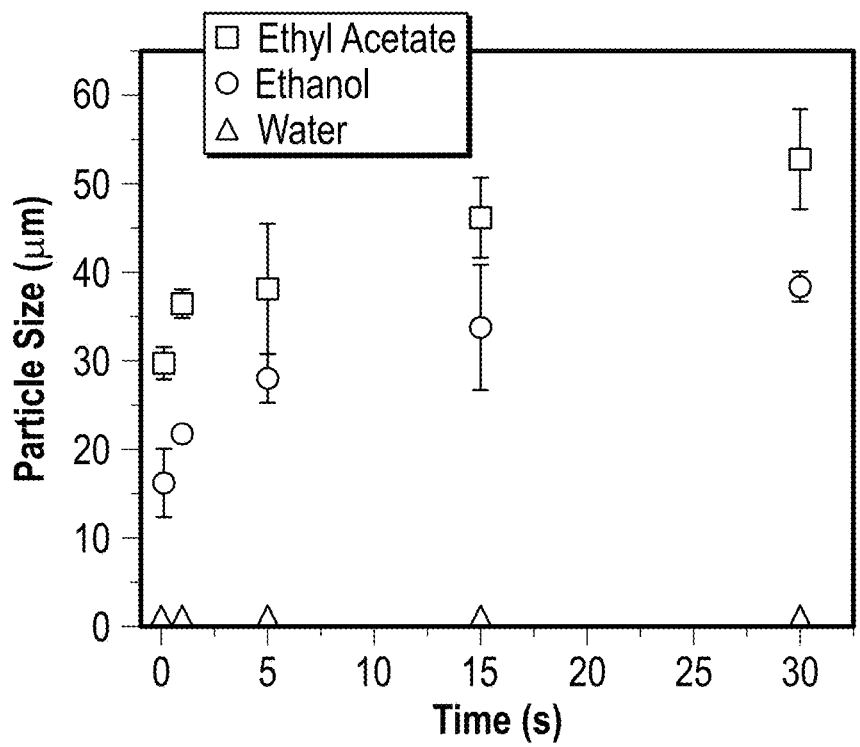

For size control, particle growth rate can be controlled through either slow cooling the particles or changing interparticle distance through the use of capillary forces from the solvent used to dry the particle bed. FIGS. 20A-20C illustrate particle growth rate for size control. FIG. 20A illustrates a single pulse, irradiation of one second, irradiation of five seconds, irradiation of fifteen seconds, and irradiation of thirty seconds for a laser power of 2 W for each of a controlled ethyl acetate solvent, a slow cooled ethyl acetate solvent, an ethyl acetate solvent, and a dried ethanol solvent. FIG. 20B is a plot of particle size as a function of time for an untreated particles and slow cooled particles. FIG. 20C is a plot of particle size as a function of time for an ethyl acetate solvent, an ethanol solvent, and a water solvent.

Figure 21:
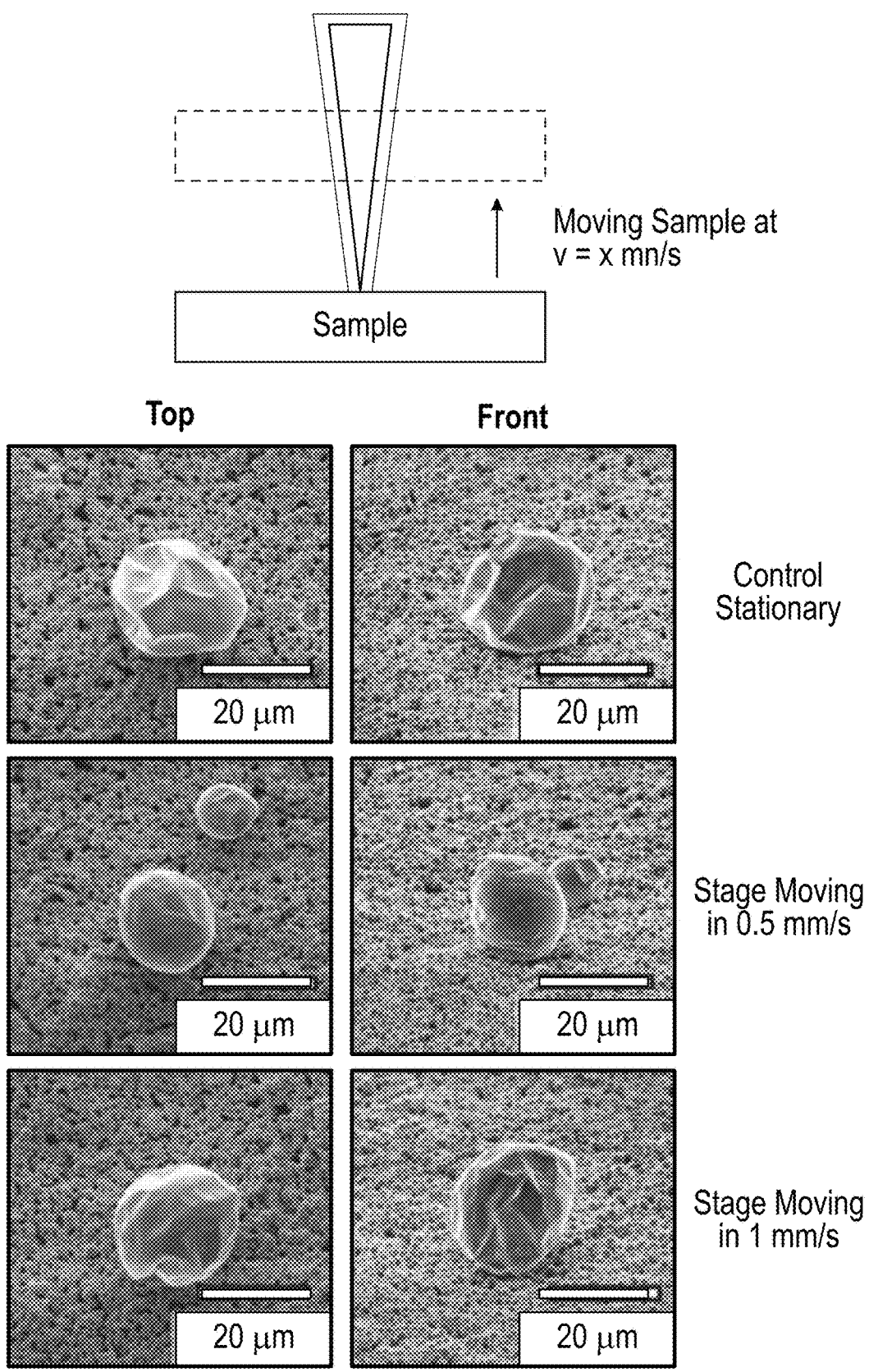
FIG. 21 shows different particle shapes at a stationary control and at different sample moving speeds, in accordance with various embodiments.

Shape control can be realized by moving the sample in the direction of the laser source. FIG. 21 shows different particle shapes of a moving sample at a velocity of v=x mm/sec in the direction of the beam from a laser source. The sample is moved by a moving stage during irradiation. A top view and a front view of a particle are shown for a control stationary, which is x=0 mm/s. A top view and a front view of a particle are shown for a stage moving at x=0.5 mm/s. A top view and a front view of a particle are shown for a stage moving at x=1 mm/s. Alternatively, the laser source can be moved towards the sample.

Figure 22:
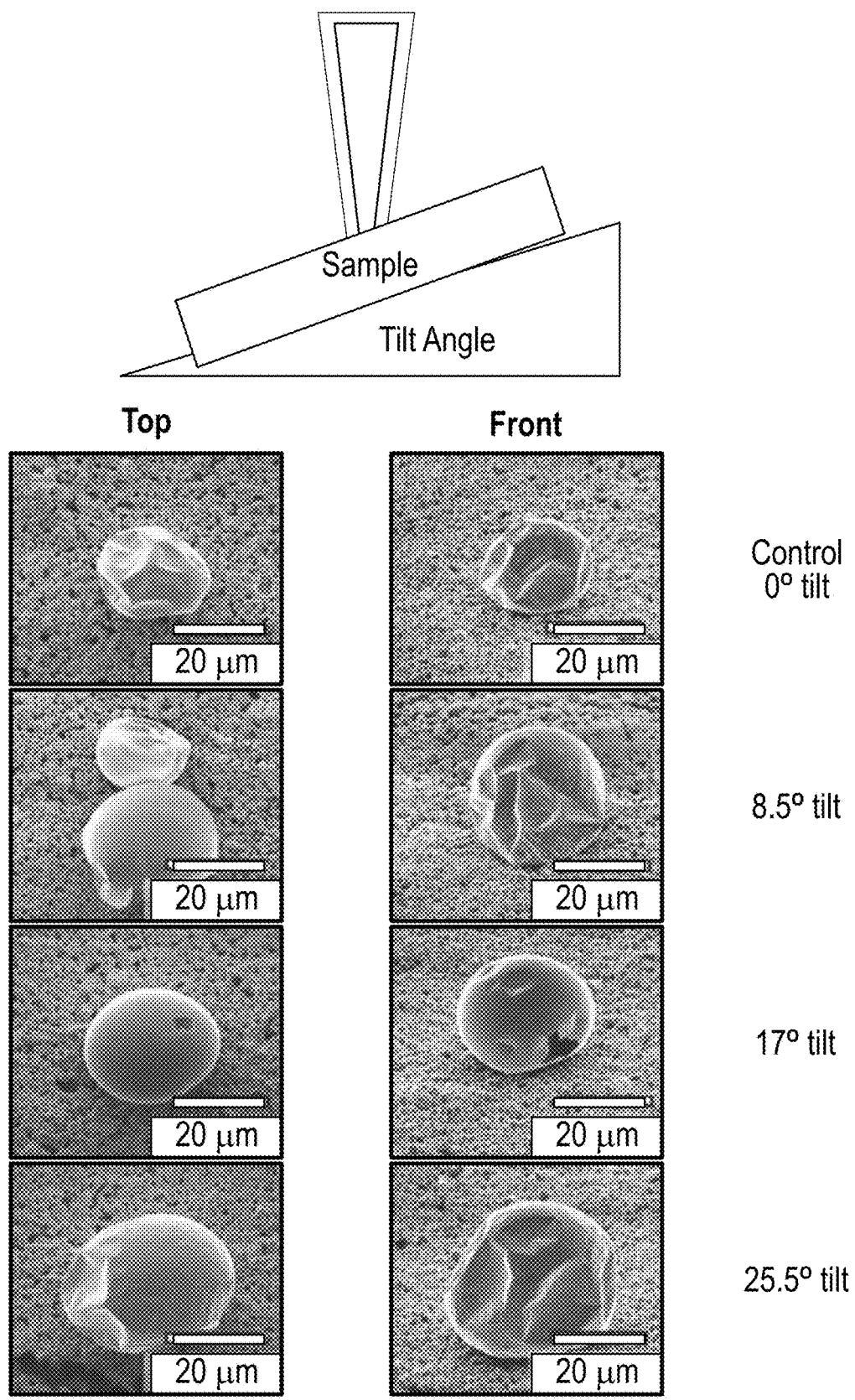
FIG. 22 showing different shapes at different tilt angles, in accordance with various embodiments.

Shape control can be realized by tilting the sample with respect to the laser beam. FIG. 22 shows different shapes at different tilt angles. A top view and a front view of a particle are shown for a control tilt of 0° tilt during irradiation. A top view and a front view of a particle are shown for 8.5° tilt during irradiation. A top view and a front view of a particle are shown for 17° tilt during irradiation. A top view and a front view of a particle are shown for 25.5° tilt during irradiation.

Consider control of the 4D lithography using capillary bridges or thermodynamic state of the metal. FIG. 23A shows images of a solid Field's metal (FM) on a 100 µm scale and on a 5 µm scale. FIG. 23B shows images of a liquid EGaIn on a 20 µm scale and on a 5 µm scale. FIG. 23C shows images of a water dried FM on a 20 µm scale and on a 20 µm scale. When a polar liquid is trapped between the particles, the particle growth is significantly retarded or completely stopped such as by water. With respect to these images, solid metal particles do not grow into 4D prints and neither do room temperature liquid metals.

Particle growth rate can be controlled by drying the undercooled particles from different solvents to create capillary bridges of different dimensions (drying time) or polarity (solvent type). This quenches the propagation of a plasmonic or acoustic wave across the particle boundary hence no coalescence and growth. With expansion of the particles, there is likely generation of a surface acoustic wave that could abet shell cleavage and coalescence. A surface propagating acoustic (Rayleigh) wave can be used to promote particle cleavage and coalescence.

Figure 24:
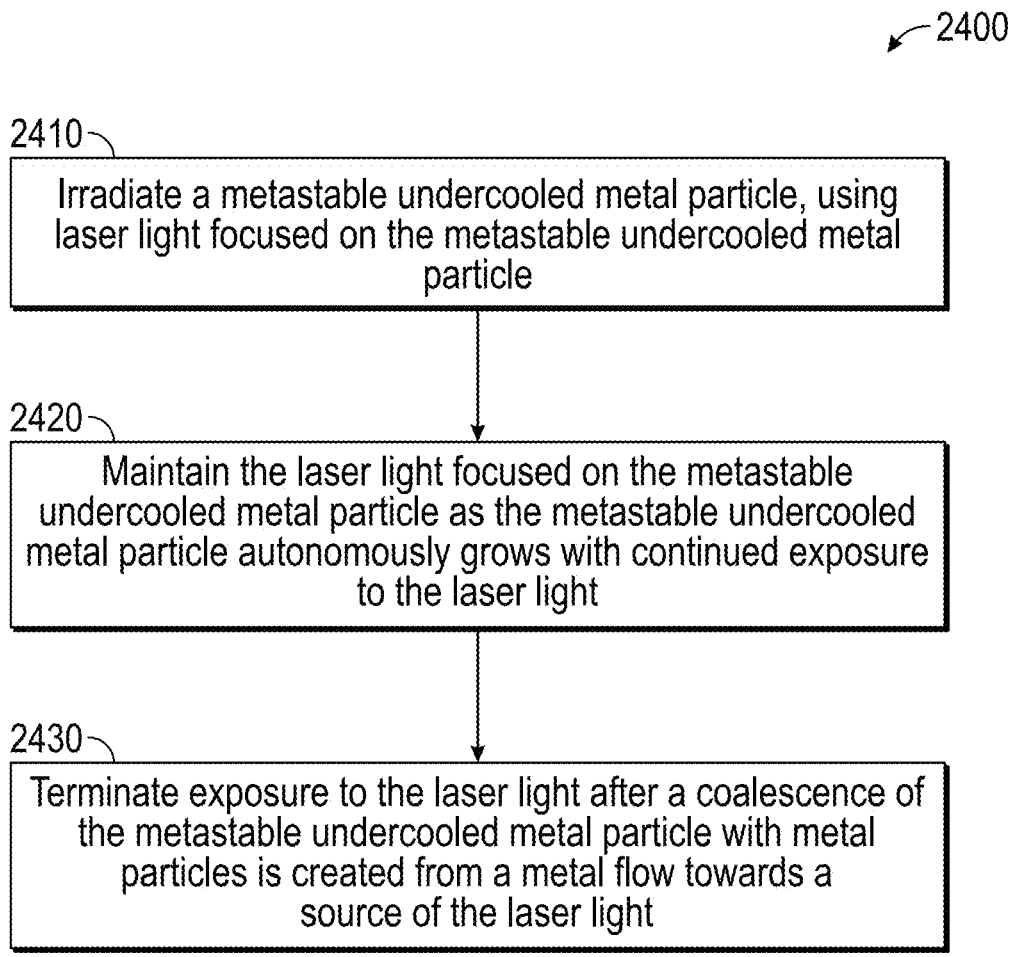
FIG. 24 is a flow diagram of features of an example method of mask-free photolithography, in accordance with various embodiments.

FIG. 24 is a flow diagram of features of an embodiment of an example method 2400 of mask-free photolithography. At 2410, a metastable undercooled metal particle is irradiated using laser light focused on the metastable undercooled metal particle. The focused laser light can have a center of exposure with respect to the metastable undercooled metal particle and with respect to a structure on which the metastable undercooled metal particle is disposed. A number of different types of sources of laser light can be used. The laser light can originate from a laser pointer. The laser light can originate from a laser diode. The focused laser light can be provided using a lens directing the laser light to the metastable undercooled metal particle.

At 2420, the laser light focused on the metastable undercooled metal particle is maintained as the metastable undercooled metal particle autonomously grows with continued exposure to the laser light. At 2430, exposure to the laser light is terminated after a coalescence of the metastable undercooled metal particle with metal particles is created from a metal flow towards a source of the laser light. The coalescence results in a large particle, in the center of exposure, that is larger than the metastable undercooled metal particle at a start of the irradiation.

Variations of method 2400 or methods similar to method 2400 can include a number of different embodiments that may be combined depending on the application of such methods and/or the architecture of systems in which such methods are implemented. Such methods can include directing the laser light to the metastable undercooled metal particle using a lens including positioning the metastable undercooled metal particle at a working distance from the lens to the metastable undercooled metal particle, with the working distance equal to a focal length of the lens. The working distance can be larger or smaller that the focal length of the length, where such working distances can be used to control photon flux or create hysteresis in the beam from the laser.

The positioning at the working distance can include positioning with the laser light impinging on the metastable undercooled metal particle in a direction from the lens that is perpendicular to the structure at a point where the metastable undercooled metal particle is disposed on the structure. Variations can include directing the laser light to control an incident angle to the metastable undercooled metal particle to generate gravity perturbed builds providing asymmetric shapes. Directing the laser light can include shifting an incident angle of the laser light to the metastable undercooled metal particle to affect the shape of the particle/build.

Variations of method 2400 or methods similar to method 2400 can include controlling a size of the large particle being grown by using one or more of power associated with the laser light, exposure time to the laser light, and working distance. The working distance can vary and can be decoupled with respect to the focal point of the lens. Irradiating the metastable undercooled metal particle can include using laser light of different frequencies, wavelengths, or powers to control the metal flow. Multiple sources for the laser light can be used to irradiate the metastable undercooled metal particle.

Variations of method 2400 or methods similar to method 2400 can include forming a pattern by generating a number of large particles from individual metastable undercooled metal particles. The pattern of large particles can have a gradient in size of the large particles in the pattern. One or more large particles can be removed from the pattern by exposing the one or more large particles to energy from a laser source to melt the one or more large particles. The pattern can be removed by exposing the large particles of the pattern to energy from a laser source to melt the large particles of the pattern. The laser source can be the same as or different from the source to laser light used to form the large particles.

Variations of method 2400 or methods similar to method 2400 can include using a moving particle bed to control a shape of the grown particle or a build from such particles. A surface of a particle bed can be altered by lowering the particle bed to create a non-spherical three-dimensional construct.

Variations of method 2400 or methods similar to method 2400 can include, after terminating the exposure to the laser light to the metastable undercooled metal particle, processing other metastable undercooled metal particles in an iterative manner to form a pattern. The iterative process can include moving the structure and irradiating another metastable undercooled metal particle on the structure, using the laser light focused on the other metastable undercooled metal particle, the focused laser light having a center of exposure with respect to the other metastable undercooled metal particle and with respect to the structure. The laser light can be maintained focused on the other metastable undercooled metal particle as the other metastable undercooled metal particle grows with continued exposure to the laser light. Exposure to the laser light can be terminated after a coalescence of the other metastable undercooled metal particle with metal particles is created from a metal flow towards the source of the laser light. The coalescence results in another large particle, in the center of exposure, that is larger than the other metastable undercooled metal particle at a start of the irradiation of the other metastable undercooled metal particle. The iterative process can be performed by moving the source of the laser light such that the laser light is in a position to irradiate the other metastable undercooled metal particle in place of or in conjunction with moving the moving the structure moving the structure.

Variations of method 2400 or methods similar to method 2400 can include changing composition of the metastable undercooled metal particle by varying the power density of the laser light. Variations can include controlling particle growth rate by drying the undercooled particles from different solvents to create capillary bridges of different dimensions (drying time) or polarity (solvent type). Variations can include using a surface propagating acoustic Rayleigh wave to promote particle cleavage and coalescence. Method 2400, methods similar to method 2400, and variations thereof can be implemented in an additive manufacturing process.

In various embodiments, a system comprises components to execute a mask-free photolithography process. The system can be implemented in an additive manufacturing process. The system can comprise a source of laser light and a lens arrangeable with the source of laser light to operatively irradiate a metastable undercooled metal particle such that the laser light is focused on the metastable undercooled metal particle to grow a larger particle. The focused laser light can have a center of exposure with respect to the metastable undercooled metal particle and with respect to a structure on which the metastable undercooled metal particle is disposed. The system includes control circuits to: maintain the laser light focused on the metastable undercooled metal particle as the metastable undercooled metal particle grows with continued exposure to the laser light; and terminate exposure to the laser light after a coalescence of the metastable undercooled metal particle with metal particles is created from a metal flow towards the source of the laser light. The coalescence results in a large particle, in the center of exposure, that is larger than the metastable undercooled metal particle at a start of the irradiation.

A number of different types of sources of laser light can be used. The source of the laser light can include a laser pointer that generates the laser light. The source of the laser light can include a laser diode that generates the laser light. In addition, the lens to direct the laser light to the metastable undercooled metal particle can be implemented in a number of formats. The lens can include a plano-convex lens.

Variations of such a system can include a number of different embodiments that can be combined depending on the application of the system or similar systems and/or the architecture in which such systems are implemented. Such a system can include the control circuits realized by an arrangement of one or more stages, one or more motors, one or more processors, and one or more machine-readable storage devices storing instructions, that when executed by the one or more processors cause the system to perform operations to structure one or particles grown from irradiation of one or more metastable undercooled metal particle by laser light. Such systems can be implemented in additive manufacturing processes.

Variations of such systems can include the control circuits being operable to control one or more of power associated with the laser light, exposure time to the laser light, and working distance to control a size of the large particle. The control circuits can be implemented to operably control a spatial relationship of the laser light to liquid metal on the structure to form a pattern of particles grown from metastable undercooled metal particles. The control circuits can be implemented to operably control the spatial relationship of the laser light to liquid metal on the structure to vary sizes of the particles in the pattern. The control circuits can be implemented to operably control multiple sources of laser light to form one or more large particles from one or more metastable undercooled metal particles.

Variations of such systems can include a movable stage to align the metastable undercooled metal particle and the laser light. The movable stage can be movable in three orthogonal directions. The movable stage can be implemented to position the metastable undercooled metal particle at a working distance from the lens to the metastable undercooled metal particle, with the working distance being equal to a focal length of the lens. Positioning can be conducted with respect to the laser light impinging on the metastable undercooled metal particle in a direction from the lens that is perpendicular to the structure at a point where the metastable undercooled metal particle is disposed on the structure. The movable stage can be controlled by the control circuits to move in formation of additional large particles from other metastable undercooled metal particles in liquid metal on the structure such that a pattern is formed.

In various embodiments, a method of forming particles comprises one or more combinations of procedures of the methods discussed herein. A method of forming particles can include forming the particles by using one or more components associated with the systems discussed herein. A method of forming particles can include performing one or more permutations of the operations disclosed herein, associated operations, or similar operations.

A system can comprise one or more combinations of components of the systems discussed herein. A system can include one or more combinations of components to perform the operations of the methods discussed herein. A system can include one or more permutations of components disclosed herein, associated components, or similar components.

A machine-readable storage device storing instructions can be implemented with respect to mask-free photolithography. Execution of the instructions by one or more processors can cause a machine to perform operations associated with mask-free photolithography, as taught herein. The instructions can include operations to: perform functions associated with any features of the systems discussed herein, components of the systems discussed herein, associated components, or similar components; perform methods associated with any features of the methods discussed herein, associated procedures, or similar procedures; or combinations thereof.

Figure 25A:
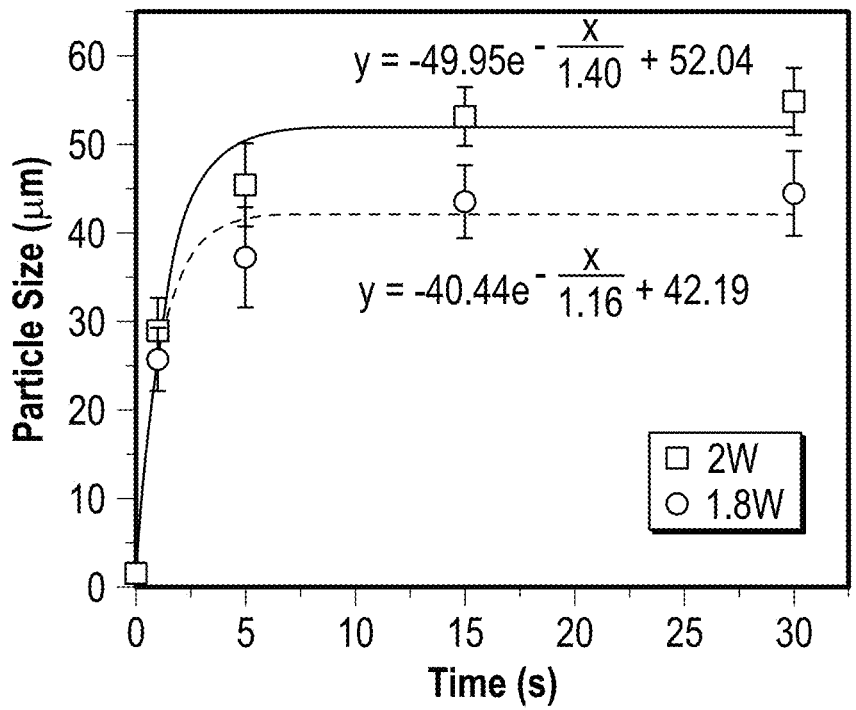
FIGS. 25A-25D illustrate effects of different wavelengths on particle growth, in accordance with various embodiments.
Figure 25B:
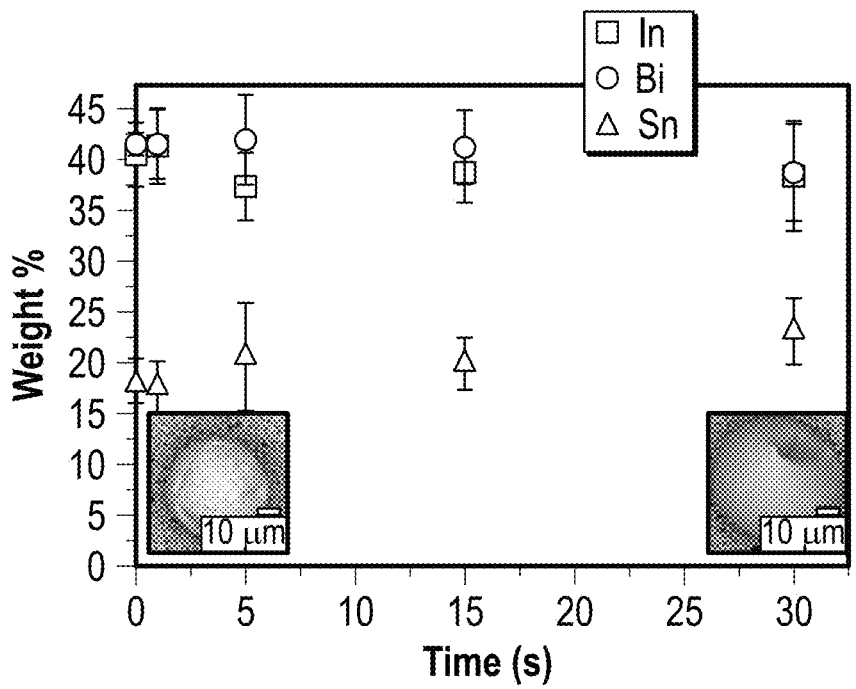
Figure 25C:
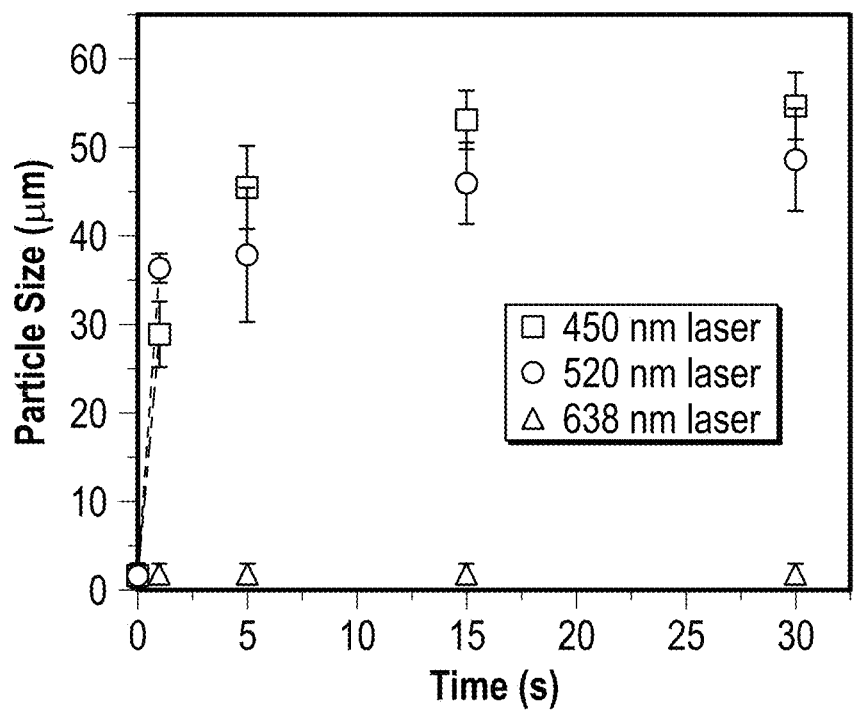
Figure 25D:
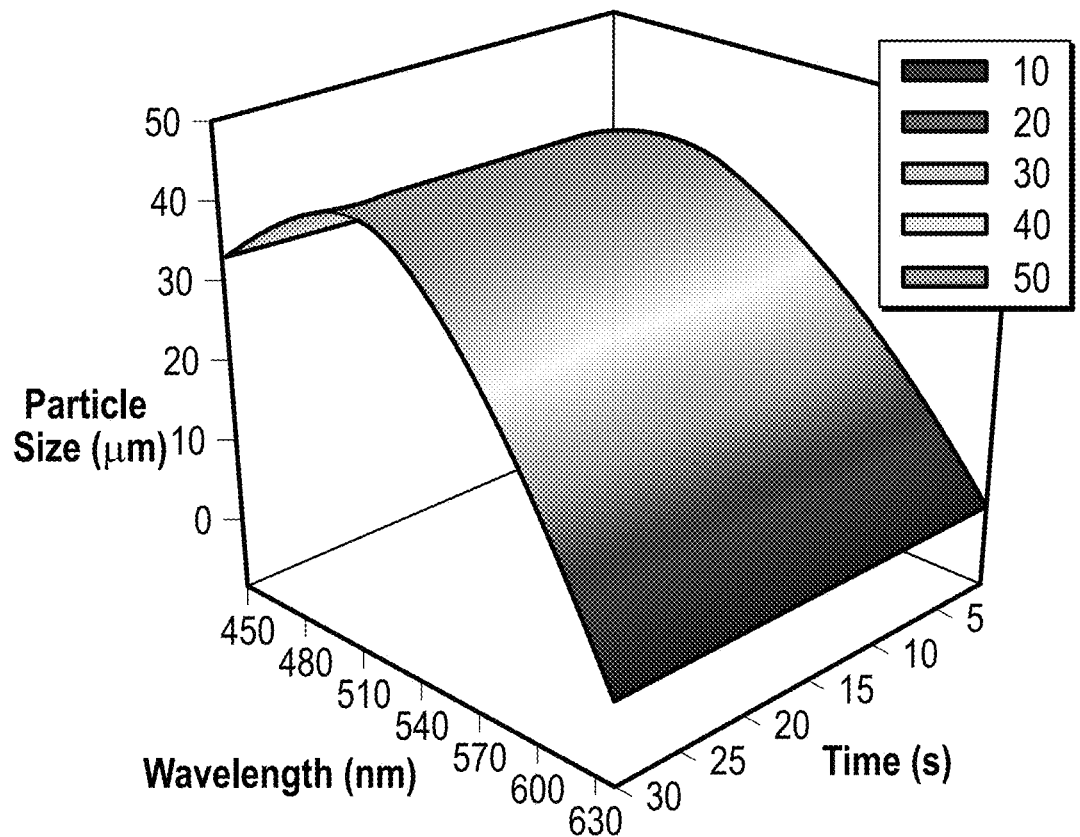
Figure 26:
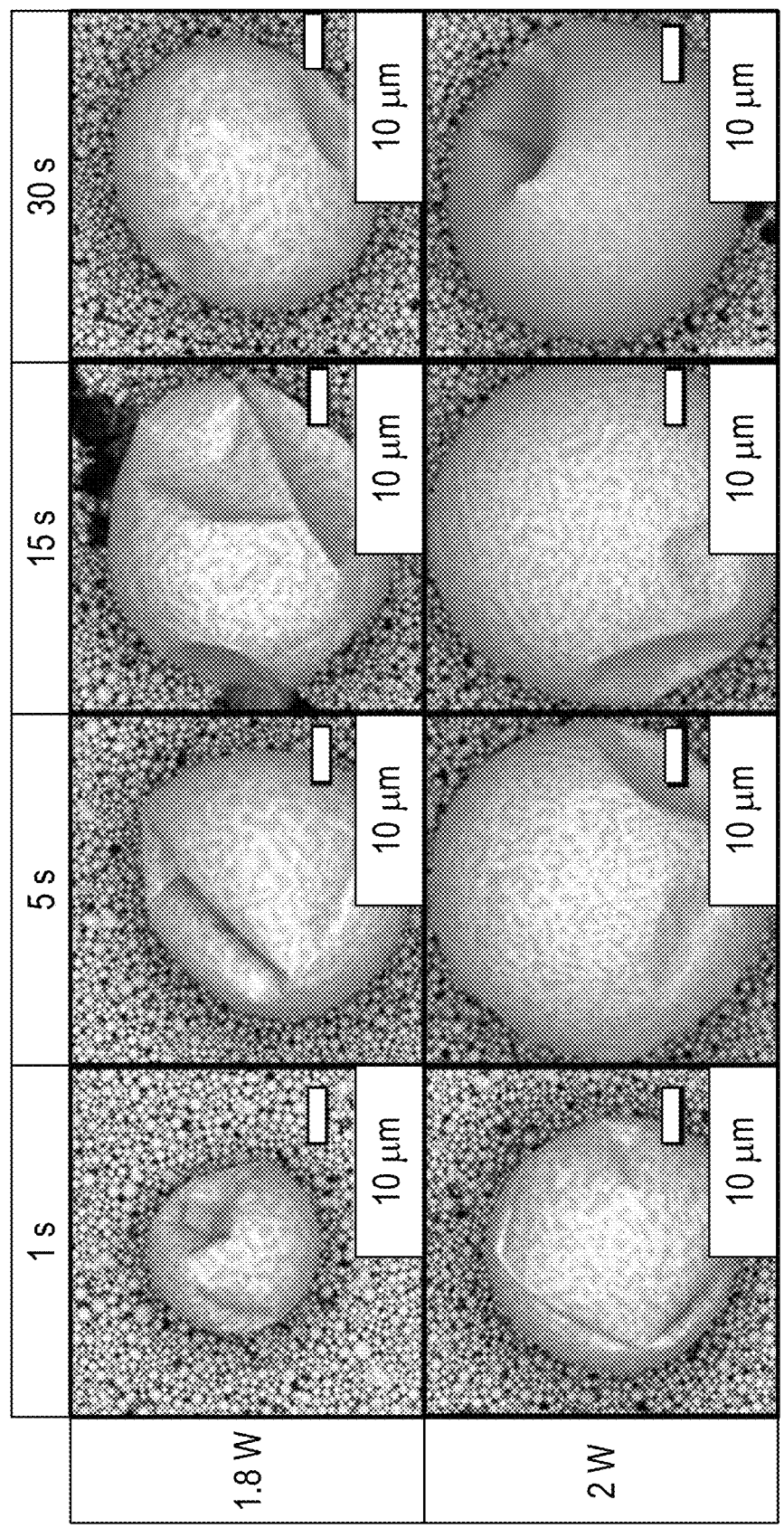
FIG. 26 shows micrographs of particle growth for a green laser at different times and powers, in accordance with various embodiments.

FIGS. 25A-25D illustrate effects of different wavelengths on particle growth. FIG. 25A is a plot of particle size change as a function of time for two powers for a green laser (wavelength of 520 nm). FIG. 25B illustrates particle composition change, reflected as percent of weight, for a composition of bismuth, indium, and tin, as a function of time for 2 W of laser power. FIG. 25C illustrates changes in particle size as a function of time for 2 W of laser power using different wavelength lasers. FIG. 25D is a 3D predictive plot showing correlation between wavelength, time, and particle size. FIG. 26 shows micrographs of particle growth for a green laser at different times and powers. Particle growth is shown at power of 1.8 W and power of 2 W at 1 s, 5 s, 15 s, and 30 s.

Since the growth of particles are driven by energy supplied by photon flux, the wavelength of the laser should have an impact in the energy supplied into the system. Based on Planck's equation (E=hc/λ), where E is energy, h is Planck's constant, c is the speed of light, and λ is wavelength, the blue laser (at a wavelength of 450 nm) should supply more energy into the system as compared to others (green at a wavelength of 520 nm and red at a wavelength of 638 nm) despite the same amount of power supplied by the diode. Furthermore, absorption coefficient of bismuth tends to be highest in the low wavelength regime, which indicates higher reactivity to photon stimuli. Green laser (at a wavelength of 520 nm) at equivalent power levels (see FIG. 25A) displays as lower, more steady growth compared to that of the blue laser. The decay constant of the green laser are smaller in both 2 W and 1.8 W (−t/1.40 and −t/1.16, respectively) compared to blue (−t/0.6 and −t/0.8, respectively) resulting in more time for particle growth and higher maximum size. At 2 W, the compositional shifts with the green laser are also less significant with the composition staying steady for up to 30 s of exposure. A laser manufactured particle (LMP) grown with the green laser shows an approximate 15 second delay in compositional shift, where at 30 s the particle is still deformed (See FIG. 25B). This indicates the growth of the particles can be maintained as long as the concentration of bismuth diffusion leaving the system can be minimized, since bismuth does not absorb green as compared to blue visible wavelength, the electronic transitions and excitations are not as volatile. FIG. 25C displays this reactivity with respect of different wavelengths, whilst the blue laser displays a much higher initial slope (34.98) compared to green (27.46), a LMP grown with blue laser decays much faster due to rapid exhaustion of bismuth (as seen from the composition change). The particles do not react to the red laser (638 nm) as bismuth's absorption coefficient drops significantly as the wavelength increases, this indicates that bismuth reactivity plays a larger role in the initiation and the cascade of even that results in the growth of the particle.

The process, as taught herein, can be used to produce articles of manufacture (products) having one or more particles having a structure or properties developed by the laser processing of one or more metastable undercooled metal particles. A product developed by laser processing of metastable undercooled metal particles can have a thermodynamic state dictated by irradiation time, alloy composition, wavelength of the laser used, the power of the laser used, and processing temperature. Particles of a product from laser processing of metastable undercooled metal particles can have different properties than those of the starting metastable particle and the known properties of the alloy. These different properties can include luster, modulus, reflectivity, thermal expansivity, and thermal conductivity among other physical properties. Particles of a product from laser processing of metastable undercooled metal particles can have a different shell composition than the bulk due to depletion of one of the alloy components to give a core-shell particle. Particles of a product from laser processing of metastable undercooled metal particles can be a particle or particles bearing a textured or smooth surface. A product from laser processing of metastable undercooled metal particles can be a product structured as an alloy showing asymmetric distribution of components. A product from laser processing of metastable undercooled metal particles can be a product capable of further relaxation upon application of a second stimulus to alter the surface and/or bulk morphological.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An article of manufacture comprising:
a structure; and
particles positioned on the structure and patterned in three dimensions with a gradient in sizes of the particles, each particle having a size, structure, and properties structured from a metastable undercooled metal particle based on time of exposure of the metastable undercooled metal particle, among a set of metastable undercooled metal particles, to laser light, after a coalescence of the metastable undercooled metal particle with metal particles created from a metal flow from the set of metastable undercooled metal particles towards a source of the laser light, which coalescence results in the respective particle being larger than the metastable undercooled metal particle at a start of the exposure.

2. The article of manufacture of claim 1, wherein the particles have a thermodynamic state dictated by irradiation time, alloy composition, a wavelength of the laser light, power of the laser light, or processing temperature.

3. The article of manufacture of claim 1, wherein the particles have different properties than those of the metastable undercooled metal particle at a start of the irradiation.

4. The article of manufacture of claim 3, wherein the properties include one or more of luster, shear modulus, reflectivity, thermal expansivity, or thermal conductivity.

5. The article of manufacture of claim 1, wherein one or more of the particles have shells, each shell having a composition different from a bulk composition of the metastable undercooled metal particle used at a start of the irradiation of the respective particle, due to depletion of a component from an alloy of the metastable undercooled metal particle used at a start of the irradiation.

6. The article of manufacture of claim 1, wherein the particles have a textured surface.

7. The article of manufacture of claim 1, wherein the particles have a smooth surface.

8. The article of manufacture of claim 1, wherein the particles are structured as an alloy having an asymmetric distribution of components.

9. The article of manufacture of claim 1, wherein the particles are capable of further relaxation upon application of a stimulus after terminating the exposure to the laser light, to alter surface or bulk structures.

10. The article of manufacture of claim 1, wherein the particles are arranged in layers, the particles including a group of the particles having different sizes varied in each layer.

11. The article of manufacture of claim 1, wherein the particles include indium.

12. The article of manufacture of claim 1, wherein the metastable undercooled metal particle is a metastable undercooled metal Field's particle.

13. The article of manufacture of claim 1, wherein the metastable undercooled metal particle includes bismuth.

14. The article of manufacture of claim 1, wherein the structure is a silicon wafer.

15. An article of manufacture comprising:
a structure including particles, each particle structured from a metastable undercooled metal particle, each particle having a size based on time of exposure of the metastable undercooled metal particle among a set of metastable undercooled metal particles to laser light, after coalescence of the metastable undercooled metal particle with metal particles created from a metal flow from the set of metastable undercooled metal particles towards a source of the laser light, which coalescence results in the particle being larger than the metastable undercooled metal particles at a start of the exposure; and
a pattern of the particles, the particles having different compositions.

16. The article of manufacture of claim 15, wherein the pattern of the particles has a gradient in the sizes of the particles in the pattern.

17. The article of manufacture of claim 15, wherein the pattern includes one or more composition gradients.

18. The article of manufacture of claim 15, wherein the metastable undercooled metal particles includes bismuth.

19. The article of manufacture of claim 15, wherein the particles have a thermodynamic state dictated by irradiation time of the laser light, alloy composition, a wavelength of the laser light, power of the laser light, or processing temperature.

* * * * *